(12) United States Patent
Shimakawa et al.

(10) Patent No.: US 10,388,596 B2
(45) Date of Patent: *Aug. 20, 2019

(54) ELECTRONIC PART MOUNTING HEAT-DISSIPATING SUBSTRATE

(71) Applicant: NSK LTD., Tokyo (JP)

(72) Inventors: Shigeru Shimakawa, Tokyo (JP); Takashi Sunaga, Tokyo (JP); Takaaki Sekine, Tokyo (JP); Teruyoshi Kogure, Tokyo (JP); Ryoichi Suzuki, Maebashi (JP)

(73) Assignee: NSK LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/516,730

(22) PCT Filed: Nov. 20, 2015

(86) PCT No.: PCT/JP2015/082703
§ 371 (c)(1),
(2) Date: Apr. 4, 2017

(87) PCT Pub. No.: WO2016/080520
PCT Pub. Date: May 26, 2016

(65) Prior Publication Data
US 2017/0309555 A1    Oct. 26, 2017

(30) Foreign Application Priority Data

Nov. 20, 2014 (JP) ................................ 2014-235691
Jun. 1, 2015 (JP) ................................ 2015-111257
(Continued)

(51) Int. Cl.
*B62D 5/04* (2006.01)
*G01R 1/20* (2006.01)
(Continued)

(52) U.S. Cl.
CPC ...... *H01L 23/49568* (2013.01); *B62D 5/0403* (2013.01); *B62D 5/0406* (2013.01);
(Continued)

(58) Field of Classification Search
None
See application file for complete search history.

(56) References Cited

U.S. PATENT DOCUMENTS 4,884,126 A    11/1989    Harada et al.
9,184,585 B2*  11/2015    Huselstein ............. H02M 1/32
(Continued)

FOREIGN PATENT DOCUMENTS

EP    1909324 A1    4/2008
EP    1931024 A2    6/2008
(Continued)

OTHER PUBLICATIONS

Non-Final Rejection of U.S. Appl. No. 15/516,723 filed Mar. 5, 2018.*

(Continued)

*Primary Examiner* — Telly D Green
(74) *Attorney, Agent, or Firm* — Sughrue Mion, PLLC

(57) ABSTRACT

An electronic part mounting heat-dissipating substrate which includes lead frames of wiring pattern shapes formed by conductor plate and an insulating member 130 which is provided between the lead frames 110, wherein a plate surface of a part arrangement surface of said conductor plate and a top surface of said insulating member at a side of said part arrangement surface form one continuous surface, the lead frames have different thicknesses, the thick lead frame 110H is used for a large current signal and the thin lead frame 110L is used for a small current signal, a plate surface of a back surface of the part arrangement surface and a top surface of the insulating member at a side of the back surface at the part arrangement surface-side are formed in an identical plane.

22 Claims, 27 Drawing Sheets

(30) Foreign Application Priority Data

| Jul. 14, 2015 | (JP) | 2015-140106 |
|---|---|---|
| Jul. 16, 2015 | (JP) | 2015-142495 |
| Nov. 2, 2015 | (JP) | 2015-216153 |
| Nov. 2, 2015 | (JP) | 2015-216154 |
| Nov. 2, 2015 | (JP) | 2015-216156 |
| Nov. 4, 2015 | (JP) | 2015-216396 |
| Nov. 4, 2015 | (JP) | 2015-217012 |
| Nov. 12, 2015 | (JP) | 2015-222242 |
| Nov. 12, 2015 | (JP) | 2015-222243 |
| Nov. 12, 2015 | (JP) | 2015-222246 |

(51) Int. Cl.

| *H01C 1/14* | (2006.01) |
|---|---|
| *H05K 7/20* | (2006.01) |
| *H01L 21/48* | (2006.01) |
| *H01L 21/56* | (2006.01) |
| *H01L 23/00* | (2006.01) |
| *H01L 23/48* | (2006.01) |
| *H01L 25/07* | (2006.01) |
| *H02K 11/33* | (2016.01) |
| *H01L 23/373* | (2006.01) |
| *H01L 23/495* | (2006.01) |
| *H01L 23/498* | (2006.01) |

(52) U.S. Cl.
CPC ........... *B62D 5/0409* (2013.01); *G01R 1/203* (2013.01); *H01C 1/14* (2013.01); *H01L 21/4821* (2013.01); *H01L 23/48* (2013.01); *H01L 23/49524* (2013.01); *H01L 23/49537* (2013.01); *H01L 23/49541* (2013.01); *H01L 23/49548* (2013.01); *H01L 23/49562* (2013.01); *H01L 23/49575* (2013.01); *H01L 23/49861* (2013.01); *H01L 25/072* (2013.01); *H02K 11/33* (2016.01); *H05K 7/2089* (2013.01); *H01L 21/565* (2013.01); *H01L 23/3735* (2013.01); *H01L 23/49589* (2013.01); *H01L 24/37* (2013.01); *H01L 24/40* (2013.01); *H01L 2224/37124* (2013.01); *H01L 2224/37147* (2013.01); *H01L 2224/37599* (2013.01); *H01L 2224/40* (2013.01); *H01L 2224/40245* (2013.01); *H01L 2924/0002* (2013.01); *H01L 2924/18301* (2013.01)

(56) References Cited

U.S. PATENT DOCUMENTS

| 9,397,030 | B2 * | 7/2016 | Sunaga | H01L 24/37 |
|---|---|---|---|---|
| 2012/0001311 | A1 | 1/2012 | Nishino et al. | |
| 2012/0319542 | A1 | 12/2012 | Hazeyama et al. | |
| 2015/0270199 | A1 * | 9/2015 | Sunaga | H01L 24/37 |
| | | | | 257/288 |
| 2017/0294374 | A1 * | 10/2017 | Simakawa | H01L 23/50 |

FOREIGN PATENT DOCUMENTS

| EP | 1986479 | A2 | | 10/2008 | | |
|---|---|---|---|---|---|---|
| JP | 6-310886 | A | | 11/1994 | | |
| JP | 07169907 | A | | 7/1995 | | |
| JP | 09-331694 | A | | 12/1997 | | |
| JP | 10-294563 | A | | 11/1998 | | |
| JP | 11027959 | A | | 1/1999 | | |
| JP | 2000124400 | A | | 4/2000 | | |
| JP | 2003-133497 | A | | 5/2003 | | |
| JP | 2004-221160 | A | | 8/2004 | | |
| JP | 2004221260 | A | * | 8/2004 | ............ | H01L 24/06 |
| JP | 2006324542 | A | | 11/2006 | | |
| JP | 3855306 | B2 | | 12/2006 | | |
| JP | 2006332449 | A | | 12/2006 | | |
| JP | 2007-089357 | A | | 4/2007 | | |
| JP | 2007-214246 | A | | 8/2007 | | |
| JP | 2008-098491 | A | | 4/2008 | | |
| JP | 2008198687 | A | | 8/2008 | | |
| JP | 4223581 | B2 | | 2/2009 | | |
| JP | 2009081281 | A | | 4/2009 | | |
| JP | 2009-194277 | A | | 8/2009 | | |
| JP | 2011-181650 | A | | 9/2011 | | |
| JP | 2011-211784 | A | | 10/2011 | | |
| JP | 2012028744 | A | | 2/2012 | | |
| JP | 2013-125848 | A | | 6/2013 | | |
| JP | 2013-188052 | A | | 9/2013 | | |
| JP | 2014-072316 | A | | 4/2014 | | |
| JP | 2014-078658 | A | | 5/2014 | | |
| JP | 2014-165486 | A | | 9/2014 | | |
| JP | 2014165486 | A | * | 9/2014 | ............ | H01L 24/19 |
| WO | 2009/110376 | A1 | | 9/2009 | | |
| WO | 2011/093202 | A1 | | 8/2011 | | |
| WO | 2014/068937 | A1 | | 5/2014 | | |
| WO | 2014166928 | A1 | | 10/2014 | | |

OTHER PUBLICATIONS

Non-Final Rejection of U.S. Appl. No. 15/523,478 filed Feb. 6, 2018.*

International Search Report for PCT/JP2015/082703 dated Jan. 26, 2016.

\* cited by examiner

ELECTRONIC PART MOUNTING HEAT-DISSIPATING SUBSTRATE

CROSS REFERENCE TO RELATED APPLICATIONS

This application is a National Stage of International Application No. PCT/JP2015/082703 filed Nov. 20, 2015, claiming priority based on Japanese Patent Application Nos. 2014-235691 filed Nov. 20, 2014, 2015-111257 filed Jun. 1, 2015, 2015-140106 filed Jul. 14, 2015, 2015-142495 filed Jul. 16, 2015, 2015-216153, 2015-216154, and 2015-216156 filed Nov. 2, 2015, 2015-216396 and 2015-217012 filed Nov. 4, 2015, 2015-222242, 2015-222243 and 2015-222246 filed Nov. 12, 2015, the contents of all of which are incorporated herein by reference in their entirety.

TECHNICAL FIELD

The present invention relates to a substrate which reduces a wiring resistance and improves a heat dissipation and on which electronic parts are mounted or equipped. More particularly, the present invention relates to an electronic part mounting heat-dissipating substrate in which insulating members are filled by punching between lead frames of a conductor plate formed in the lead frames of circuit pattern shapes on which the electronic parts are mounted, and which is formed in a planar shape as a whole.

BACKGROUND ART

In recent years, for example, in an electronic device such as an electric power steering apparatus used for a vehicle, a power circuit for which a so-called power semiconductor or the like is used or an electronic circuit such as an inverter circuit in which large power is used is formed as a power substrate on which these power semiconductors are collectively formed to meet a demand for miniaturization of the electronic devices including the electronic circuit. An electronic circuit in which the large power is used and an electronic circuit in which a small power is used are used as separated substrates and converted into dedicated substrates.

Further, it is an important problem to efficiently dissipate heat generated due to a loss of the highly density mounted power semiconductor to convert the circuits for which the power semiconductors are used into the dedicated substrates.

Conventionally, for such a dedicated substrate (power substrate), a substrate formed by pasting a conductor foil (made of copper) on a surface of a metal supporting plate made of a material such as aluminum with an insulating layer interposed therebetween, etching this conductor foil and forming wiring patterns is used. The power semiconductor and various electronic parts are mounted on the substrate to form a circuit.

However, according to the above configuration, the wiring patterns are formed by etching. Therefore, when the thin conductor foil which is approximately 70 [μm] is used, and is used for a circuit for which the power semiconductor in which a large current flows is used, a wiring resistance causes a problem. Further, according to the above configuration, a heat dissipation characteristic is limited by the insulating layer of a low heat transfer coefficient. Therefore, there is a problem that it is not possible to provide a sufficient performance.

Further, when the electronic parts such as the power semiconductor are collectively mounted on the wiring patterns, an interaction between the wiring patterns such as impedance and inductance characteristics produced by the wiring pattern also need to be taken into account.

Hence, for example, Japanese Patent No. 3855306 B2 (Patent Document 1), Japanese Unexamined Patent Publication No. 2014-72316 A (Patent Document 2), Japanese Unexamined Patent Publication No. 2013-125848 A (Patent Document 3) and WO 2009/110376 A1 (Patent Document 4) disclose techniques to solve the conventional problems.

The technique disclosed in Patent Document 1 relates to an electronic part mounting heat-dissipating substrate. The electronic part mounting heat-dissipating substrate includes a metal plate which is punched in a predetermined wiring pattern shape, and a composite insulating material which is integrally molded with the metal plate and has a high heat conductivity. This technique adopts a structure in which at least a part mounting portion of the metal plate is exposed from the composite insulating material, and a heat-generating part arrangement portion of the part mounting portion is provided with a step-processed portion. Further, Patent Document 1 discloses that the step-processed portion of the electronic part mounting heat-dissipating substrate makes thin the composite insulating material formed at a lower portion of the heat-generating part arrangement portion, the heat is dispersed by a metal plate and is dissipated by an insulating material of the high heat conductivity as a result, and therefore the heat dissipation is good.

Furthermore, the technique disclosed in Patent Document 2 employs a configuration where, when a power module which drives an electric motor is formed, a pair of upper and lower switching elements are disposed adjacent to a power block and a ground block inside the power module, a power terminal connected to a power supply, a ground terminal connected to a ground and control terminals of a pair of switching elements are disposed apart from each other. Still further, Patent Document 2 discloses that, according to the technique disclosed in Patent Document 2, the control terminals, the power terminals and the ground terminals are disposed apart from each other as described above, so that it is possible to realize the power module which can reduce a loss and a noise.

Moreover, an object disclosed in Patent Document 3 is to solve a problem that miniaturizing a size of the power module to miniaturize a package case of a power device for which a silicon-carbide device is used narrows an inter-terminal distance and is likely to cause a discharge phenomenon between terminals. Further, to solve the problem, Patent Document 3 discloses a power module semiconductor device which includes "a substrate, a low voltage-side gate terminal electrode which is disposed on a first side of the substrate, a low voltage-side source terminal electrode which is disposed on the first side, and is disposed adjacent to the low voltage-side gate terminal electrode, a high voltage-side gate terminal which is disposed on the first side, and is disposed apart from the low voltage-side gate terminal electrode and the low voltage-side source terminal electrode, a high voltage-side source terminal electrode which is disposed on the first side, and is disposed adjacent to the high voltage-side gate terminal electrode, an output terminal electrode which is disposed on a second side different from the first side of the substrate, a power voltage supply terminal electrode which is disposed on a third side of the substrate different from the first side and the second side, and a ground potential electrode which is disposed on the third side and is disposed apart from the power voltage supply terminal electrode". Patent Document 3 discloses that it is possible to lead the terminal electrode of the power module semiconductor device from three directions of the mold package and secure an insulating distance.

Further, Patent Document 4 discloses a technique related to a lead frame substrate. The lead frame substrate includes plural independent patterns which retain electronic parts, and resin bonding members which are filled in gaps between the adjacent patterns to mutually connect the adjacent patterns. The resin bonding members protrude closer to a thickness direction than a top surface position of the patterns is. A back surface of the substrate is provided with a metal base plate and a metal cooling fin with a thermal conductive resin sheet interposed therebetween.

THE LIST OF PRIOR ART DOCUMENT

Patent Documents

Patent Document 1: Japanese Patent No. 3855306 B2
Patent Document 2: Japanese Unexamined Patent Publication No. 2014-72316 A
Patent Document 3: Japanese Unexamined Patent Publication No. 2013-125848 A
Patent Document 4: WO 2009/110376 A1

SUMMARY OF THE INVENTION

Problems to be Solved by the Invention

The technique disclosed in Patent Document 1 includes the metal plate punched in the predetermined wiring pattern shape, and a highly heat conductive composite insulating material integrally molded with the metal plate. However, the metal plate portion is covered by the composite insulating material, and only the part mounting portions of the metal plate are exposed from the composite insulating materials in the structure. Hence, the structure has a problem that the heat is not sufficiently dissipated from the entire substrate including the metal plate portion to external environment, and is accumulated in the composite insulating materials.

Further, the techniques disclosed in Patent Documents 2 and 3 adopt methods for mounting or forming a circuit including the switching elements or the power device element on the lead frames, and solder-bonding the circuit or the power device element and the lead frame by wires or connecting the circuit or the power device element and the lead frames to a bus bar by the wire bonding.

However, the substrate on which the circuit of Patent Document 2 is mounted is a general substrate provided with an insulating layer in a lower layer on which the wiring pattern is formed similar to the substrate disclosed in Patent Document 1. Therefore, this substrate has a problem of the heat accumulation similar to Patent Document 1. Further, the technique disclosed in Patent Document 3 forms the element for composing the power module by using a package of a transfer mold. Therefore, this technique has a problem of the heat accumulation similar to Patent Documents 1 and 2.

Further, the technique disclosed in Patent Document 4 includes plural independent patterns which retains the electronic parts, and the resin bonding members which are filled in gaps between the adjacent patterns to mutually connect the adjacent patterns. However, the resin bonding members protrude closer to the thickness direction than the top surface position of the patters is. Therefore, the degree of freedom of the part arrangement is limited. Further, the lead frames have the same thickness. Generally, when the lead frames are processed in predetermined patterns by pressing, it is necessary to provide a certain distance (gap) corresponding to the thickness between the lead frames. Therefore, improving a wiring density of the lead frames is limited. Further, according to the technique disclosed in Patent Document 4, it is necessary to lay wires between the parts by the wire bonding which is another process after the parts are mounted on the substrate.

It is therefore an object of the present invention to solve the above problems, and the object is to provide an electronic part mounting heat-dissipating substrate which enables a circuit for which a power semiconductor in which a large current flows is used to reduce the wiring resistances of a large power operation and improve the heat dissipation.

Means for Solving the Problems

In order to solve the above problems, the present invention provides an electronic part mounting heat-dissipating substrate which comprises a conductor plate which is formed on lead frames of wiring pattern shapes; and an insulating member which is provided between the lead frames of the wiring pattern shapes on the conductor plate; wherein a plate surface of a part arrangement surface of the conductor plate and a top surface of the insulating member at a side of the part arrangement surface form one continuous surface, wherein a plate surface of a back surface of the part arrangement surface of the conductor plate and a top surface of the insulating member at a side of the back surface at the part arrangement surface-side are formed in an identical plane, wherein the lead frames of the wiring pattern shapes have at least two or more thicknesses which are different each other, wherein a plate surface of a back surface of the part arrangement surface of the lead frames of the wiring pattern shapes and a surface of a back surface-side of the part arrangement surface of the insulating member are formed in an identical plane in accordance with a plate surface of a back surface of the part arrangement surface for a lead frame having a maximum thickness among the lead frames, wherein the thick lead frame is used for a large current signal, and the thin lead frame is used for a small current signal.

The above-object is more effectively achieved by that the lead frames of the different thicknesses are provided in a mixed arrangement.

Further, the above-object is more effectively achieved by that a portion of the plate surface of the part arrangement surface at which the part is not disposed on the plate surface of the part arrangement surface of the lead frames is provided with a top surface side recess portion, and is covered by the insulating member, and the top surface of the insulating member which covers the top surface-side recess portion, and the plate surface of the part arrangement surface of the lead frames and the top surface at the part arrangement surface-side of the insulating member form one continuous surface; or a portion which is the plate surface of the back surface of the part arrangement surface of the lead frame and corresponds to a back surface of the part arrangement surface at which the part is not disposed, is provided with a back surface-side recess portion and is covered by the insulating member, and the top surface of the insulating member which covers the back surface-side recess portion, and the plate surface of the back surface of the part arrangement surface of the lead frames and the top surface of the insulating member at the back surface-side at the part arrangement surface-side form one continuous surface.

The above-object is more effectively achieved by that wherein engagement portions are provided from a side of a surface-side of the lead frames to a side of said insulating member and between the lead frames of the wiring pattern shapes and the insulating member, and the engagement portions are steps formed at sides of a top surface and a back surface of a surface-side of the lead frames and between the lead frames and the insulating member; or wherein part of said lead frames of said wiring pattern shapes formed by said conductor plate have a shape which is bent upward or downward with respect to a plate surface of said conductor plate and at a side closer to an inner side or an outer side than a periphery of said insulating member is; or wherein all or part of the lead frames of the wiring pattern shapes formed by the conductor plate is capable of bending at an outer side than a periphery of the insulating member.

Further, the above-object is more effectively achieved by that wherein all or part of the lead frames of said wiring pattern shapes formed by the conductor plate is contact with a thermal conductor at an outer side than a periphery of the insulating member.

The above-object is effectively achieved by that wherein plural heat-generating electronic part groups having a functional unity is provided in a distributed arrangement with a maximum distance each other on the electronic part mounting heat-dissipating substrate, and wherein lengths of current paths from entries of the heat-generating electronic part groups to exits of the heat-generating electronic part groups are substantially identical.

The above-object is effectively achieved by that wherein a power device which controls respective phases of an electric motor driven by a poly-phase alternating current is provided in a distributed arrangement with a maximum distance each other on the electronic part mounting heat-dissipating substrate, and wherein a length of a current path from the power device to a connection portion of the electric motor is substantially identical between the respective phases; or wherein the electric motor is a three-phase motor, wherein the power device controlling the respective phases of the electric motor is distributed-arranged at periphery of vertices of an equilateral triangle which center portion of the electronic part mounting heat-dissipating substrate is almost centroid, wherein a length of a current path from the power device to a connection portion of the electric motor is substantially identical with the three-phases.

The above-object is effectively achieved by that wherein output direction from the power device is faced to extending direction of respective vertices of the equilateral triangle from centroid of the equilateral triangle.

The above-object is effectively achieved by that wherein two of the electronic part mounting heat-dissipating substrates are composed as one electronic part mounting heat-dissipating substrate with an insertion sheet interposed therebetween, an upper surface of a first electronic part mounting heat-dissipating substrate composing one electronic part mounting heat-dissipating substrate and sandwiching the insertion sheet is used as a side of a top surface of the one electronic part mounting heat-dissipating substrate, and a lower surface of a second electronic part mounting heat-dissipating substrate composing one electronic part mounting heat-dissipating substrate and sandwiching the insertion sheet is used as a side of a back surface of the one electronic part mounting heat-dissipating substrate.

The above-object is effectively achieved by that wherein, when plural heat-generating electronic part groups having the functional unity are provided in the distributed arrangement at a top surface-side and a back surface-side of the heat-generating electronic part group, the heat-generating electronic part groups provided in the distributed arrangement at the top surface side, and the heat-generating electronic part groups provided in the distributed arrangement at the back surface-side do not overlap at the top surface and the back surface of the electronic part mounting heat-dissipating substrate and across the plate surface of the electronic part mounting heat-dissipating substrate.

Further, the above-object is effectively achieved by that wherein, when the power device controlling the electric motor is distributed-arranged at periphery of the vertices of the equilateral triangle of which centroid is almost a center portion of top surface-side of the electronic part mounting heat-dissipating substrate, the back surface-side of the electronic part mounting heat-dissipating substrate is similarly performed, and a position corresponding to vertices of the equilateral triangle is a different position rotated by about 60° as a reference of the centroid of the equilateral triangle on the top surface and said back surface when a distributed arrangement of the back surface-side is performed.

Furthermore, the above-object is effectively achieved by a heat-dissipating structure by using the electronic part mounting heat-dissipating substrate, wherein heat dissipation from the electronic part mounting heat-dissipating substrate is performed by mounting the back surface of the part arrangement surface of at least two of the electronic part mounting heat-dissipating substrate through a thermal conductor.

The above-object is effectively achieved by a power module of an electric power steering apparatus for which the electronic part mounting heat-dissipating substrate is used, wherein the thick lead frame is used for a large current signal of the power module, and the thin lead frame is used for a small current signal of the power module.

Still further, the above-object is effectively achieved by a connection structure of a shunt resistor used for the electronic part mounting heat-dissipating substrate, for the heat-dissipating structure, or for the power module, wherein the electronic part mounting heat-dissipating substrate includes two connection portions which connect two terminals of the shunt resistor on the thick lead frames, one ends of the thin lead frame are disposed near the two connection portions, or one ends of the thin lead frames are disposed at cutout portions formed at part of the two connection portions, and the two terminals of the shunt resistor are connected by placing the two terminals of the shunt resistor on the two connection portions.

The above-object is effectively achieved by an electric power steering apparatus for which the electronic part mounting heat-dissipating substrate; or the electric power steering apparatus which the heat-dissipating structure; or the electric power steering apparatus comprising the connection structure of shunt resistor.

Effects of the Invention

According to an electronic part mounting heat-dissipating substrate according to the present invention, lead frames of wiring pattern shapes of a circuit on which electronic parts are mounted are formed by a method for punching by press-working or laser-processing a conductor plate made by using metal such as aluminum or copper. Further, the gap between the lead frames is entirely fixed by a heat conductive resin or the like. Consequently, according to the configuration, it is not necessary to provide a special step-processed portion at a heat-generating electronic part mounted/equipped portion.

consequently, according to the electronic part mounting heat-dissipating substrate of the present invention, the electronic parts such as the power semiconductor can be directly solder-bonded on the lead frames of the wiring pattern shapes composed of the conductor plate to compose a circuit. Further, the larger plate thickness can also be secured for the conductor plate which forms the lead frames. In this way, even when the electronic part mounting heat-dissipating substrate is used for a circuit in which a large current flows, it is possible to reduce a circuit wiring resistance and effectively suppress a heat generation amount. In addition, it is possible to suppress a temperature rise which is a transient phenomenon such as a sudden heat generation caused when a large current flows to the power device to support sudden steering in an electric power steering apparatus.

That is, as illustrated in, for example, FIG. 24A, a conventional aluminum substrate 2100 is formed by forming an insulating layer on an upper surface of an aluminum layer, and mounting electronic parts EC such as FETs and a capacitor on patterning wires such as a copper foil layer formed on an upper layer of the insulating layer. A lower surface of the aluminum layer is disposed in a case with a TIM (Thermal Interface Material) described below interposed therebetween. By contrast with this, a substrate 2200 according to the present invention illustrated in FIG. 24B is composed of lead frames 110 and insulating members 130. The respective electronic parts EC can be directly mounted on the lead frames 110 by the SMT (Surface Mount Technology), and can be manufactured by a conventional reflow device. Further, adopting such a structure results in improving a transient heat characteristic since the substrate according to the present invention differs from the conventional aluminum substrate in an insulating layer which is the TIM and the lead frames which are heat spreaders. Furthermore, when this substrate according to the present invention is used, and is connected with another control substrate, it is possible to remove custom parts (terminal terminals) and reduce the cost. Still further, upon comparison between the present invention and a conventional transfer module, a high-capacity electrolytic capacitor can be mounted on the substrate according to the present invention. Consequently, it is also possible to provide advantages that electric characteristics improve and another substrate does not need to be provided for the high-capacity electrolytic capacitor.

Further, the heat generated by the electronic parts mounted on the substrate according to the present invention is dissipated by the conductor plate composing the substrate and the insulating member. Then, when necessary, this heat can be dissipated to an external thermal mass through the composite insulating material for which a highly heat conductive heat-conductive material (TIM (Thermal Interface Material)) of a housing of a control unit in which the substrate is housed is used. Thus, a synergy effect provided by the housing of the control unit in which the substrate is housed can further improve the heat dissipation.

Furthermore, the insulating member according to the present invention is made of the highly heat conductive composite-insulating material, and the insulating layer formed between the lead frames of the circuit pattern shapes can be formed thick. Consequently, it is possible to provide an effect that it is possible to reduce a distribution capacitance such as a capacitor between patterns.

Still furthermore, assume a case where the substrates having at least two kinds or more for the thickness are used, it is also possible to form the lead frames 110 of the two or more wiring patterns shape having thicknesses which are mutually different. In this case, these lead frames having different thicknesses are able to mutually arrange in mixing. Therefore, by adopting a configuration to mixing-arrange the lead frames having different thicknesses, it is possible to arrange the lead frames corresponding to the current amount to apply to the electronic parts with a high-density and to reduce the relevant cost through the use material, the size reduction and so on.

Hence, when the electronic part mounting heat-dissipating substrate according to the present invention is used for the electric power steering apparatus as an example, and when a brushless motor is rotated at a low speed to assist steering, it is possible to realize a smooth steering feeling.

BRIEF DESCRIPTION OF THE DRAWINGS

In the accompanying drawings:

FIG. 2A is a top view, and FIG. 2B is a side view;

FIG. 8A is a perspective view illustrating a state of the lead frames in which insulating members are not yet filled, and FIG. 8B is a perspective view illustrating a state of the substrate in which the insulating members have been filled;

FIG. 9A is a top view of this example, FIG. 9B is a side view illustrating that the lead frames having the same thickness are used for the substrate, and FIG. 9C is a side view illustrating that the lead frames having the different thicknesses are used for the substrate;

FIG. 20A is a side sectional view illustrating an example where the insertion sheet is formed in the same form as that on a plane of the substrate plate surface, and FIG. 20B is a side sectional view illustrating an example where a periphery portion of the insertion sheet is enlarged compared to the form on the plane of the substrate plate surface, and is formed;

FIG. 21 shows a heat dissipating structure provided with the two substrates according to the present invention at the back surface of the part arrangement surface through the heat dissipating plate (thermal conductor)

FIG. 22A is a perspective view illustrating a configuration where the shunt resistor is not yet connected to the electronic part mounting heat-dissipating substrate according to the present invention, and FIG. 22B is a perspective view illustrating a configuration where the shunt resistor has been connected to the substrate;

FIG. 23A is a perspective view illustrating a configuration where the shunt resistor is not yet connected to the electronic part mounting heat-dissipating substrate according to the present invention, and FIG. 23B is a perspective view illustrating a configuration where the shunt resistor has been connected to the substrate;

MODE FOR CARRYING OUT THE INVENTION

An embodiment of the present invention will be described by using a case where is used for a control unit of an electric power steering apparatus mounted on a vehicle as an example.

In this regard, the electric power steering apparatus applies a rotational force of an electric motor as a steering assist force (assist force) to a steering mechanism of the vehicle. A transmission mechanism such as gears and a belt applies a driving force of the motor as the steering assist force to a steering shaft or a rack shaft via a reduction mechanism. Further, this electric power steering apparatus (EPS) accurately produces a torque of the steering assist force, and therefore performs a feedback control of a motor current.

This feedback control is a control to adjust a motor applying voltage in order to decrease a difference between a steering assist command value (current command value) and a motor current detection value. The motor applying voltage is generally controlled by adjusting a duty of PWM (Pulse Width Modulation) control.

Figure 1:
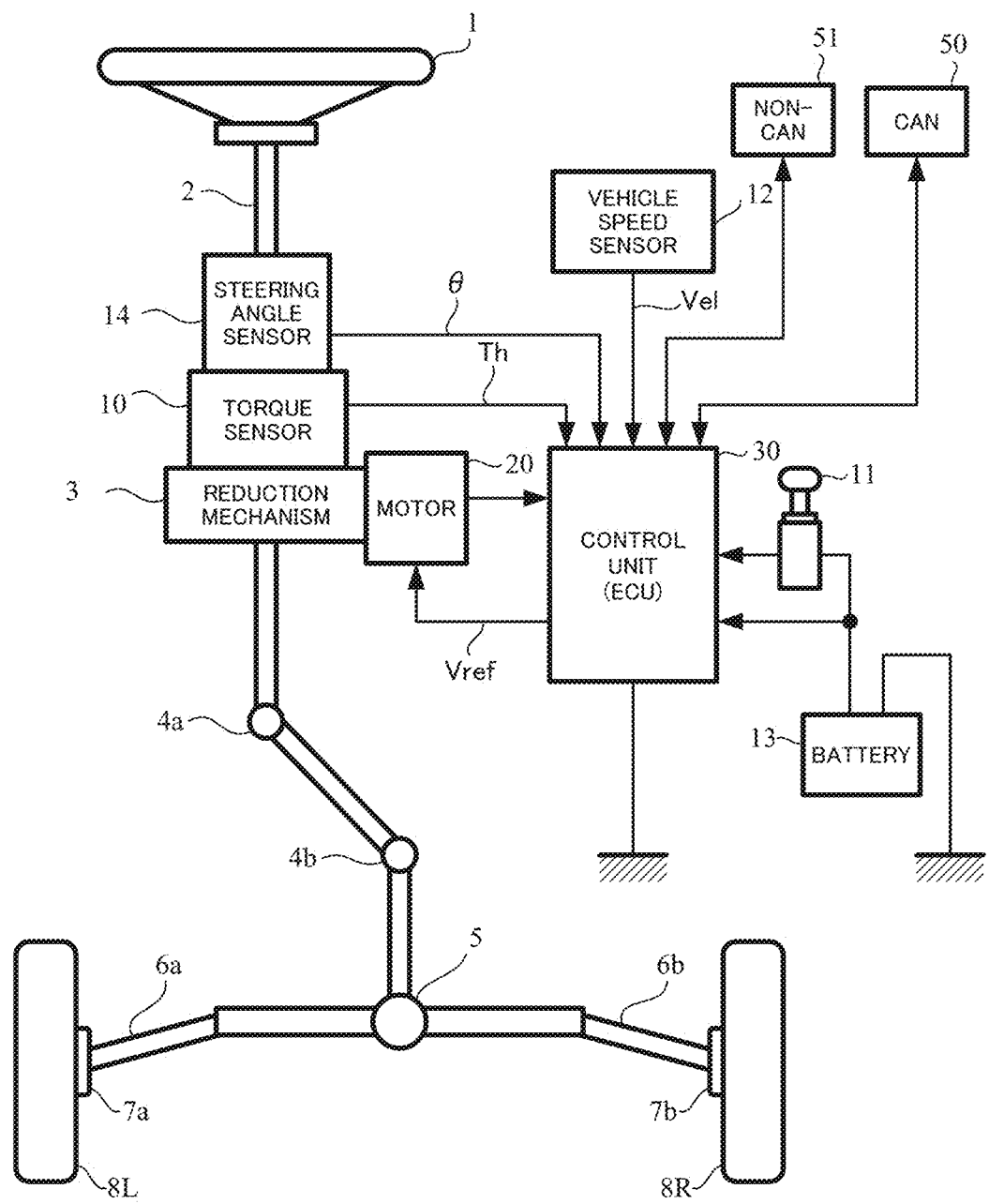
FIG. 1 is a configuration diagram illustrating a general configuration of an electric power steering apparatus.

A general configuration of the electric power steering apparatus will be described with reference to FIG. 1. A column shaft (steering shaft and a handle shaft) 2 of a handle 1 is coupled to steered wheels 8L and 8R via reduction gears of a reduction mechanism 3, universal joints 4a and 4b, a pinion and rack mechanism 5, and tie rods 6a and 6b, and via hub units 7a and 7b. Further, the column shaft 2 is provided with a torque sensor 10 which detects a steering torque Th of the handle 1, and a steering angle sensor 14 which detects a steering angle θ. A motor 20 which assists a steering force of the handle 1 is coupled to the column shaft 2 via the reduction gears (a gear ratio n) of the reduction mechanism 3.

Further, a control unit (ECU) which is a control unit 30 which controls the electric power steering apparatus comprises a micro control unit (MCU) as a key part, receives power supply from a battery 13 and receives an input of an ignition key signal via an ignition key 11.

The control unit 30 configured in this way performs a calculating operation on a current command value of an assist (steering assist) command based on a steering torque Th detected by the torque sensor 10 and a vehicle speed Vel detected by a vehicle speed sensor 12, and controls a current supplied to the electric motor 20 according to a voltage control command value Vref obtained by compensating for the current command value. In this regard, the steering angle sensor 14 is not indispensable, and may not be disposed, and a steering angle may be obtained from a rotational position sensor such as a resolver coupled to the motor 20.

Further, the control unit 30 is connected with a CAN (Controller Area Network) 50 which receives various pieces of information of the vehicle, and can receive the vehicle speed Vel form the CAN 50. Furthermore, the control unit 30 is connected with a non-CAN 51, too, which performs communication with components other than the CAN 50, and receives analog/digital signals and radio waves.

Figure 2A:
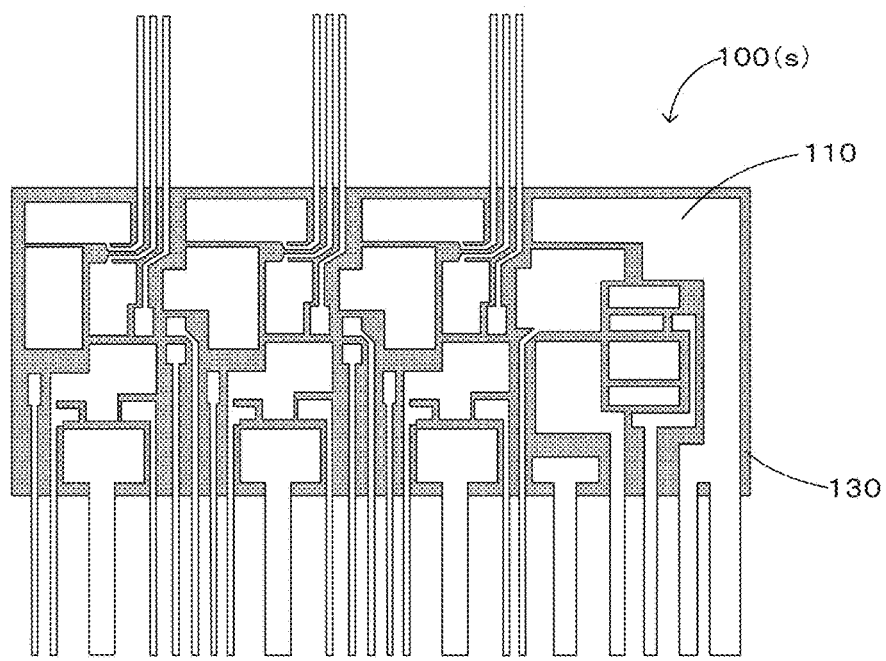
FIGS. 2A and 2B illustrate an example of an electronic part mounting heat-dissipating substrate according to the present invention.
Figure 2B:
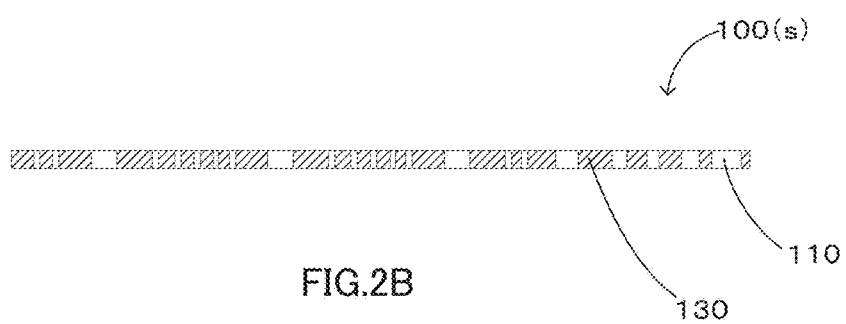

Still further, an electronic part mounting heat-dissipating substrate according to the present invention provided inside the control unit 30 in the electric power steering apparatus configured as described above is configured as follows. In this connection, the same components which can adopt other modes will be assigned the same reference numerals, and overlapping descriptions and configurations will not be partially described below. Further, a size and a ratio of each component illustrated in the drawings are different from an actual size and ratio for ease of description in some cases. FIGS. 2A and 2B show an example of an electronic part mounting heat-dissipating substrate 100(s) according to the present invention. FIG. 2A is a top view, and FIG. 2B is a side view. As illustrated in, for example, FIGS. 2A and 2B, the electronic part mounting heat-dissipating substrate 100(s) according to the present invention basically includes lead frames 110 which are formed in wiring pattern shapes by means such as or the like, and insulating members 130 which are integrally molded between these lead frames 110. In this regard, portions encircled by white closed curves in FIGS. 2A and 2B indicate the lead frames 110, and gray shaded portions in FIG. 2A and diagonal portions in FIG. 2B indicate the insulating members 130.

In the electronic part mounting heat-dissipating substrate 100(s) according to the present invention, the lead frames 110 are formed by using the conductor plate, and therefore are formed in a flat plate shape as a whole, and are formed in wiring pattern shapes of a circuit on which the electronic parts are mounted when seen from an upper surface-side. Further, molding means for the lead frames 110 of the wiring pattern shapes of the conductor plate is not limited in particular. For example, a plate member made of metal (made of aluminum or copper, for example) formed by a press-working, a punch-working or a laser-processing and a cutting can be employed for the molding means.

Further, the molding can be also performed by etching. However, according to the present invention, by increasing a plate thickness of the conductor plate, it is possible to increase the thickness of the lead frames 110 formed by using the conductor plate, and decrease a wiring resistance. Hence, even when processing is performed by the etching, and when a material is copper, by forming at least the thickness of approximately 70 [μm] or more, the heat dissipation characteristic is improved compared to a substrate on which circuit patterns are formed by the conventional etching. Further, when the processing is not performed by the etching and the lead frames 110 of the wiring pattern shapes are formed by the press-working or the punch-working, if, for example, the copper is used, the plate thickness of the conductor plate is more desirably 300 [μm] or more.

Furthermore, according to the present invention, it is possible to arbitrarily set the plate thickness of the conductor plate. Consequently, it is possible to use signal lines of different thickness in which a small current flows and in which a large current flows in a mixed manner for the signal lines of the lead frames formed by using the conductor plate. In this case, it is also possible to change and process a feed bridge width of the press-working or the like according to a plate thickness.

Accordingly, a substrate surface is adjusted to make an area larger or smaller (make a line width of the lead frame 110 larger or smaller, for example) for the electronic parts for which a high current is used. Consequently, it is possible to provide a small current lead frame 110(l) of a narrow line width and a large current lead frame 110(h) of a wide line width. However, the present invention is not limited to this. By increasing the plate thickness and increasing a volume, it is possible to reduce the wiring resistance and improve the heat dissipation, too. As a result, it is possible to further improve a part mounting density.

Further, according to the present invention, the conductor plates having different thicknesses of at least two types or more are used. Consequently, it is also possible to form the lead frames 110 of the wiring pattern shapes having the different thickness of at least two types or more. Furthermore, in this case, the lead frames having the different thickness can be also provided in a mixed arrangement.

Consequently, when a configuration where the lead frames of the different plate thickness are used in a mixed manner, it is also possible to dispose with a high-density the lead frames which support current-amounts to be distributed to the mounted electronic parts, and reduce a relevant cost by reducing a material of use and a dimension.

That is, when the lead frames are formed by, for example, the punch-working as described above, an operation which is called blanking of shaping an outline shape of lead frame wiring portions by the press-working is performed. Further, a material which is made larger than a final molded article is used for the blanking. This larger portion is referred to as a bridge. The bridge includes a "feed bridge width" and a "bridge width". Then, generally, when a minimum necessary width of the bridge width is a plate thickness t [mm], the "feed bridge width" is approximately 1.0t to 1.5t [mm], and the "bridge width" is "1.5×feed bridge width". Making the bridge width too small makes it impossible to perform the normal punching, accelerates abrasion of punches and dies and produces burrs.

Figure 3A:
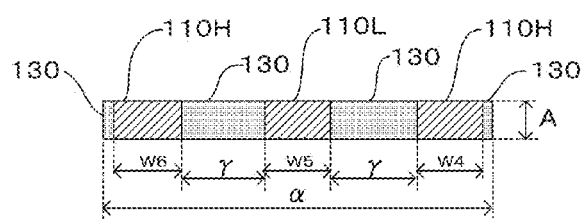
FIG. 3A is a sectional view seen from an extension direction of lead frames of the substrate according to the present invention composed of the lead frames having the same thickness.
Figure 3B:
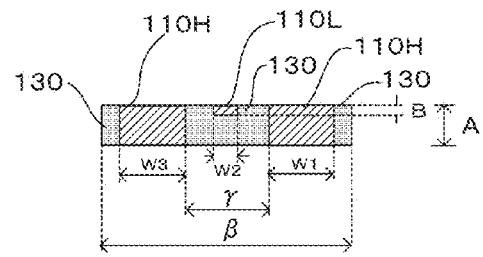
FIG. 3B is a sectional view seen from the extension direction of the lead frames of the substrate according to the present invention composed of the lead frames having different thicknesses.
Figure 3C:
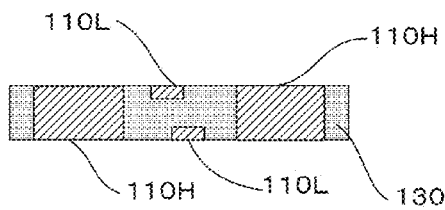
FIG. 3C is a sectional view illustrating an example where upper and lower surfaces of the substrate according to the present invention composed of the lead frames having the different thicknesses are part arrangement surfaces seen from the extension direction of the lead frames.

In this way, according to the present invention, instead of using the large current and small current (small signal) lead frames having the same plate thickness, it is also possible to use and provide plural lead frames supporting each current in a mixed manner as shown in FIGS. 3A to 3C. In this regard, FIG. 3A is a sectional view seen from an extension direction of the lead frames of the substrate according to the present invention composed of the lead frames having the same thickness. FIG. 3B is a sectional view seen from the extension direction of the lead frames of the substrate according to the present invention composed of the lead frames having the different thickness.

FIG. 3A illustrates that the lead frames 110 having the same thickness are used for two large current lines 110H (having widths W4 and W6) and small signal lines 110L (width W5). In this case, intervals between the lead frames need to be a feed bridge width γ corresponding to the thickness t (t=A, herein) of the lead frames 110. Hence, in an example illustrated in FIG. 3A, for example, a total alignment sum of the widths of the plural lead frames 110 and the feed bridge width (a portion at which a filler is filled) is approximately α ($\alpha \approx 2\gamma + W4 + W5 + W6$).

Meanwhile, FIG. 3B illustrates that the lead frames 110 having the different thickness (the thickness t of the large current lines "t=A" and the thickness t of the small current line "t=B") are used for the two large current lines 110H (having widths W1 and W3) and small signal lines 110L (width W2). In this case, mutual intervals between plural lead frames allow the small current lines 110L to be disposed between the large current lines 110H. Consequently, a total alignment sum of the widths of the plural lead frames 110 and the feed bridge width (the portion at which the filler is filled) is approximately β ($\beta \approx \gamma + W1 + W3$).

Hence, as a result obtained by employing the above configuration, when the widths of the plural lead frames 110 and a lead edge member are compared, "α>β" holds. By making the thickness of the small signal lines 110L thinner than the thicknesses of the large current lines 110H, it is possible to increase the wiring density. Further, a conductor plate of a thinner plate thickness can be used for the lead frames 110L since the lead frames 110L are the small current lines. Consequently, it is possible to save the materials of use and reduce the cost.

Accordingly, for example, the conductor plates for making the lead frames having plate thickness t where t=A (in this regard, A=1.0 [mm]) and t=B (in this regard, B=0.25 [mm]) hold are used. In this case, the large current lines 110H are processed by using the conductor plate having the plate thickness A, and the small signal lines 110L are processed by using the conductor plate having the plate thickness B, and the large current lines 110H and the small signal lines 110L are combined and used for the substrate according to the present invention. Thus, it is possible to miniaturize the substrate.

Therefore, this will be described as a more specific example. For example, as shown in FIGS. 4A and 4B and subsequent figures, it is possible to refine the circuit mounted on the substrate, and miniaturize the substrate compared to the substrate for which the lead frames of the single thickness are used.

Figure 4A:
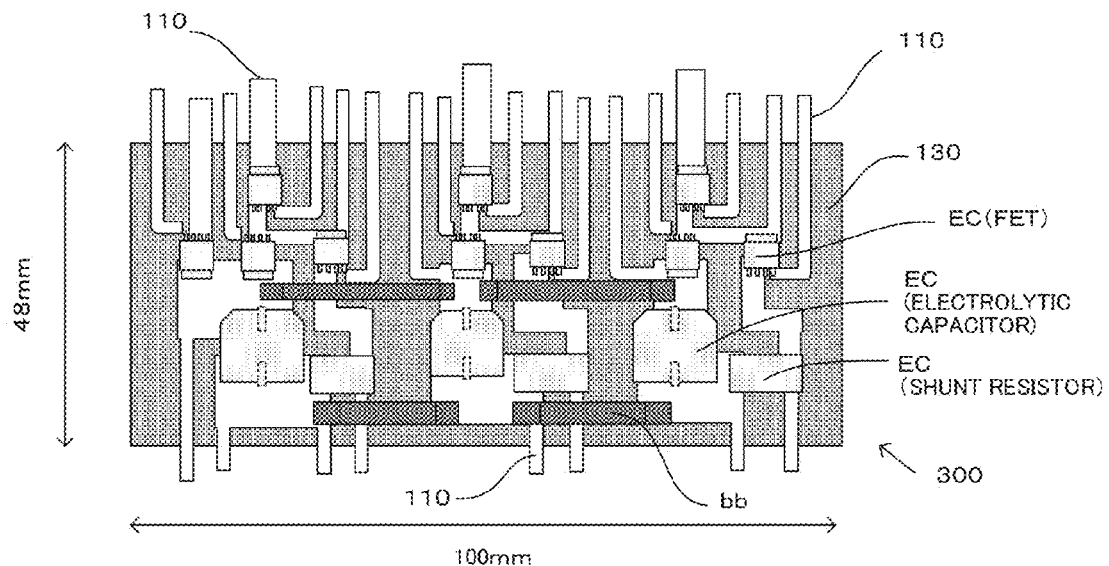
FIG. 4A is a top view illustrating that a circuit is formed on the substrate according to the present invention by using the lead frames having the thickness of a single type.

Here, FIG. 4A is a top view illustrating that a circuit is formed on an electronic part mounting heat-dissipating substrate 300 according to the present invention by using the lead frames 110 having the thickness of a single type. FIG. 4B is a top view illustrating an example where a similar circuit is formed on an electronic part mounting heat-dissipating substrate 350 according to the present invention by using two types of the lead frames 110H and 110L having different thicknesses and widths as described above.

Figure 4B:
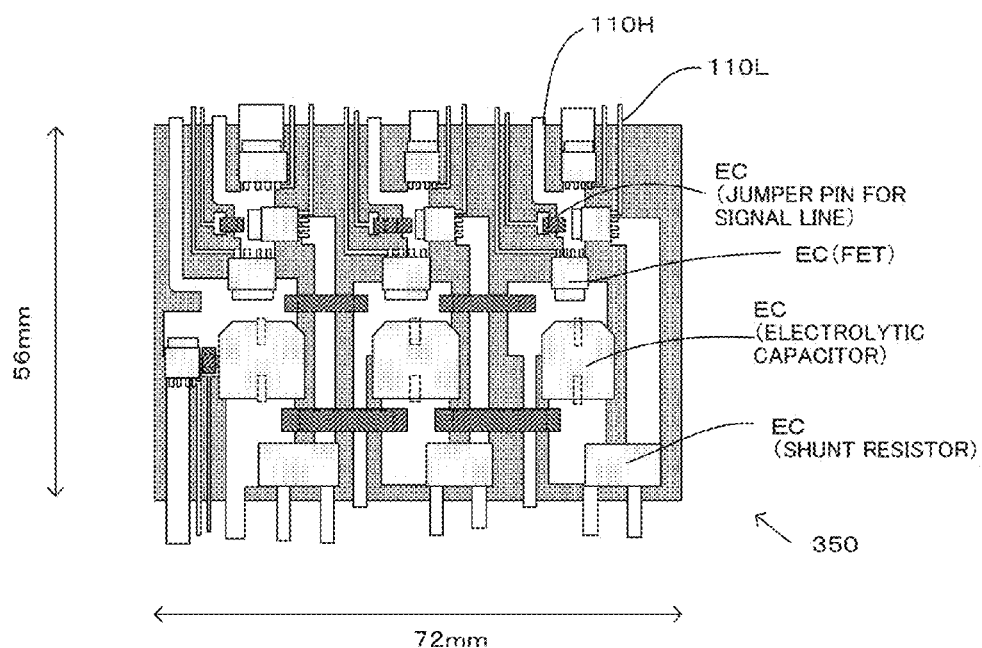
FIG. 4B is a top view illustrating an example where a similar circuit is formed on the substrate according to the present invention by using two types of the lead frames having the different thicknesses and widths.

As well, FIGS. 4A and 4B show a state where the electronic parts EC are mounted on the substrate and show examples where this circuit is an inverter circuit of a three-phase brushless motor used for the electric power steering apparatus.

Assume a case where, as shown in FIG. 4A, a wiring system such as FETs which are used for the circuit and in which a relatively large current flows, and a wiring system which is used for control signals of the FETs and in which a relatively small current flows are configured by using the lead frames 110 having the thickness of a single type (e.g. 1 [mm]). In this case, in an example where ten FETs are mounted as described above, a substrate surface area is approximately 4800 [mm$^2$].

Meanwhile, as shown in FIG. 4B, the different lead frames 110 are used. The thick (e.g. approximately 1 [mm]) large power lead frames 110H are used for the wiring system such as the FETs which are used for the circuit and in which a relatively large current flow. The thin (e.g. approximately 0.25 [mm]) small power lead frames 110L are used for the wiring system which is used for the control signals of the FETs and in which a relatively small current flows. In this case, it is also possible to reduce the widths of the lead frames according to the thicknesses of the lead frames. Consequently, it is possible to miniaturize the substrate surface area of the similar circuit to approximately 4032 [mm$^2$].

Therefore, by using the lead frames of the different thicknesses as described above, it is possible to reduce approximately 15% of the surface area of the substrate 450 compared to the substrate 400.

In this regard, a material of the conductor plate for forming the lead frames are formed by using relatively a low cost metal good conductors such as the copper or the aluminum described above, so that it is possible to reduce the cost. However, the conductor plates are used to form the lead frames 110 and the electronic parts are mounted thereon by soldering. Therefore, the conductors desirably have a high heat conductivity and have a good compatibility to mount the electronic parts.

Back to FIGS. 2A and 2B, the insulating members 130 of the electronic part mounting heat-dissipating substrate 100(s) according to the present invention are configured to fill spaces of the gaps between the lead frames 110 of the wiring pattern shapes formed by the conductor plates. By filling the insulating members in the gaps between the lead frames, the lead frames are mutually adhered to stably retain an entire structure on a flat plate basically.

Then, when the lead frames 110 formed by the conductor plates have the same plate thickness as the embodiment 100(s) illustrated in FIGS. 2A and 2B, a side of the lead frames 110 on which the electronic parts are mounted is an upper surface-side in a front direction vertical to FIG. 2A (an upper direction in FIG. 2B). In this case, a plate surface at the upper surface-side of the lead frames 110, and the plate surfaces (top surfaces) at an upper surface-side of the insulating members 130 are formed to form the identical plane. Further, the back surfaces of the plate surfaces formed by the lead frames 110 and the back surfaces of the insulating members 130 are also formed to form the identical plane likewise. In this regard, the side on which the electronic parts are mounted can be arbitrarily selected, and the electronic parts can also be configured to be mounted on both surfaces of the electronic part mounting heat-dissipating substrate 100.

Figure 5A:
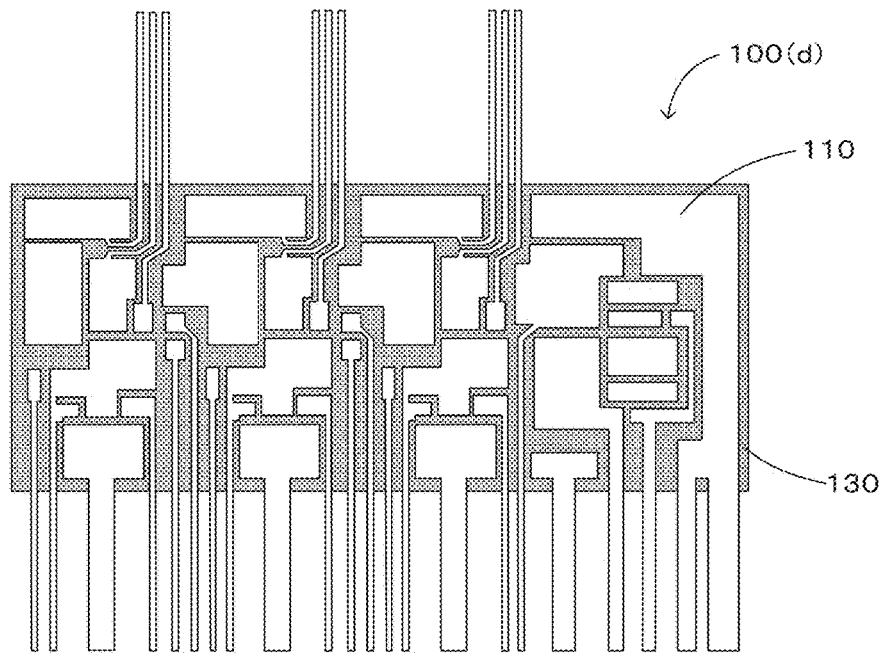
FIG. 5A is a top view illustrating that a circuit is formed on the substrate according to the present invention by using the lead frames having different thicknesses.
Figure 5B:
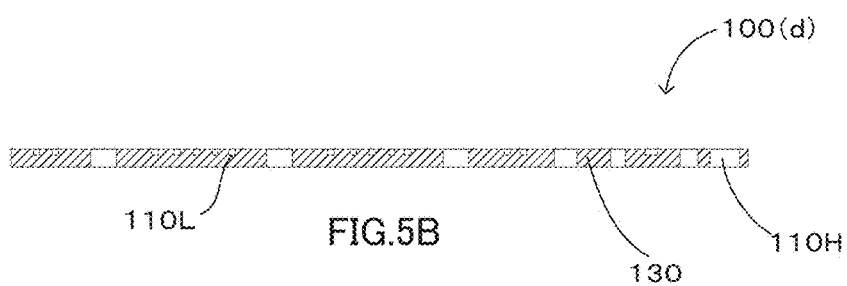
FIG. 5B is a side view of this circuit.
Figure 5C:
FIG. 5C is a side view illustrating an example where upper and lower surfaces of the substrate according to the present invention are part arrangement surfaces by using the lead frames having different thicknesses.

Further, assume a case where the lead frames 110 formed by the conductor plates have the different plate thicknesses as in the embodiment 100(d) illustrated in FIGS. 5A to 5C. In this case, similar to the embodiment 100(s) in FIGS. 2A and 2B, the side of the lead frames 110 on which the electronic parts are mounted is an upper surface-side in a front direction vertical to FIG. 5A (an upper direction in FIG. 5B). In this case, the plate surfaces at the upper surface-side of the lead frames 110, and the plate surfaces at the upper surface-side of the insulating members 130 are formed to form the identical plane.

On the other hand, the plate surfaces at the back surface-side opposite to the side of the lead frames 110 on which the electronic parts are mounted have the different thicknesses of the lead frames 110 as described. Therefore, the back surfaces formed by the lead frames 110 cannot form the identical plane. Hence, the plate surfaces of the back surfaces of the part arrangement surfaces of the lead frames 110 formed by the conductor plates and the plate surfaces (the top surfaces) at the back surface-side at the part arrangement surface side of the insulating members 130 are aligned to the plate surface of the back surface of the part arrangement surface of the thickest lead frame of the lead frames, and the insulating members are filled, so that the plate surface at the back surface-side of the lead frame of the largest plate thickness and the plate surfaces (the top surfaces) at the back surface-side formed by the insulating members are formed in the identical plane. As a result, the back surface of the substrate for which the lead frames having plural thicknesses are used, and the back surface of the part arrangement surface of the largest lead frame and the insulating members form the sample plane. In this regard, the side on which the electronic parts are mounted can be arbitrarily selected. For example, as shown in FIG. 3C and FIG. 5C, the electronic parts can also be mounted on both surfaces of the electronic part mounting heat-dissipating substrate 100(s) or 100(d) (these are collectively referred to as 100(s,d) or 100).

Figure 6A:
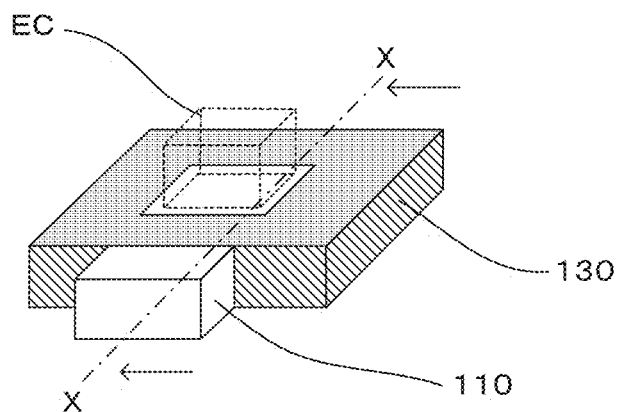
FIG. 6A is a perspective view illustrating a configuration example where a recess portion is provided to the lead frame.
Figure 6B:
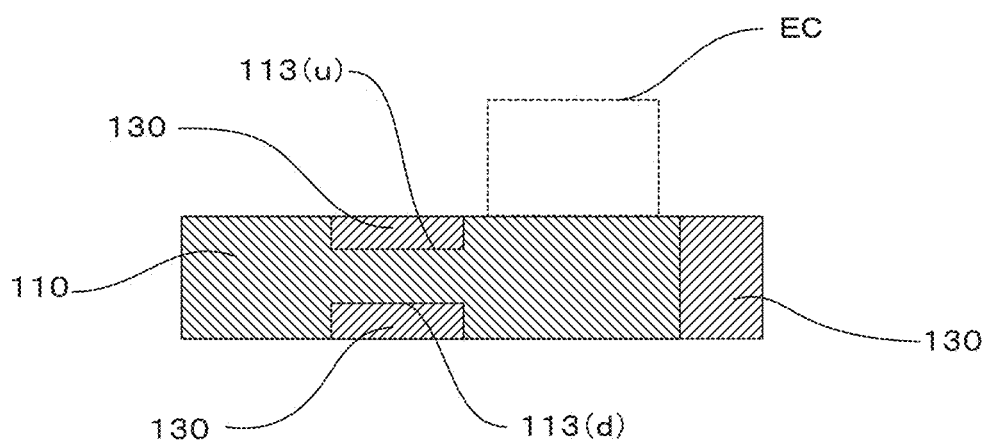
FIG. 6B is a sectional view illustrating a cross section passing a line X-X in FIG. 6A from a direction of arrows in FIG. 6A.
Figure 8A:
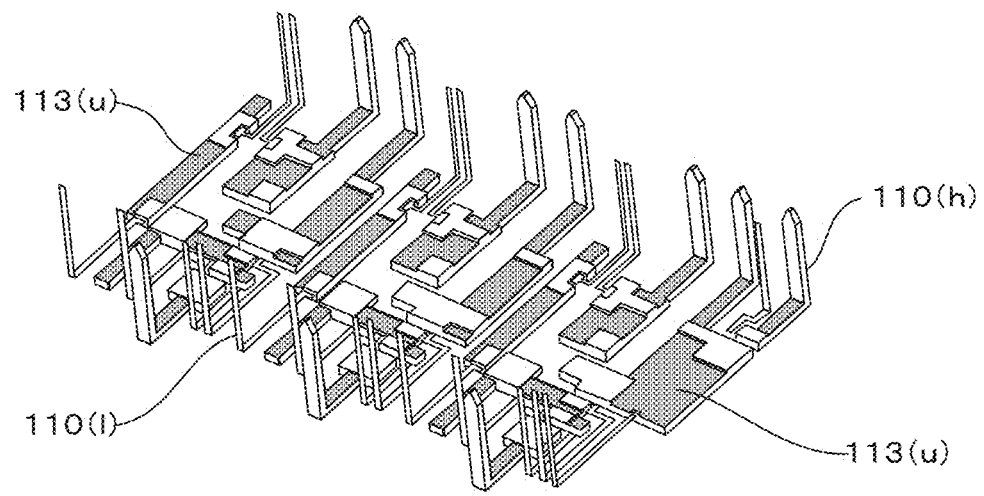
FIGS. 8A and 8B are perspective views illustrating an example where recess portions are provided to the lead frames, and a plate surface of the substrate according to the present invention is formed.
Figure 8B:
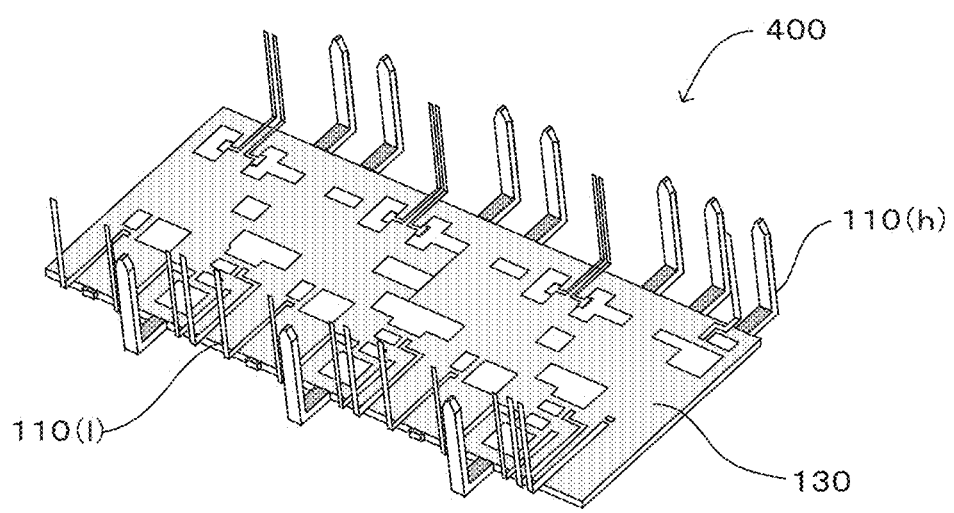

Further, the configuration of the insulating member 130 and the lead frames 110 is not limited to the configuration where the insulating member 130 are provided between the lead frames 110 as described above. A configuration where recess portions 113 can also be provided at portions other the part mounting portions at the part arrangement surface side of the lead frames 110 as described below with reference to FIGS. 6A, 6B and subsequent figures and the recess portions 113 are also covered by the insulating members 130 may be employed. In this regard, FIG. 6A is a perspective view illustrating a configuration example where the recess portion 113 is provided to the lead frame 110. FIG. 6B is a sectional view illustrating a cross section passing a line X-X in FIG. 6A from a direction of arrows in FIG. 6A. Further, FIGS. 6A and 6B illustrate only examples of part of the lead frames 110 and the insulating members 130 without illustrating the entire substrate. FIGS. 8A and 8B described below illustrate a configuration example 400 as an entire substrate.

A configuration example illustrated in FIGS. 6A and 6B employs a configuration where a portion at which the electronic part EC is not disposed on the plate surface (an upper side surface illustrated in the perspective view in FIG. 6A) of the part arrangement surface of the lead frame 110 on which the electronic part EC is mounted is provided with a top surface-side recess portion 113(u) on the plate surface of the part arrangement surface as illustrated in FIG. 6B, and the insulating members 130 are filled in the top surface-side recess portion 113(u) to cover the top surface-side recess portion 113(u) by the insulating member 130.

Further, according to the above configuration, the top surface of the insulating member 130 which covers the top surface-side recess portion 113(u), and the plate surface of the part arrangement surface of the lead frame 110 and the top surface at the part arrangement surface of the insulating member 130 form one continuous surface.

Furthermore, similarly, in the configuration example illustrated in FIGS. 6A and 6B, a portion which is the plate surface (a lower surface illustrated in the perspective view in FIG. 6A of the back surface of the part arrangement surface of the lead frame 110 on which the electronic part EC is mounted, and which corresponds to the back surface of the portion of the part arrangement surface on which the electronic part EC is not disposed is provided with a back surface-side recess portion 113(d) on the plate surface of the back surface of the part arrangement surface and is covered with the insulating member 130. Additionally, according to this configuration, the top surface of the insulating member 130 which covers the back surface-side recess portion 113(d), and the plate surface of the back surface of the part arrangement surface of the lead frame 110 and the top surface of the insulating member 130 at the back surface-side at the part arrangement surface side form one continuous surface. In this regard, the method for forming the recess portions 113 is not limited in particular. However, it is possible to simultaneously mold the recess portions 113 by means such as the pressing when the lead frames 110 are molded.

Hence, in the configuration example illustrated in FIGS. 6A and 6B, the insulating members 130 are filled in side surfaces between the lead frames 110 and bonded to the lead frames 110. In addition, the insulating members 130 can continue to the both side surfaces of the lead frames 110 in a direction vertical to an axial direction (e.g. a direction along the X-X line illustrated in FIG. 6A) of the lead frames 110. Consequently, the insulating member 130 can contact and be bonded to the lead frames via the upper surface-side and the lower surface-side of the lead frames 110. Further, the insulating members 130 including the insulating member which is filled in the recess portions 113 are formed to form the identical plane together with the plate surface and the back surface-side of the part arrangement surface of the lead frame 110 as described above.

Consequently, in the configuration example illustrated in FIGS. 6A and 6B according to the present invention, a contact surface of the lead frames 110 and the insulating members 130 is expanded. As a result, it is possible to improve a bonding strength of the lead frames 110 and the insulating members 130.

Further, in the configuration example illustrated in FIGS. 6A and 6B according to the present invention, the plate surface of the part arrangement surface of the lead frames 110 and the top surface of the insulating members 130 are formed to form the identical plane together with the insulating members filled in the recess portions 113. Consequently, it is possible to perform solder feeding by using a metal mask instead of Dip solder feeding to mount the various electronic parts EC. Further, it is possible to easily control a soldering range.

As well, the recess portions 113 are example configuration examples, and can be appropriately disposed according to the electronic circuits to be formed on the substrate. Hence, a form and an arrangement of the recess portions 113 are provided according to the electronic circuit and are not limited to the configuration example illustrated in FIGS. 6A and 6B. The recess portions may be disposed near part of the electronic parts, only the top surface-side recess portion 113($u$) or only the back surface-side recess portion 113($d$) may be disposed, or outlines of the recess portions 113 may be formed as curves. Further, the depths of recessed surfaces of the recess portions can be determined by taking into account the adhesion and the heat dissipation of the lead frames 110.

Back to FIGS. 2A and 2B, components of the insulating members 130 are molded by using a composite insulating resin member such as polycarbonate or engineering plastics having the heat dissipation. However, the components are not limited thereto. The components can be selected by taking into account an insulation property, the heat dissipation and the compatibility with a material of the conductor plates which compose the lead frames 110.

Further, the present invention adopts a structure in which the insulating members 130 are filled in and spaces between and around the lead frames 110 of the wiring pattern shapes formed by the conductor plates as described above. Hence, the insulating members 130 can improve a rigidity of the entire electronic part mounting heat-dissipating substrate 100. Further, the insulating members 130 and the lead frames 110 can effectively dissipate the heat from the electronic parts to be mounted as described above.

Furthermore, according to the electronic part mounting heat-dissipating substrate 100($s,d$) according to the present invention, the lead frames 110 formed in the wiring pattern shapes and the insulating members 130 can be integrally formed by a method such as an insertion molding to form the electronic part mounting heat-dissipating substrate 100($s,d$). Furthermore, in this case, when the lead frames having the different thicknesses are used, the lead frames of the different thicknesses can also be provided in a mixed manner to form the substrate 100($d$). Hence, the thick lead frames and the thin lead frames can be alternately disposed or plural thick lead frames and plural thin lead frames can be disposed by taking into account a circuit configuration and the dispersion of heat generation areas.

Consequently, according to the electronic part mounting heat-dissipating substrate 100($s,d$) according to the present invention, it is possible to form the lead frames 110 of the wiring pattern shapes of the electronic circuits by the press molding and, consequently reduce a tact and reduce the cost. Further, for the same reason, it is not necessary to mount terminals or the like, so that it is possible to reduce the parts and reduce the cost. Furthermore, in the present embodiment transfer molding is not used. However, compared to the substrate formed by the transfer molding, the present invention has advantages that an electrolytic capacitor and a choke coil for which a high temperature measure needs to be taken can be disposed in the same row, a wire bonding is not necessary, and an expensive ceramic substrate which is used for a transfer module is not necessary since it is possible to effectively prevent a warp of the substrate caused by the sudden heat generation.

Figure 7A:
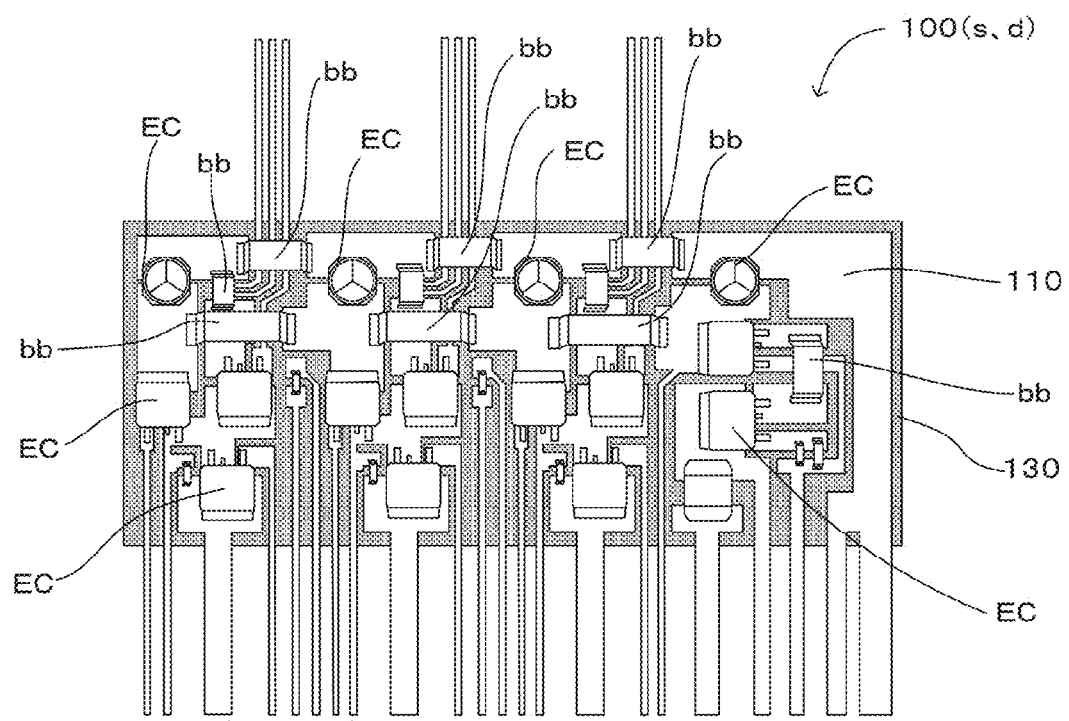
FIG. 7A illustrates an example where electronic parts EC are mounted at an upper surface-side of the electronic part mounting heat-dissipating substrate according to the present invention.
Figure 7B:
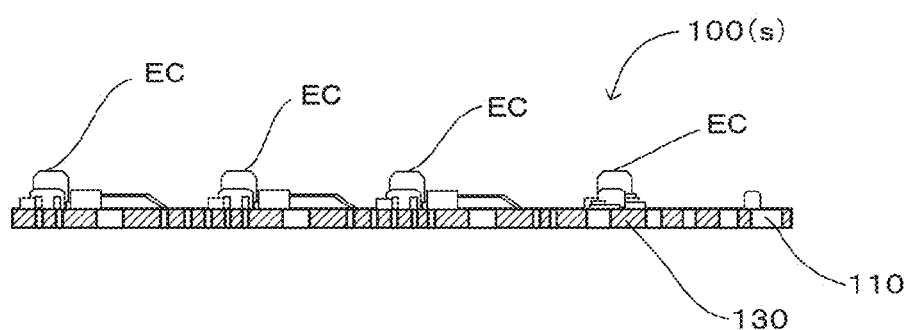
FIGS. 7B and 7C are side views of this example.
Figure 7C:
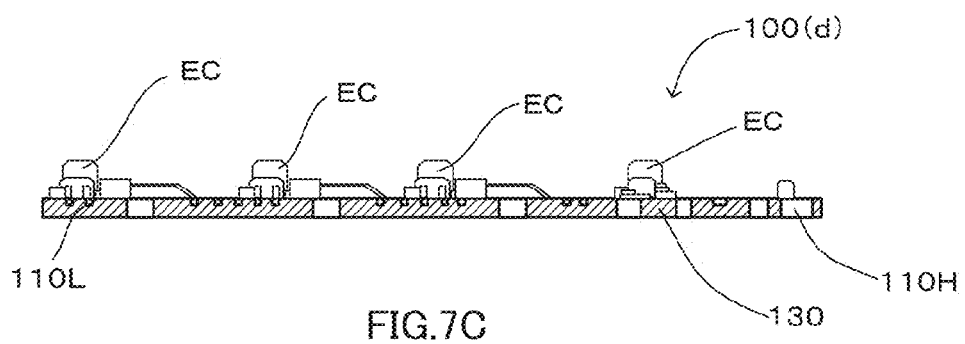

Next, FIG. 7A illustrates an example where the electronic parts EC are mounted at the upper surface-side of the electronic part mounting heat-dissipating substrate 100($s,d$) according to the present invention formed as described above. FIGS. 7B and 7C are side views of this example. In this regard, even when the substrate 100($s$) including the lead frames 110 of the same thickness is used or when the substrate 100($d$) including the lead frames 110 of the different thicknesses is used, the same configuration can be employed in FIG. 7A. Further, FIG. 7B illustrates the substrate 100($s$) including the lead frames 110 of the same thickness. FIG. 7C illustrates the substrate 100($d$) including the lead frames 110 of the different thicknesses.

The electronic parts EC and the like mounted at the upper surface-side of the electronic part mounting heat-dissipating substrate 100($s,d$) include a semiconductor switching element for a current control, a shunt-resistor for a control current detection, and a heat-generating part such as a high-capacity capacitor for a ripple absorption. In addition, the electronic parts EC include bus bar bb which connects the lead frames and is made of a metal plate such as the copper or the aluminum, a jumper pin and the like when necessary. Further, the electronic parts EC are not limited to packaged parts, and may be mounted by way of bare chip mounting.

Furthermore, as illustrated in FIGS. 7A to 7C, according to the electronic part mounting heat-dissipating substrate 100($s,d$) according to the present invention, the electronic parts EC can be mounted directly on the lead frames 110 formed in the wiring pattern shapes of the electronic circuit.

Still further, although not illustrated in FIGS. 7A to 7C, the mounted electronic parts EC can also be provided in a mirror arrangement, too. Consequently, when the electronic part mounting heat-dissipating substrate is used for the control unit of the electric power steering apparatus in particular, it is possible to easily support a specification of a right handle and a left handle. Further, according to the electronic part mounting heat-dissipating substrate 100($s,d$) according to the present invention, the electronic parts EC can be mounted on both of the upper surface and the lower surface of the lead frames 110 formed by using the conductor plates, too. Hence, it is also possible to provide an advantage that the substrate can be stereoscopically disposed.

Further, as described with reference to FIGS. 6A and 6B, FIGS. 8A and 8B are perspective views illustrating an example where the recess portions 113 are also provided to the lead frames 110, the insulating members 130 are filled not only between the lead frames 110 but also in the recess portions 113 to form a plate surface of the substrate 400. FIG. 8A is a perspective view illustrating a state of the lead frames 110 in which the insulating members 130 are not yet filled. FIG. 8B is a perspective view illustrating a state of the substrate 400 in which the insulating members 130 have been filled. In this regard, only the top surface-side recess portions 113($u$) of the recess portions 113 are illustrated, and the back surface-side recess portions 113($d$) can also be provided. Further, the lead frames 110 are bent upward at an outer rim of the substrate similar to an example in FIGS. 12A to 12C.

According to the present invention, as shown in FIG. 8A, portions which need to be reinforced by the insulating members 130 in the lead frames 110 which compose the substrate 400 are provided with the recess portions 113 in advance. Meanwhile, solder control portions of the lead frames 110 on which the electronic parts EC are mounted are left as they are. Consequently, it is possible to partially change the thicknesses of the lead frames 110.

Then, as illustrated in FIG. 8B, the insulating members 130 are filled between the lead frames 110 and in the recess portions 113, then, the lead frames 110 and the insulating members 130 form the identical plane, and only the portions at which the electronic parts EC are mounted are exposed on the substrate 400, so that it is possible to perform the solder feeding by using a metal mask instead of the Dip solder feeding and easily control a soldering range.

Figure 9A:
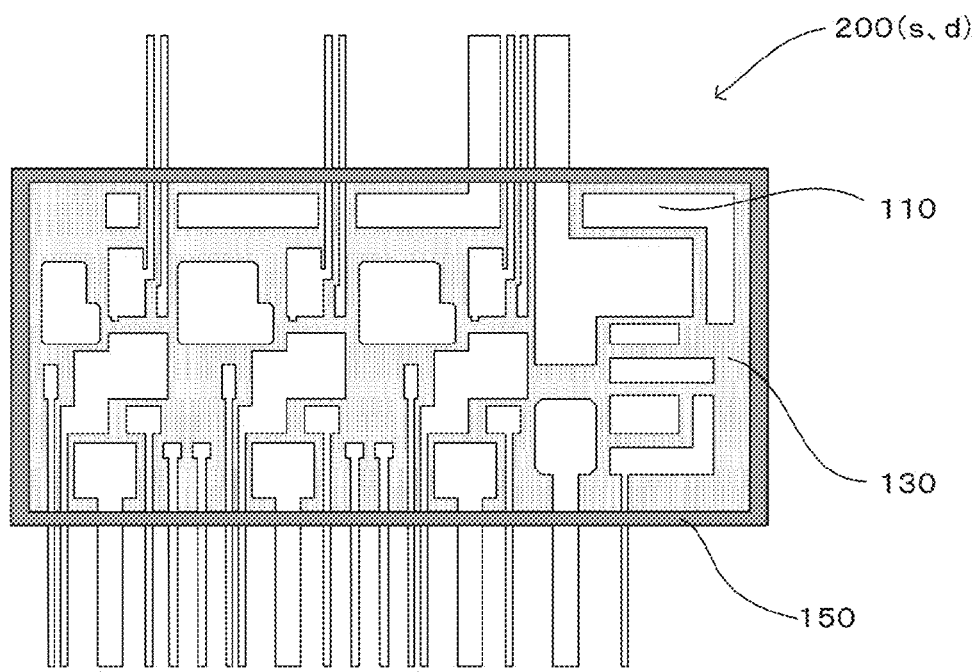
FIGS. 9A to 9C illustrate an example where a hem portion is provided to an outer rim of the substrate according to the present invention.
Figure 9B:
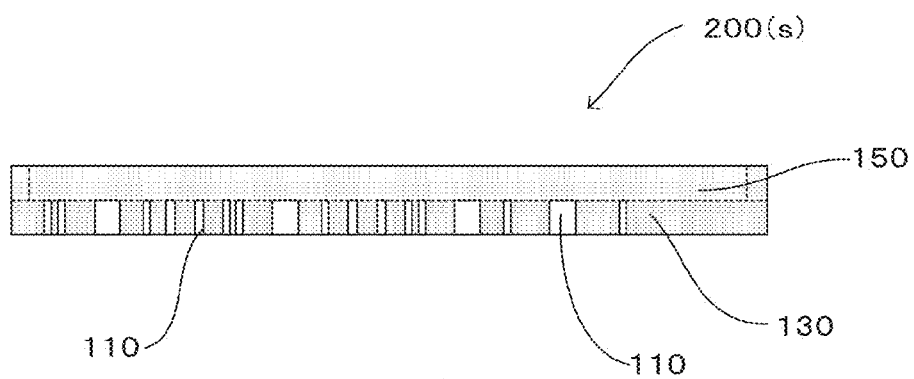
Figure 9C:
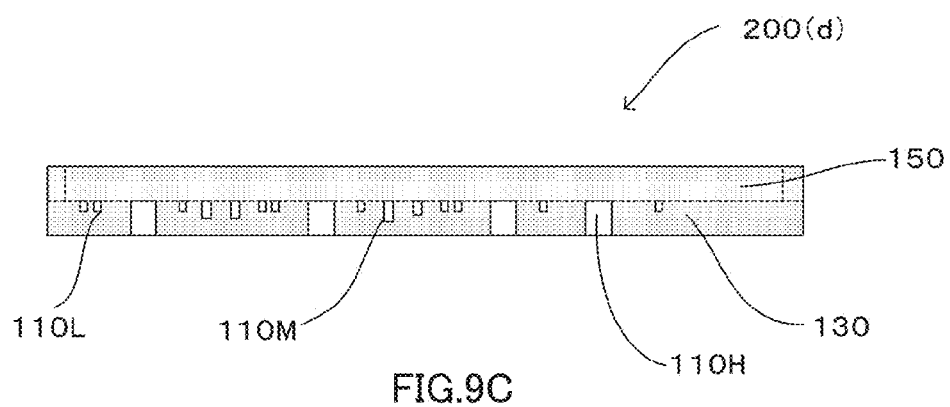

Further, FIGS. 9A to 9C illustrate an example of an electronic part mounting heat-dissipating substrate 200(*s,d*) in which a hem portion described below is provided to the outer rim of the substrate according to the present invention. FIG. 9A is a top view of this example, and FIG. 9B is a side view illustrating that the lead frames having the same thickness are used for the substrate 200(*s*). FIG. 9C is a side view illustrating that the lead frames having the different thicknesses are used for the substrate 200(*d*). In this regard, the substrate 200(*d*) includes three types of the lead frames 110H which have the thicknesses for a large current, the lead frames 110L which have the thicknesses for a small signal, and lead frames 110M in which an approximately middle current is distributed, and which have the thicknesses for a middle current.

According to the electronic part mounting heat-dissipating substrate 200(*s,d*) illustrated in FIGS. 9A, 9B and 9C, a hem portion 150 formed in a closed curve shape is formed at periphery portions of the insulating members 130 composing the present invention and at the part arrangement surface-side of the electronic part mounting heat-dissipating substrate 200 by the insulating members 130. In this regard, the hem portion 150 of the closed curve shape is formed in a rectangular shape to meet an outline of the outer rim of the insulating members 130. However, it is possible to configure the outline by optionally selecting with matching to the selected substrate.

According to the configuration of the present invention, by configuring and providing the hem portion 150 as described above, it is possible to further prevent the bonding portions of the lead frames 110 and the insulating members 130 from peeling, and further improve the rigidity of the electronic part mounting heat-dissipating substrate 200(*s,d*).

Figure 10A:
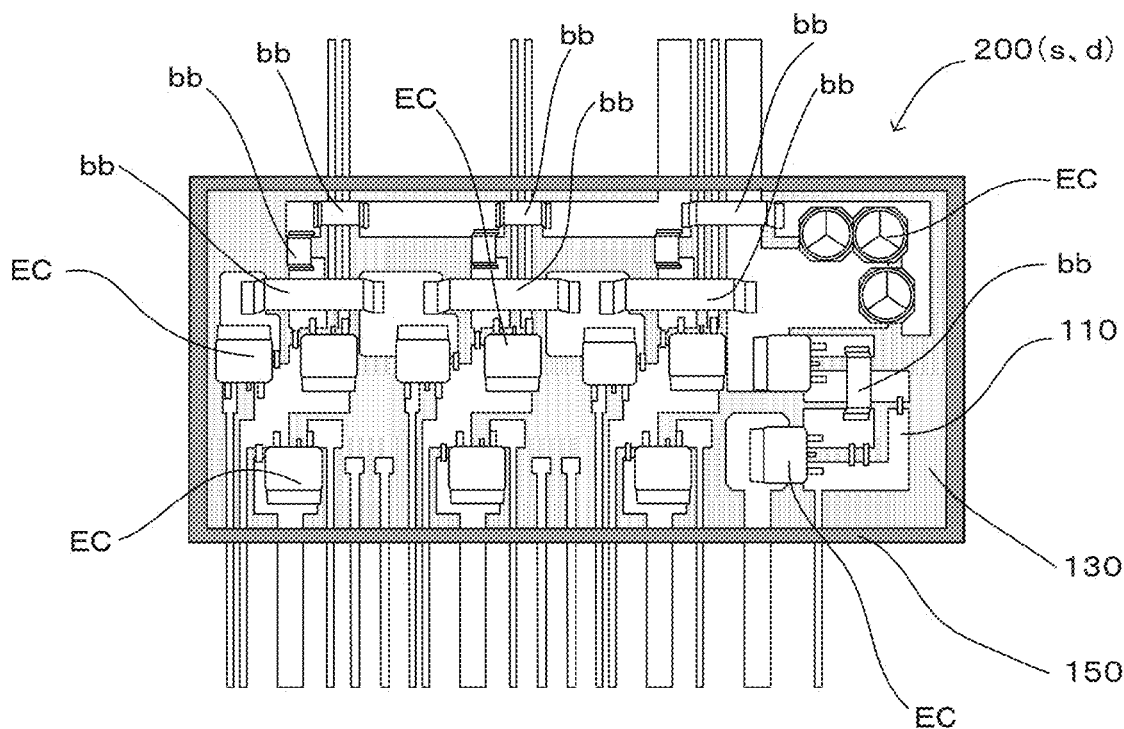
FIG. 10A is a top view illustrating that parts are mounted on the substrate illustrated in FIGS. 9A to 9C.
Figure 10B:
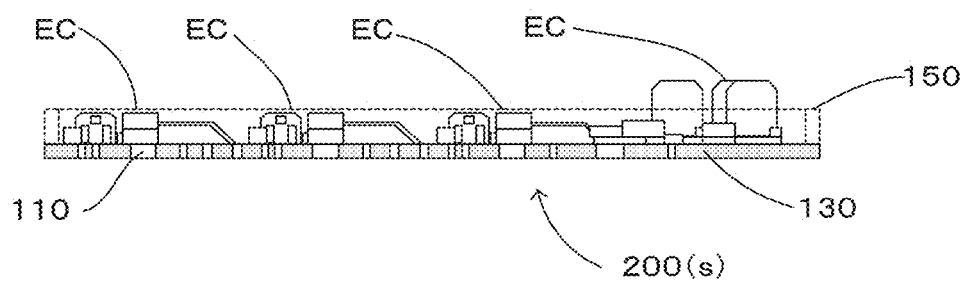
FIG. 10B is a side view illustrating that the lead frames having the same thickness are used for the substrate.
Figure 10C:
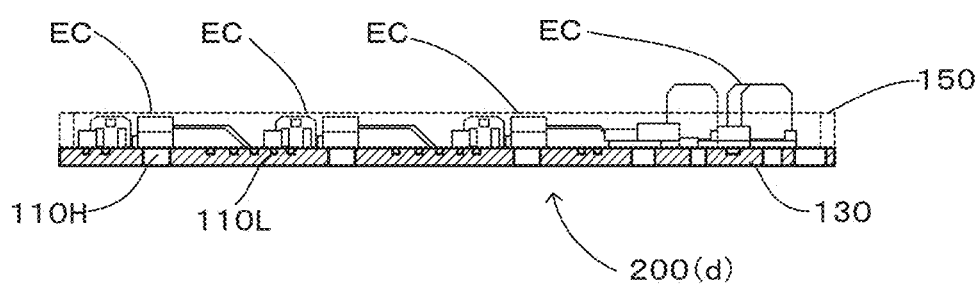
FIG. 10C is a side view illustrating that the lead frames having the different thicknesses are used for the substrate.

Further, as illustrated in FIGS. 10A to 10C, it is also possible to mold a resin on the electronic part mounting heat-dissipating substrate 200(*s,d*) illustrated in FIGS. 9A to 9C. FIG. 10A is a top view illustrating that parts are mounted on the substrate illustrated in FIGS. 9A to 9C. FIG. 10B is a side view illustrating that the lead frames having the same thickness are used for the substrate. FIG. 10C is a side view illustrating that the lead frames having the different thicknesses are used for the substrate.

In an examples illustrated in FIGS. 10A to 10C, the electronic parts EC are mounted on the electronic part mounting heat-dissipating substrate 200(*s,d*) as illustrated in FIGS. 7A to 7C, and a heat dissipation member is molded by the TIM inside the hem portion 150 (at a lower side of the portions indicated by dotted lines in FIGS. 10B and 10C) formed as described above and is placed in direct contact with the electronic parts.

Thus, according to the present invention, it is possible to further improve the heat dissipation from the electronic parts by employing the above configuration. In this regard, in the embodiment, the hem portion 150 is provided only at the upper surface-side of the electronic part mounting heat-dissipating substrate 200(*s,d*). However, the hem portion 150 can also be provided not only at the upper surface-side but also at the lower surface-side or can also be provided only at the lower surface-side.

Further, the electronic part mounting heat-dissipating substrate according to the present invention can be housed in a housing of the control unit of the electric power steering apparatus and be used. However, based on a basic concept of the present invention, it is also possible to configure part of the housing of the control unit as a good heat conductor, and adopt a heat dissipation structure of the control unit in which the back surface at the electronic part arrangement-side of the electronic part mounting heat-dissipating substrate and the portion composed of the good heat conductor of the housing of the control unit are disposed in contact with each other with an insulating film such as the TIM composed of the good heat conductor interposed therebetween.

Hence, when such a structure is adopted, a synergy effect of this structure and the heat dissipating structure of the control unit can further improve the heat dissipation of the electronic part mounting heat-dissipating substrate according to the present invention.

Figure 11A:
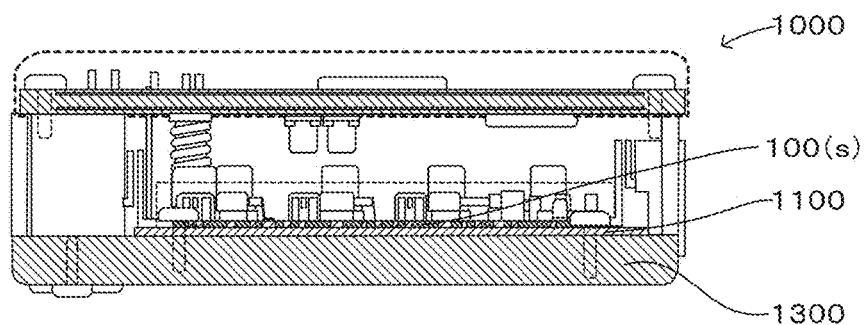
FIG. 11A is a side sectional view illustrating that the electronic part mounting heat-dissipating substrate according to the present invention is housed in a housing of a control unit.
Figure 11B:
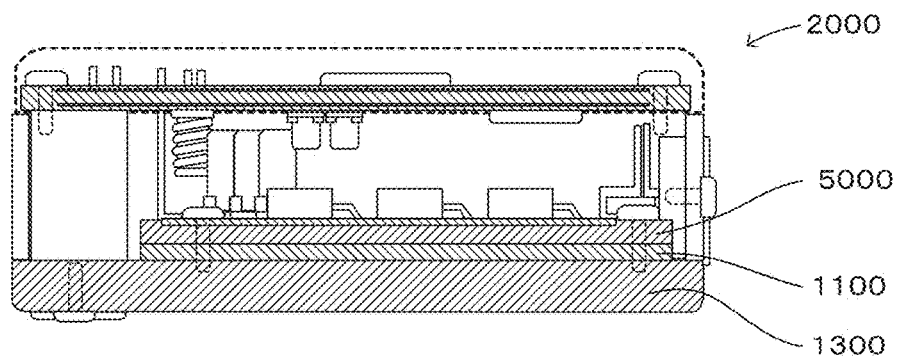
FIG. 11B is a side sectional view illustrating an example where a conventional substrate is housed in the control unit.

Further, FIG. 11A is a side sectional view illustrating that the electronic part mounting heat-dissipating substrate 100(*s*) according to the present invention is housed in a housing of a control unit 1000. FIG. 11B is a side sectional view illustrating an example where a conventional substrate 5000 is housed in a control unit 2000.

In case of the control unit 2000 in which the conventional substrate 5000 illustrated in FIG. 11B, a basic laminated structure is formed in order of:

1. a heat-dissipation surface of electronic parts (FETs or the like),
2. a solder layer,
3. a copper foil pattern layer,
4. an insulating layer,
5. an aluminum base substrate,
6. a TIM layer 1100, and
7. a case of the control unit 1000 and an aluminum die cast 1300 which is used as a radiator, too, from an upper side.

Contrary, in case of the control unit 1000 in which the electronic part mounting heat-dissipating substrate 100(*s*) according to the present invention illustrated in FIG. 11A is housed, the basic laminated structure includes:

1. the heat-dissipation surface of the electronic parts (the FETs or the like),
2. the solder layer,
3. a wiring pattern (copper whose plate thickness is approximately 0.3 [mm]),
4. the TIM layer 110, and
5. a case of the control unit 1000 and the aluminum die cast 1300 which is used as a radiator, too.

Therefore, according to the electronic part mounting heat-dissipating substrate 100(*s*) according to the present invention, it is possible to simultaneously simplify the laminated structure and increase the plate thickness of the lead frames 110 of the wiring pattern shapes formed by using the conductor plates compared to the conventional substrate 5000. It is possible to effectively dissipate the heat from the heat-generating electronic parts EC. In this regard, the substrate 100(*s*) whose lead frames 110 have the same thickness has been used as the electronic part mounting heat-dissipating substrate in the above example. However, the same applies to the substrate 100(*d*) whose lead frames 110 have the different thicknesses, too.

Figure 12A:
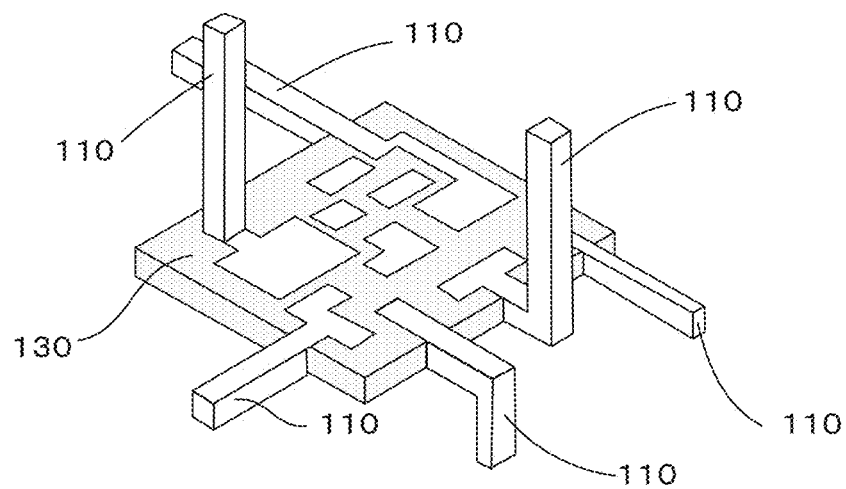
FIG. 12A is a perspective view illustrating an example where part of lead frames of wiring pattern shapes according to the present invention are bent and formed in one arbitrary direction of upper and lower directions with respect to the plate surface at an inner circumferential side or an outer circumferential side of the insulating member.

Further, according to the present invention, as illustrated in, for example, a perspective view in FIG. 12A, part of the lead frames 110 of the wiring pattern shapes formed by the conductor plates can be also bent at an inner circumference side or an outer circumference side of the insulating member and in one arbitrary direction of upper or lower direction with respect to the plate surface of the conductor plate. Hence, when the part of the lead frames 110 are formed in this way, it is possible to easily connect the part of the lead frames 110 with a connection terminal or another substrate existing outside the electronic part mounting heat-dissipating substrate 100(s,d).

Figure 13A:
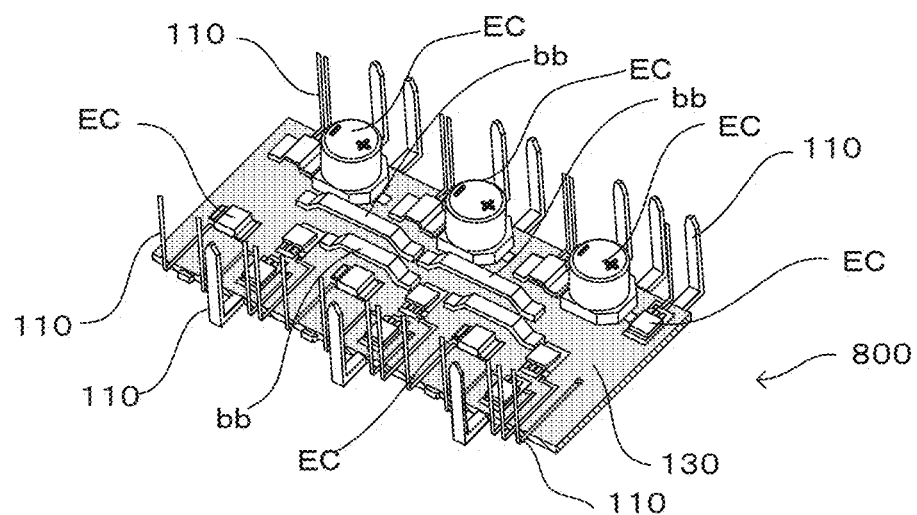
FIG. 13A is a perspective view illustrating an example where the lead frames are bent upward of the part arrangement surface of the substrate.
Figure 13B:
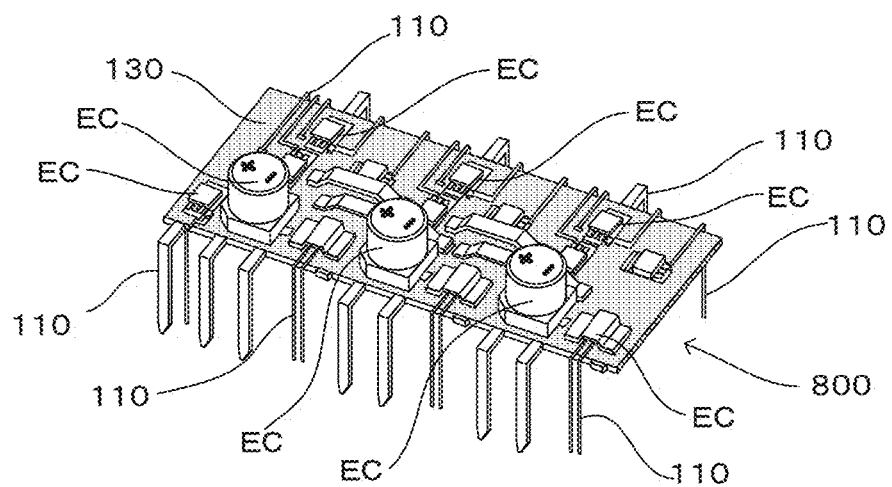
FIG. 13B is a perspective view illustrating an example where the lead frames are folded downward of the part arrangement surface of the substrate.

Furthermore, the present invention is capable of bendably forming all or a part of the lead frames of the wiring pattern shapes formed on the conductor plate at outer side than periphery of the insulating material even after the electronic part mount heat-dissipating substrate is formed in advance without bending of the lead frames. Then, FIG. 13 shows a perspective view of the electronic part mount heat-dissipating substrate 800 with the lead frames formed in such a way. FIG. 13A is a perspective view illustrating an example where the lead frames are bent upward of the part arrangement surface of the substrate, and FIG. 13B is a perspective view illustrating an example where the lead frames are bent downward of the part arrangement surface of the substrate. (As well, the substrate 800 is assumed as a power module of the three-phase control inverter for EPS.)

The present invention has the following effects by making possible to bend the lead frames 110 with the after-processing.

That is, the general module substrate molded by the resin or the like by unifying plural electronic parts to one package body is electrically connected to the other module substrate through the leads. In this time, the lead portions of the module substrate are faced in a direction determined in advance, and it is impossible to change the direction thereafter. Therefore, the degree of freedom for a design and processing is inhibited.

On the other hand, the feature of the embodiment according to the present invention resides in that the lead portion (an outside portion than the periphery of the insulating member of the lead frames 110) is bent in an arbitrary direction by the after-processing.

Consequently, according to the embodiment of the present invention, it is possible to first form the lead portion without bending and to furnish with the electronic part mount heat-dissipating substrate as the common parts. Then, in a case that the electronic part mount heat-dissipating substrate is used by combining the other substrate or is contained in the control unit, it is further possible to bend the lead portion depending on the above specification thereafter. As a result, the combination with various ECUs becomes possible and it is possible to allow the degree of freedom to determine the equipment position of the electronic part mount heat-dissipating substrate.

As well, although a means or a structure to be capable of bending the lead frames 110 is not specifically limited, it is desired not to generate brittle fracture due to the bending of at least plural times.

Figure 12B:
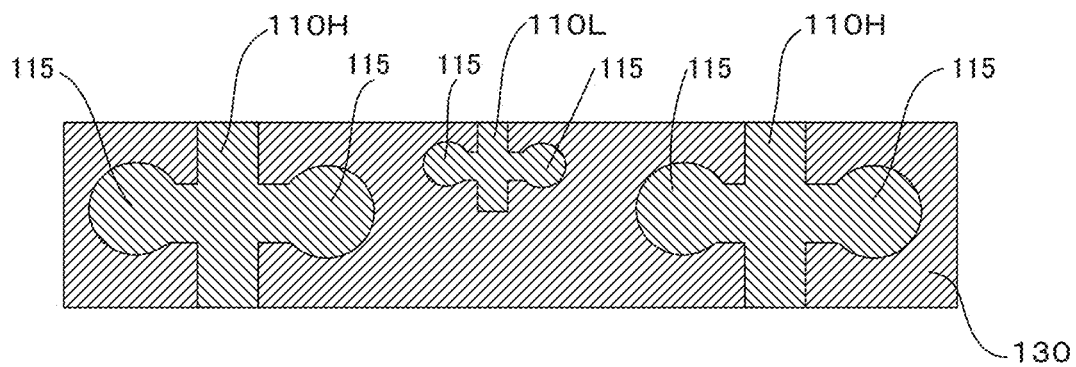
FIGS. 12B and 12C are side sectional views illustrating examples of engagement portions.
Figure 12C:
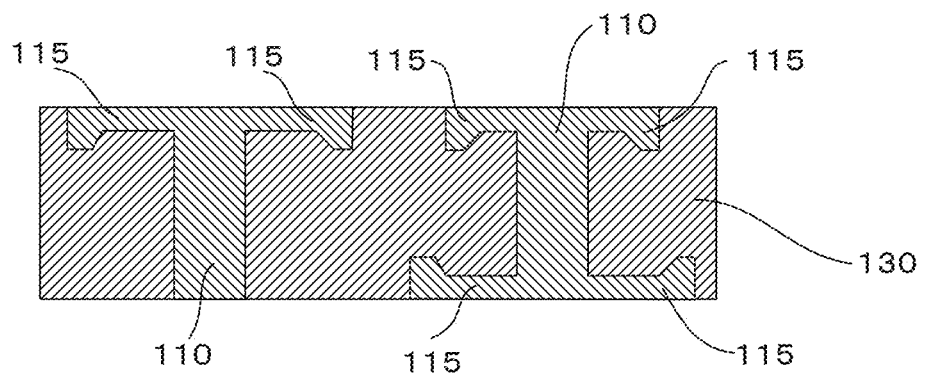

Furthermore, continuing the explanation back to FIG. 12, as illustrated in sectional views in FIGS. 12B and 12C, it is possible to employ a configuration where engagement portions 115 which engage with the insulating members 130 are provided on the side surface of the lead frames 110 of the wiring pattern shapes at the side of the insulating members 130. The engagement portions 115 are formed from the side surface-side of the lead frames 110 to the side of the insulating members 130. At the side of the insulating members 130 of the engagement portions 115, an area seen from the side surface-side of the lead frames 110 is formed larger than an area seen from the side surface-side of the lead frames 110 of the engagement portions 115. Consequently, the engagement portions 115 can reinforce a bond of the bonding portion of the lead frames 110 and the insulating members 130, and it is possible to provide a configuration which prevents a peel from easily occurring due to a difference in a thermal expansion coefficient between the lead frames 110 and the insulating members 130.

Further, assume a case of a configuration where the engagement portions 115 are provided at one or both of the top surface-side and the back surface-side of the lead frames 110 as illustrated in FIG. 12C. In this case, a heat transfer area of the lead frames 110 is further expanded, so that it is possible to further improve the heat dissipation.

Furthermore, as FIG. 14 shows a sectional view, the engagement portions 115 which engage with the insulating members 130 are provided on the side surface of the lead frames 110 of the wiring pattern shapes at the side of the insulating members 130. According to this configuration, it is also possible to form a shape assuming that the lead frames 110 of the wiring pattern shapes are mass-produced by the press-working. In this regard, features of outer shapes of the engagement portions 115 of the lead frames 110 include that all lines are combined, and linear shapes are formed from a tapered shape to a protrusion portion at a center portion over an entire area of a side surface rim portion. Consequently, it is possible to increase the surface areas of the lead frames 110 of the wiring pattern shapes. Further, it is possible to provide an effect of expanding the heat transfer and the heat-dissipation surfaces, increasing an engagement area which engages with the insulating members 130, too, and strengthening the coupling. Thus, it is possible to further improve a coupling strength and the heat dissipation.

Figure 14A:
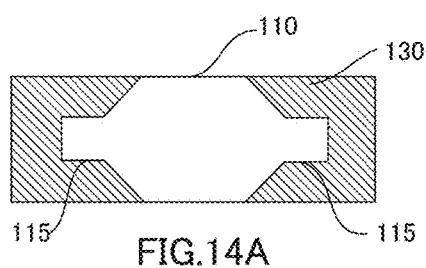
FIG. 14A is a sectional view illustrating an example where the engagement portions of protrusion portions formed by lines at center portions of both side surface rims of the lead frame.
Figure 14B:
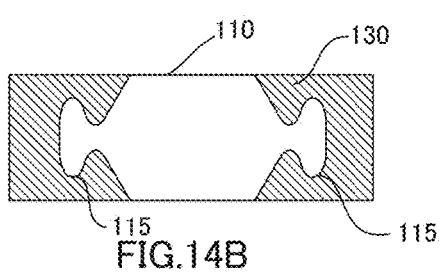
FIGS. 14B to 14H are sectional views illustrating other examples of the engagement portions.
Figure 14C:
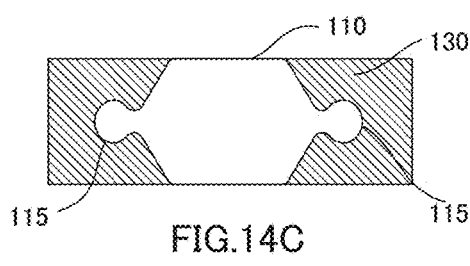
Figure 14D:
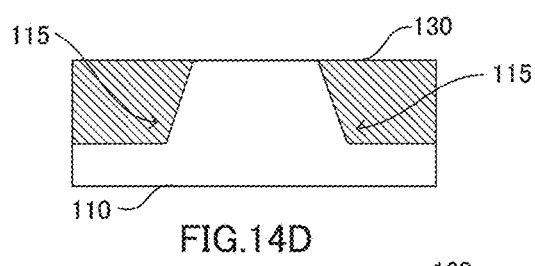
Figure 14E:
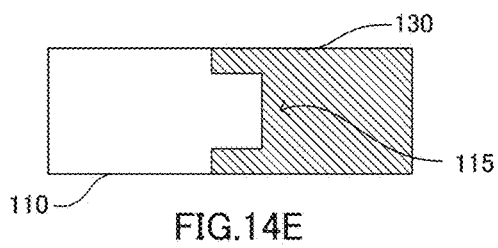
Figure 14F:
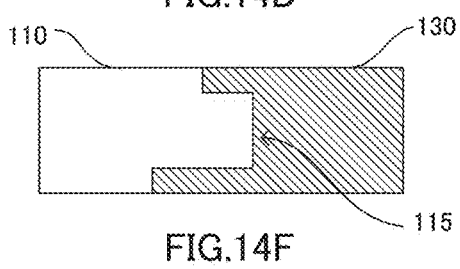
Figure 14G:
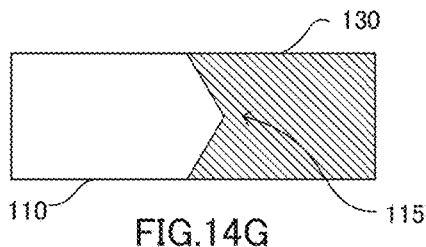
Figure 14H:
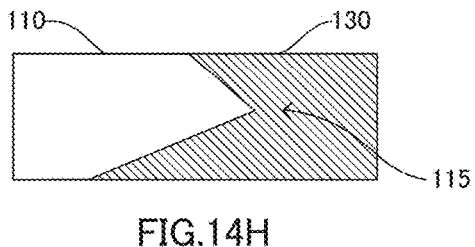
Figure 14I:
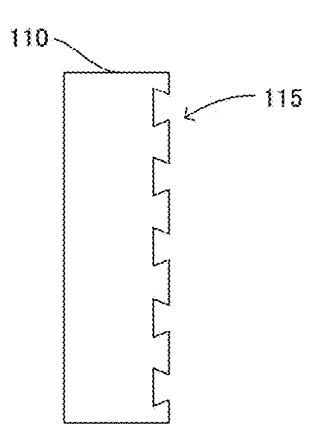
FIG. 14I is a top view illustrating another example of the engagement portion.

Further, it is also possible to adopt forms of the engagement portions 115 illustrated in FIGS. 14B to 14I and subsequent drawings. In this regard, FIGS. 14B to 14D are sectional views illustrating the engagement portions 115 of the lead frames from the side surfaces at both plate surfaces of the lead frames. FIGS. 14E to 13H are sectional views illustrating the side surface of the single plate surface of the lead frames. FIG. 14I is a top view illustrating the side surface-side of the plate surface of the lead frame.

In examples shown in FIGS. 14B and 14C, the top surface-side and the back surface-side of the side surfaces of the lead frames to the center portion-side of the side surfaces are formed as inclined surfaces formed protruding toward the insulating members, the inclined surfaces have triangular cross sections, and engagement shapes whose cross sections are circular shapes or elliptical shapes are smoothly formed from the inclined surfaces at the coupling portions of the inclined surfaces. That is, FIG. 14B illustrates the example of a configuration where the engagement portions 115 which engage with the insulating members 130 are provided on the side surface of the lead frames 110 of the wiring pattern shapes at the side of the insulating members 130. It is also possible to form a shape assuming that the lead frames 110 of the wiring pattern shapes are mass-produced by the press-working. Further, features of the outer shapes of the engagement portions of the lead frames 110 include that the outer shapes are sponge-gourd (loofah) shapes and are formed by combining plural curves. The features further include that curved surface shapes of the sponge-gourd shapes in the entire side surface rim portion allow the insulating members 130 to smoothly spread to the surrounding of the engagement portions 115 to strengthen the coupling of the insulating members 130 and the engagement portions. Further, FIG. 14C illustrates an example where features of the outer shape of the engagement portions of the lead frame 110 include that the outer shape is a tumbling-doll shape and is formed by combining plural curves. Similar to the above case, the features further include that a curved surface shape of the tumbling-doll shape in the entire side surface rim portion allows the insulating members 130 to smoothly spread to the surrounding of the engagement portions 115 to strengthen the coupling of the insulating members 130 and the engagement portions.

Accordingly, in the examples illustrated in FIGS. 14B and 14C, it is possible to increase the surface areas of the lead frames 110 of the wiring pattern shapes by adopting the sponge-gourd shapes and the tumbling-doll shapes. Consequently, it is possible to expand the transfer and the heat dissipation areas, and an increase in the engagement area which engages with the insulating members 130 and dents at the center portions of the sponge-gourd shapes strengthen the coupling of the lead frames 110 and the insulating members 130.

Further, FIG. 14D illustrates an example where each engagement portion is formed by an inclined surface formed from one plate surface of the lead frame to the other plate surface, and an engagement piece (a protrusion portion formed as a stepwise step) formed in parallel to the other plate surface. In other words, similar to the above examples, this example adopts a shape assuming that the lead frames 110 of the wiring pattern shapes are mass-produced by the press-working. Features of the outer shapes of the engagement portions of the lead frames include that the outer shapes are formed by combining all lines. A protrusion portion composed of stepwise steps extended from a nearly center of the side surface rim portion is formed in a linear shape.

Further, FIGS. 14E and 14F illustrate examples where the engagement portions are formed by providing steps at the top surface-side and the back surface-side of the side surfaces of the lead frames and between the lead frames and the insulating members. Depths of the steps of the engagement portions (i.e., lengths formed by extending the insulating members from the side surface portions of the lead frames to the center direction of the plate surfaces of the lead frames by shapes of the steps) may differ between the top surface-side and the back surface-side of the side surfaces of the lead frames. For example, as illustrated in FIG. 14F, the depths of the steps of the engagement portions may be formed larger at the back surface-side of the side surfaces of the lead frames.

Further, FIGS. 14G and 14H illustrate examples where the engagement portions are formed by inclined surfaces formed protruding toward the side of the insulating members from the top surface-side and the back surface-side of the side surfaces of the lead frames to a center portion-side of the side surfaces. FIG. 14G illustrates that across section of the inclined surface is a triangular shape. FIG. 14H illustrates that base point portions from the top surface-side and the back surface-side of the inclined surface are shifted from positions on a vertical line of the plate surface of the lead frame between the top surface-side and the back surface-side.

As described above, the engagement portions illustrated in FIGS. 14A to 14H are easily molded by the press-working, and can increase the engagement area and increase the heat dissipation and the mechanical coupling strength. The tumbling-doll shape, the sponge-gourd shape and the stepwise steps are formed on a boundary surface between the lead frames and the insulating members. Consequently, it is possible to provide an effect of suppressing moisture from entering due to dew condensation on the substrate.

Further, FIG. 14I illustrates an example where the engagement portion is formed by forming recess portions in the side surface of the lead frame and along the plate surface of the lead frame. FIG. 14I illustrates the example where each recess portion is formed wider at a depth side (i.e., a center direction of the plate surface of the lead frame) than an open end-side of the recess portion. Hence, when the engagement portion is formed in a so-called key hole shape, the engagement portion is formed along the side surface of the plate surface when the plate surface of the lead frame is seen from an upper surface. Consequently, it is possible to easily perform molding by the press-working, and increase the engagement area as described above, and increase the heat dissipation and the mechanical coupling strength.

As well, the above engagement portions are exemplary engagement portions. By optionally changing parameters (e.g. step depths) of the above-described engagement portions, it is possible to perform adjustment according to a characteristic of a circuit composed of the lead frames.

Figure 14J:
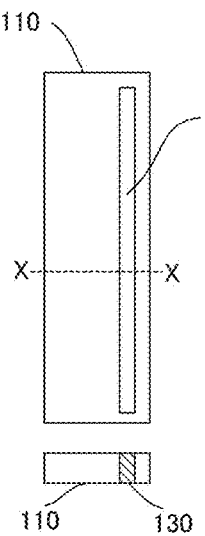
FIGS. 14J and 14K are top views illustrating examples where a resin sealing shape is provided closer to an inner side from a side surface of the lead frame.
Figure 14K:
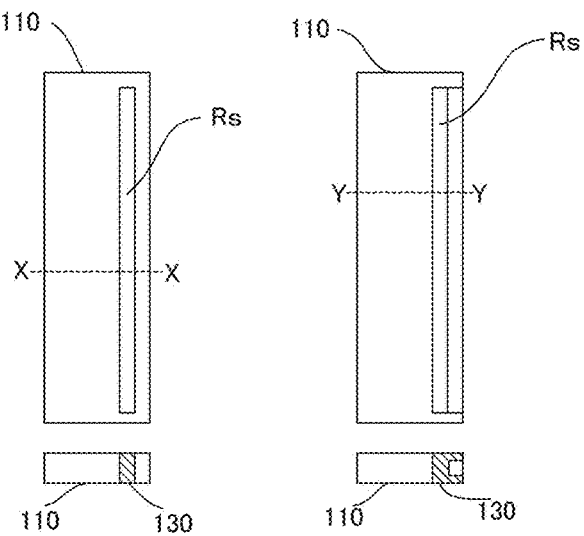

Further, according to the present invention, as illustrated in FIGS. 14J and 14K, it is also possible to provide a resin sealing shape Rs which is formed closer to an inner side from the side surface of the plate surface of the lead frame and penetrates the top surface and the back surface of the lead frame. In this regard, a top view in FIG. 14J is a top view of the plate surface of the lead frame. A bottom view of FIG. 14J is a sectional view of an X-X line portion of the top view. A top view in FIG. 14K is a top view of the plate surface of the lead frame. A bottom view of FIG. 14K is a sectional view of a Y-Y line portion of the top view. The resin sealing shape Rs is a hole formed to penetrate the top surface and the back surface of the lead frame as described above. The resin sealing shape R may have a rectangular shape or a circular shape as illustrated in FIGS. 14J and 14K, and the size and the shape of the resin sealing shape Rs are not limited in particular. According to the present invention, by providing the resin sealing shape Rs, it is possible to improve the bonding strength of the lead frames and a resin for making the insulating member. However, combining the recess portions and the engagement portions formed in the lead frames according to the present invention in particular enables more effective use. That is, FIG. 14K illustrates the example where the resin sealing shape Rs is formed inside the stepwise engagement portion illustrated in the examples in FIGS. 14E and 14F. However, by using the above configuration in combination, it is possible to more effectively improve the mechanical coupling strength of the lead frames and the insulating members.

Figure 15:
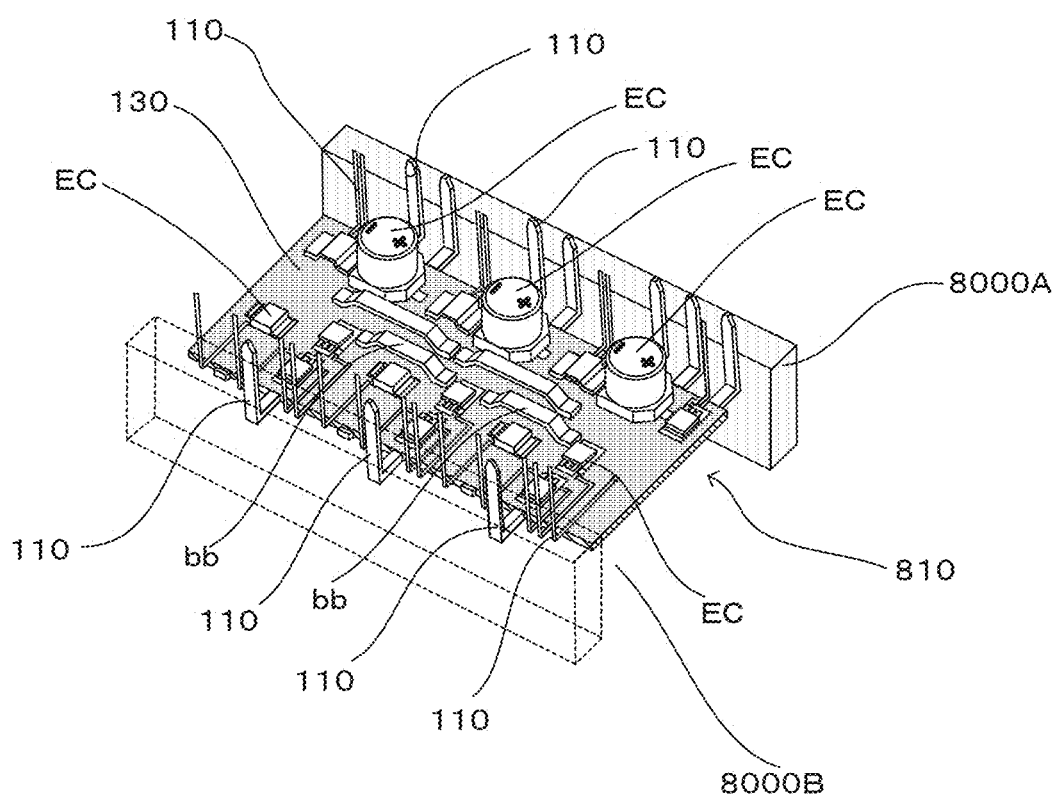
FIG. 15 is a perspective view showing an example that a thermal conductor is contact with the lead frame of the electronic part mounting heat-dissipating substrate according to the present invention outside of the circumference of the insulating material.

Furthermore, it is also possible to adopt the structure to enhance the heat dissipation from the electric part mount heat-dissipating substrate through the lead frames 110 as shown in FIG. 15. Here, FIG. 15 is a perspective view showing an example that thermal conductors 8000 are contact with the lead frames 110 of the electronic part mounting heat-dissipating substrate 810 according to the present invention at an outer side than the periphery of the insulating material 130. In FIG. 15, thermal conductors 8000A and 8000B are provided along the two lines forming the lead frames 110, the thermal conductor 8000B is indicated by dot-line (so as to clear different from the relation with the substrate 810). Then, since the lead frames 110 are connected to anther substrates or the like at the ends, the thermal conductors 8000 is the configuration to contact with the lead frames 110 and not to contact with the lead frames 110 at the ends.

Still further, although the thermal conductors 8000 are capable of using optional thermal conductive materials, it is basically necessary to form so as to secure the electric insulation for at least the contact portions of the lead frames 110 in order to secure the insulation for the lead frames 110. Thus, it is necessary to use thermal conductive materials (TIM) having the insulation on the surface of the thermal conductor even in a case that the whole thermal conductor is made by the insulating member or the whole thermal conductor is made by the conductor. However, the above constitution is not limited to this, it is good if the insulation characteristic between the thermal conductors 8000 and the contacted lead frames 110 is secured. Therefore, it may be materials to secure the thermal conductivity and the insulation by a means to perform the insulating coating on the lead frames 110 to be contact with the thermal conductors 8000.

In the above embodiment shown in FIG. 15, a heat generated from the electronic parts EC is transmitted as the following. That is, the electronic parts EC are mounted on the lead frames 110 on the part arrangement surface of the electronic part mounting heat-dissipating substrate 810. Thus, as shown in FIG. 15, it is possible to conduct the heat generated from the electronic parts EC into outside via the thermal conductors 8000 by adopting the constitution that all or apart of the lead frames 110 of the wiring pattern shapes formed on the conductor plate are contact with the thermal conductors 8000 at the outer side than the periphery of the insulating members 130.

As well, the constitution that the lead frames 110 are contact with the thermal conductors 8000, is not specifically limited. However, as shown in FIG. 15, since the heating surface area becomes large in a case that the thermal conductors 8000 are contact with lead frames 110 along a plate surface forming the lines thereof, it is possible to effectively perform the heat conduction.

Although the two thermal conductors (8000A and 8000B) are provided so as to vertically face to two side surfaces of the periphery of the substrate 810 in the embodiment shown in FIG. 15, it is possible to configure by stretching the lead frames 110 to four side-surfaces of the periphery of the substrate 810 and providing the thermal conductors 8000 on the four side-surfaces.

Similarly, although the lead frames are bent upward in the embodiment shown in FIG. 15, the bending direction is voluntary. It is possible to perform the heat conduction regardless of the bending direction by being contact the thermal conductors 8000 with the lead frames 110. In a case that a consideration such as a housing containing the substrate, a combination with other substrate and so on is needed, it is also possible to configure being contact the thermal conductors 8000 with portions of the lead frames 110.

Further, according to the present invention, plural heat-generating electronic part groups having a functional unity are disposed such that a maximum distance is secured between plural heat-generating electronic part groups on the electronic part mounting heat-dissipating substrate according to the present invention, and lengths of current paths from entries of the heat-generating electronic part groups to exits of the heat-generating electronic part groups are substantially identical. Consequently, it is possible to improve the heat dissipation by providing the heat-generating electronic part groups in a distributed arrangement, and make the wiring paths including a motor or the like in the current paths substantially identical. Consequently, it is possible to easily match impedance characteristics, suppress occurrence of ripples and realize a smooth steering feeling for use in the electric power steering apparatus.

Figure 16:
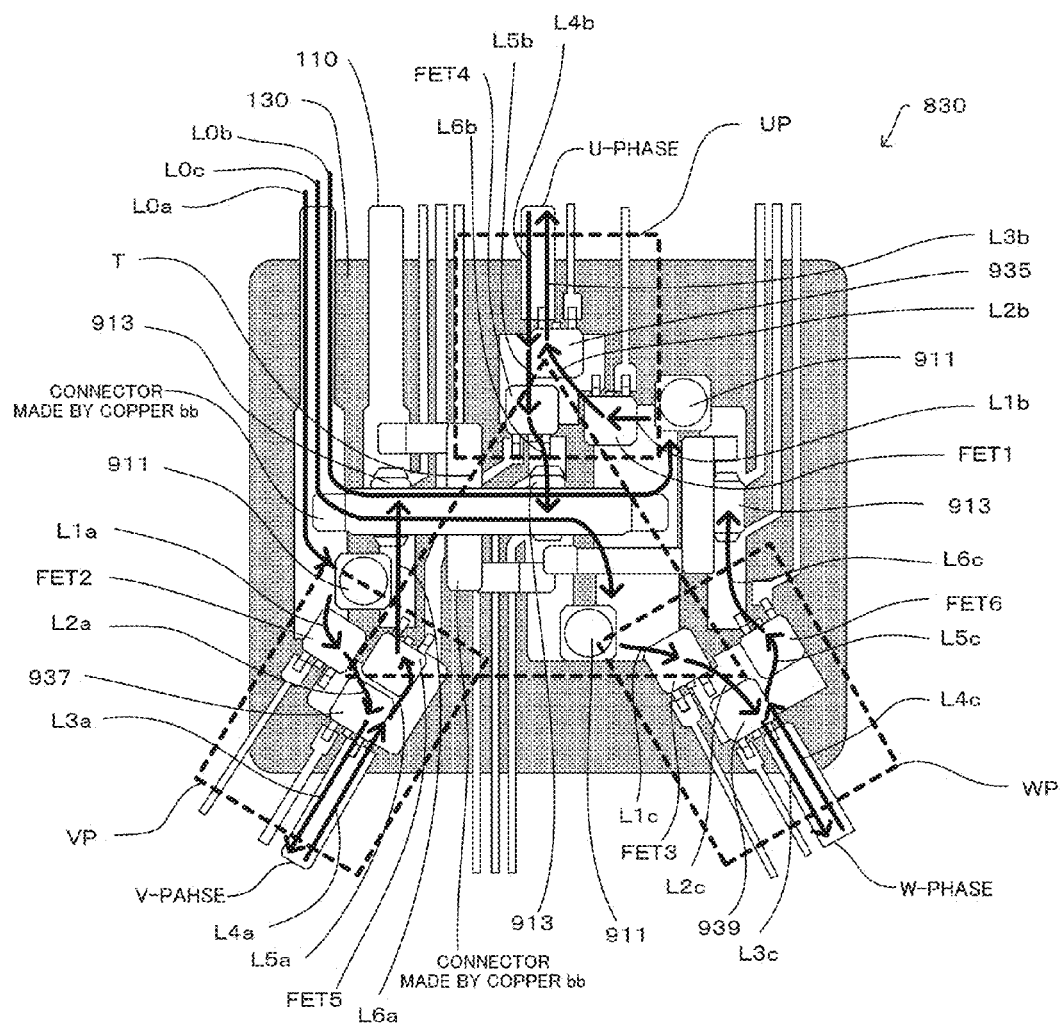
FIG. 16 is a top view illustrating an example where heat-generating electronic part groups for respective phases of the three-phase motor on the electronic part mount heat-dissipating substrate according to the present invention on the three-points of an equilateral triangle shape.

That is, this will be described with reference to FIG. 16. FIG. 16 is a top view illustrating an example where the heat-generating electronic part groups of respective phases of the three-phase motor are distributed-arranged on the vertices of the equilateral triangle on the electronic part mounting heat-dissipating substrate 830 formed in almost rectangular shape and output ends of the respective phases are arranged toward a direction from a centroid of the equilateral triangle to the vertices.

Then, lines L0a, L0b and L0c indicated by bold arrows in FIG. 16 indicate current paths (L0a for a V-phase, L0b for a U-phase and L0c for a W-phase) from the power supply to an electrolytic capacitor 911 at front of each phase. A line connected to extend from L1b indicated by a bold arrow to L3b via L2b indicates a current path of the U-phase. Similarly, a line connected to extend from L1a indicated by a bold arrow to L3a via L2a indicates a current path of the V-phase, and a line connected to extend from L1c indicated by the bold arrow to L3c via L2c indicates a current path of the W-phase.

Further, in FIG. 16, a line connected so as to extend to L6b from L4b indicated by an arrow of a heavy line via L5b, indicates a current path to a ground side from the U-phase of the three-phase motor. Similarly, a line connected so as to extend to L6a from L4a indicated by an arrow of a heavy line via L5a, indicates a current path to a ground side from the V-phase of the three-phase motor, and a line connected so as to extend to L6c from L4c indicated by an arrow of a heavy line via L5c, indicates a current path to a ground side from the W-phase of the three-phase motor.

Further, among areas indicated by square frames indicated by chain lines illustrated in FIG. 14, "UP" is an area which drives the U-phase of the inverter circuit of the three-phase motor (three-phase brushless motor and so on) composed of the U-phase, the V-phase and the W-phase. Similarly, "VP" indicates an area which drives the V-phase and "WP" indicates an area which drives the W-phase. The triangle indicated by chain lines in FIG. 16 shows an outline of the equilateral triangle T being capable of virtually forming within the substrate as that roughly center portion of the electronic part mount heat-dissipating substrate 830 is a centroid.

Here, similar to the part group which composes the inverter circuit of each phase of the three-phase motor composed of the U-phase, the V-phase and the W-phase, an electronic part aggregation (the heat-generating electronic part groups) having a single functional unity and composed of plural electronic parts including heat-generating electronic parts such as the FETs is distributed-arranged by securing the maximum distances each other on the substrate as the areas of neighborhood of the vertices of the equilateral triangle as shown in FIG. 16 for each of the heat-generating electronic part groups (here, three (plural) part groups of U, V and W). Consequently, it is possible to disperse the heat generation portions on the substrate and efficiently transfer the heat to the substrate.

With this arrangement, by arranging so that lengths of current paths from entrance to an exit of the heat-generating electronic part groups are almost identical, it is possible to easily make the impedance characteristics of the current path from the inverter circuit to the three-phase motor to mutually coincide. In this way, it is possible to improve the ripple accuracy of the torque and the rotational speed of the three-phase motor.

Figure 17:
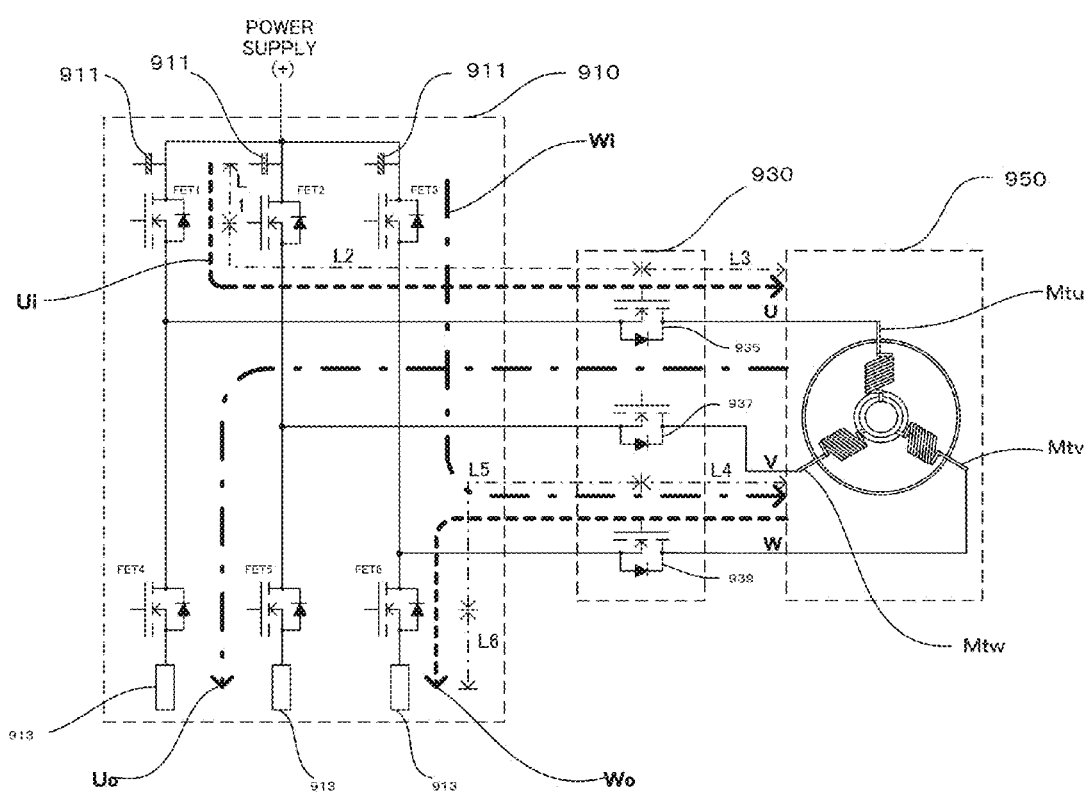
FIG. 17 is a circuit diagram schematically illustrating an inverter circuit of a three-phase brushless motor and each phase current path.

In more detail, as illustrated in FIG. 17, for example, for example, an inverter circuit 910 used for the three-phase motor is connected to a motor 950 via a motor relay section 930.

As well, FIG. 17 is a view illustrating the inverter circuit of the three-phase electric motor (the three-phase brushless motor and so on) and the current path of each phase. The line continuing from L1 indicated by the chain line in FIG. 17 to L3 via L2 indicates a current path (the U-phase, herein) Ui at an input side of the electric motor 950 similar to the case in FIG. 16. "Wi" indicated by a dashed-dotted line indicates a current path at an input side of the W-phase.

Further, in FIG. 17, a current path (the U-phase, herein) Uo from each phase of the electric motor 950 to a ground side indicates a line continuing from L4 to L6 via L5. "Wo" indicates the current path from the W-phase to the ground side likewise.

Further, the inverter circuit 910 is a circuit which configures a motor driving unit receives an input of a gate drive signal obtained based on a current command value by a gate driving unit which is not illustrated, and drives the motor.

The inverter circuit 910 is composed of a three-phase bridge including upper and lower arms composed of an upper FET 1 and a lower FET 4 of the-U phase, upper and lower arms composed of an upper FET 2 and a lower FET 5 of the V-phase, and upper and lower arms composed of an upper FET 3 and a lower FET 6 of the W-phase. Each phase is connected via the electrolytic capacitor 911 from the power supply-side, and each phase is connected with the ground side via a shunt resistor 913. Further, an output of each phase of the upper and lower arms is connected to input terminals (U, V and W) of each phase of the electric motor 950 via the FETs of each phase (935 of the U-phase, 937 of the V-phase and 939 of the W-phase) of each phase which composes the motor relay section 930.

The inverter circuit 910, the motor relay section 930 and the motor 950 connected in this way are configured to have substantially equal path lengths of the current paths of the U-phase, the V-phase and the W-phase in the present invention.

That is, as illustrated in FIGS. 16 and 17, for example, the current path of the U-phase includes the path (L1$b$) from the electrolytic capacitor 911 to the FET 1, the path (L2$b$) from the FET 1 to an FET 935 of the motor relay, and (L1$b$+L2$b$+L3$b$) from the FET 935 of the motor relay to the U-phase input terminal U of the motor 950. Similarly, the current path of the V-phase is (L1$a$+L2$a$+L3$a$), and the current path of the W-phase is (L1$c$+L2$c$+L3$c$). Further, the path lengths of the current paths of the respective phases are configured to be substantially equal.

Furthermore, as illustrated in FIG. 16 and FIG. 17, the current paths toward the ground side are configured such that current path lengths of the distance (L4: L4$a$, L4$b$, L4$c$ for each phase) from the motor 950 to a device of the motor relay section 930, the distance (L5: L5$a$, L5$b$, L5$c$ for each phase) from the device of the motor relay section 930 to the lower FET of the inverter circuit 910, and the distance (L6: L6$a$, L6$b$, L6$c$ for each phase) from the lower FET of the inverter circuit 910 to the shunt resistor 913 are substantially equal similar to the current side.

In this regard, it is possible to optionally adjust the path lengths of the current paths by improving the layout of the part arrangement and the shape of the lead frames.

Further, according to the present invention, the path lengths of the current paths of the respective phases are configured to be substantially equal between the respective phases. Consequently, it is possible to easily match the impedance characteristics from the inverter circuit 910 to the motor 950. Thus, it is possible to improve the ripple precision such as the torque and the rotational speed of the motor 950.

Further, the distributed arrangement is provided and the current path lengths are adjusted to be substantially identical between the respective phases, and, in addition, output lines from the respective phases are in parallel disposed on the extending direction from the centroid of the equilateral triangle to the respective vertices of the equilateral triangle or on the direction parallel to the rim of the substrate. Consequently, it is possible to prevent an interference between outputs of the respective phases and to control the motor of improved precision and stability.

Thus, according to the constitution of the present invention, since the heat-generating electronic part group including the power device such as FET are distributed-arranged on the electronic part mount heat-dissipating substrate, it is possible to further improve the driving performance of the motor as well as the heat dissipation due to the synergy effect of the distributed-arrangement and the electronic part mount heat-dissipating substrate.

As well, although the electronic part groups configuring the inverter circuits for respective phases of the three-phase motor of U-phase, V-phase and W-phase are described in the above embodiment, they are not limited. Assuming the electronic part-aggregate comprising plural electronic parts having a functional unity and including the heat-generating parts such as FET, it is possible to achieve the similar effects by distributed-arrange the electronic part-aggregate on the electronic part mount heat-dissipating substrate.

Further, the form of the distributed-arrangement can be adopt various forms in accordance with the form (rectangular shape, polygonal shape and so on) of the electronic part mount heat-dissipating substrate and number of the heat-generating electronic part groups if the heat-generating electronic part groups be able to be mounted with the maximum distance space on the substrate by the distributed-arrangement. It is also possible to distributed-arrange plural heat-generating electronic part groups having the functional unity on not only the upper-side surface (top surface-side) of the electronic part mount heat-dissipating substrate but also on the lower-side surface (back surface-side).

Figure 18:
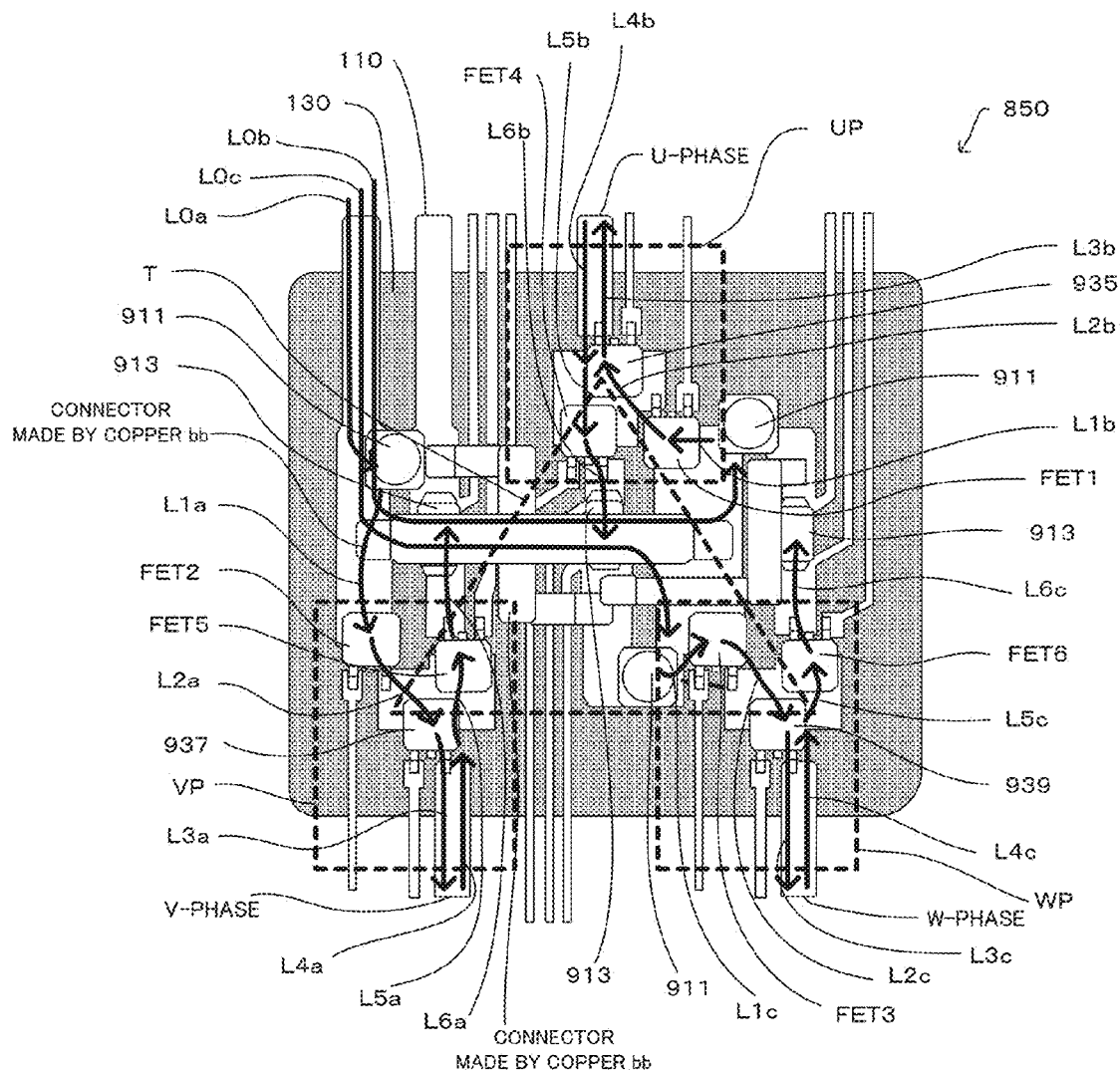
FIG. 18 is a top view illustrating another example for FIG. 16 where heat-generating electronic part groups for respective phases of the three-phase motor on the electronic part mount heat-dissipating substrate according to the present invention on the three-points of an equilateral triangle shape.

Then, as shown in FIG. 18 and FIG. 19, it is necessary to distributed-arrange so that the heat-generating electronic part groups distributed-arranged on the back surface-side of the electronic part mount heat-dissipating substrate are not symmetrical to the heat-generating electronic part groups distributed-arranged on the surface-side with respect to the upper side and the lower side of the substrate. In other words, by preventing the mutual overlapping of the distributed-arranged electronic part groups through the plate surface of the substrate, it is possible to improve the distribution of the heating area and the thermal conductivity. (As well, FIG. 18 shows in similar to FIG. 16 the constitution that the heat-generating electronic part groups of respective phases of the three-phase motor are distributed-arranged on the respective vertices of the equilateral triangle of the present invention, and indicates an example with a top view that the output ends of the three-phases are faced from the part groups to the side surface of the substrate in parallel direction.)

Figures 19A, 19B:
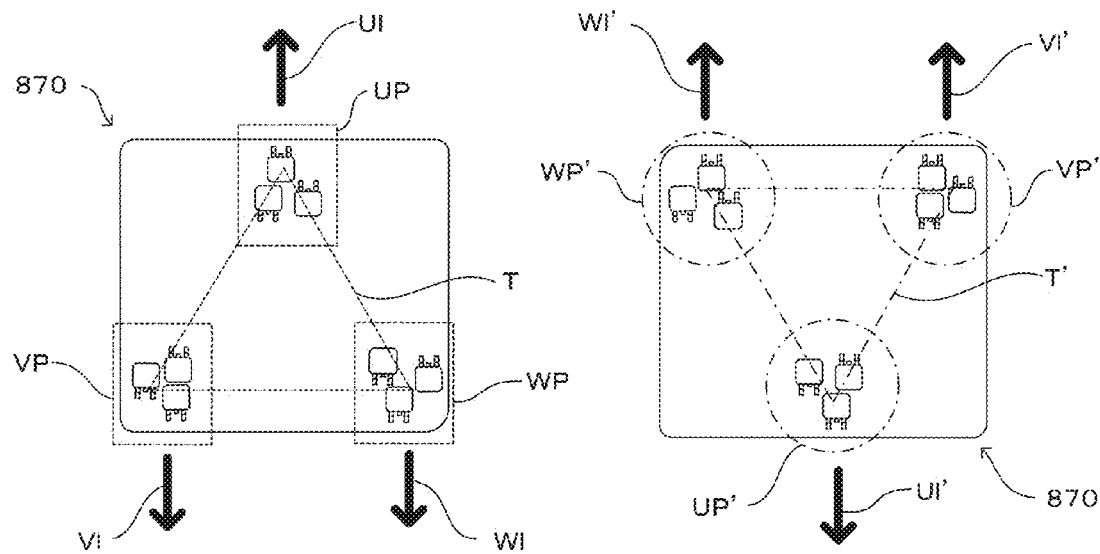
FIG. 19A is a top view illustrating an example where plural heat-generating electronic part groups (UP, VP, WP) on the top surface of the electronic part mount heat-dissipating substrate.
FIG. 19B is a top view illustrating an example where plural heat-generating electronic part groups (UP', VP', WP') on the top surface of the electronic part mount heat-dissipating substrate.

That is, the present invention can select the constitution to distributed-arrange the plural heat-generating electronic part groups on the plate surface of the top surface of the electronic part mount heat-dissipating substrate as shown in FIG. 18 or FIG. 19A. According to the electronic part mount heat-dissipating substrate of the present invention, it is possible to mount the electronic parts including the heat-generating electronic part groups on not only the upper-side surface but also on the lower-side surface.

Accordingly, according to the present invention, as shown in FIG. 19A, the heat-generating electronic parts are provided in the distributed arrangement at the top surface-side of the electronic part mounting heat-dissipating substrate, and then as illustrated in FIG. 19B, the heat-generating electronic parts may be provided in the distributed arrangement at the back surface-side the of the electronic part mounting heat-dissipating substrate.

This will be further described in detail. FIGS. 19A and 19B are concept views illustrating a difference in an arrangement of the heat-generating electronic part groups between the top surface-side and the back surface-side of the substrate 870 by using the electronic part mounting heat-dissipating substrate 870 according to the present invention as an example. FIG. 19A illustrates that plural heat-generating electronic part groups (UP, VP and WP) illustrated in FIG. 18 are provided in the distributed arrangement on the plate surface at the top surface-side of the substrate 870. Similarly, FIG. 19B illustrates that plural heat-generating electronic part groups (UP', VP' and WP') is provided in the distributed arrangement on the plate surface at the back surface-side of the substrate 870.

In this regard, FIG. 19A illustrates an example where, as described above, the inverter circuit portion of the electric motor which is three-phase driven as illustrated in FIG. 18 is sorted to the three-heat-generating electronic part groups (UP, VP and WP) composing the U-phase, the V-phase and the W-phase as components of the inverter circuit, and is provided in the distributed arrangement on the surface of the substrate 870, at the neighborhood of respective vertices of the virtual equilateral triangle T so as to position the centroid of the triangle at almost center portion of the substrate. In this regard, FIGS. 19A and 19B do not illustrate the circuit pattern formed on the electronic part mounting heat-dissipating substrate 870, the electronic parts to be mounted, and terminals formed from the substrate to the outside, and illustrates a simplified configuration of the plural heat-generating electronic part groups.

Further, FIG. 19B illustrates that the heat-generating electronic part groups are provided in the distributed arrangement at the vertices of the virtual equilateral triangle T' on the back surface of the substrate 870. According to this disposing method, when the position corresponding to the equilateral triangle T virtually formed on the upper surface-side is seen from the top sur face of the substrate in a transparent state, a position of the equilateral triangle T' is shifted to a position of which axial is rotated 60° for the center of the virtual equilateral triangle. (Here, the centroid of the virtual equilateral triangle T and the same of the equilateral triangle T' are symmetrical for the plate surface.)

That is, when the upper surface of the electronic part mounting heat-dissipating substrate 870 is seen in a transparent state, the respective vertices of the equilateral triangle T' virtually configured on the back surface, are arranged on the extended lines of the neutral points of respective sides which constitute the virtual equilateral triangle T from the centroid of the virtual equilateral triangle T of the upper surface-side of the substrate 870.

Hence, according to the present invention, when the heat-generating part groups are provided in the distributed arrangement at the top surface-side and the back surface-side of the substrate 870, the heat-generating electronic part groups (UP', VP' and WP') disposed at the back surface-side are not disposed at a direct back of the plate surface of the heat-generating electronic part groups (UP, VP and WP) disposed at the top surface-side. Accordingly, the heat-generating electronic part groups are formed in the distributed arrangement on the top surface and the back surface of the substrate 870.

Consequently, by providing the heat-generating electronic part groups in the distributed arrangement, it is possible to prevent the concentration of heat sources on the top surface and the back surface of the substrate on the electronic part mounting heat-dissipating substrate according to the present invention, and quickly transfer and dissipation of the generated heat.

Figure 20A:
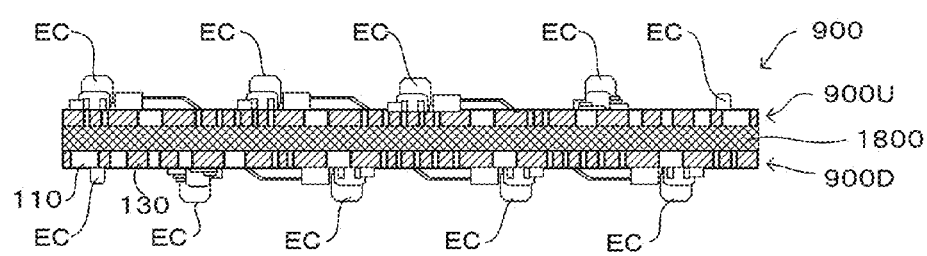
FIGS. 20A and 20B are side sectional views illustrating an example where the two electronic part mounting heat-dissipating substrates according to the present invention are composed as one electronic part mounting heat-dissipating substrate by using an insertion sheet, and the electronic parts EC are mounted on both surfaces of the electronic part mounting heat-dissipating substrate.
Figure 20B:
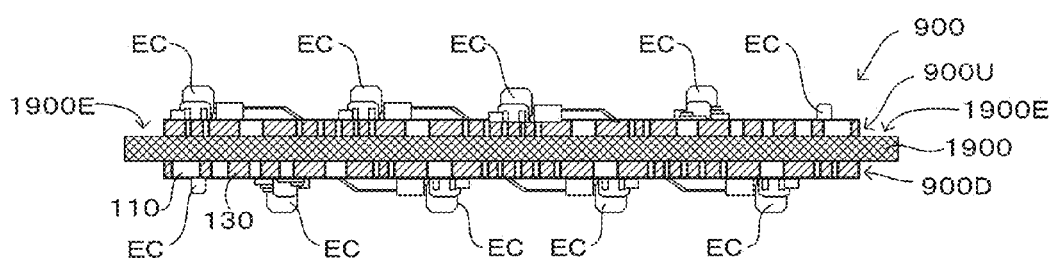

Further, assume a case where the electronic parts are mounted not only at the upper surface-side (the top surface-side) but also at the lower surface-side (the back surface-side) of the electronic part mounting heat-dissipating substrate according to the present invention as described above. In this case, as illustrated in FIGS. 20A and 20B, an insertion sheet (1800 or 1900) is provided between two electronic part mounting heat-dissipating substrates (900U and 900D) as one substrate 900. An upper surface of one substrate (900U) of the substrate 900 sandwiching the insertion sheet (1800 or 1900) is used as the upper surface-side (the top surface-side) of the substrate 900. A lower surface of the other substrate (900D) can also be used as the lower surface-side (the back surface-side) of the substrate 900.

Here, FIGS. 20A and 20B illustrate an example where the two electronic part mounting heat-dissipating substrates (900U and 900D) are formed as one electronic part mounting heat-dissipating substrate 900 by using the insertion sheets (1800 and 1900) configured as described above, and the electronic parts EC are mounted on the both surfaces. FIG. 20A illustrates an example where the insertion sheet 1800 is formed in the same form as that on a plane of the plate surface of the substrate 900. FIG. 20B illustrates an example where a periphery portion of the insertion sheet 1900 is enlarged compared to the form on the plane of the plate surface of the substrate 900, and is formed.

The insertion sheet has a function of simultaneously bonding the two electronic part mounting heat-dissipating substrates according to the present invention as illustrated in FIGS. 20A and 20B, and electrically insulating the two substrates. Hence, a material of the insertion sheet is desirably a material which has adhesiveness which allows the two substrates to be retained, and has an insulation property. In this regard, the insertion sheet is not necessarily limited to a sheet composed of a single layer. The insertion sheet may exhibit the function by forming a multilayer structure including an insulating layer having the adhesiveness.

Further, the insertion sheet can be formed by selecting one or both of a material of a high heat conductivity and a material of a low heat conductivity (a heat insulating material) when necessary.

Therefore, assume a case where the heat needs to be actively exchanged between the electronic part mounting heat-dissipating substrate forming the top surface-side and the electronic part mounting heat-dissipating substrate forming the back surface-side by taking into account the heat generation amounts of the electronic parts mounted on the substrate and the heat environment. In this case, for example, the insertion sheet can be formed by using a material which is formed by kneading a heat filler in an insulating resin, and has the high heat conductivity.

Further, meanwhile, assume a case where, when a backup circuit described below is mounted, it is not desirable to transfer the heat generated by the substrate of one surface to the substrate of the other surface between the top and back surfaces of the electronic part mounting heat-dissipating substrate. In this case, it is possible to use the material of the low heat conductivity (the heat insulating material) for the insertion sheet. By using such a configuration, it is also possible to prevent an influence of the heat generation caused by driving a normal circuit and the like mounted at the top surface-side from deteriorating the backup circuit mounted at the back surface-side in an example described below.

Further, assume a case where the insertion sheet 1900 is formed by using a material of the high heat conductivity, and a periphery portion is enlarged and is formed compared to a form on the plane of the plate surfaces of the substrate 900 at the top surface-side and the back surface-side as illustrated in FIG. 20B. In this case, by taking advantage of a periphery portion 1900E of the insertion sheet 1900, it is possible to dissipate the heat transferred from the substrate 900.

Hence, it is also possible to use the periphery portion 1900E for fixing the substrate 900, and connect the periphery portion 1900E to a heat sink to use for the heat dissipation. Further, the heat-generating electronic part groups (UP', VP' and WP') provided in the distributed arrangement at the back surface-side may be included in plural electronic parts EC composing one or plural circuits. Components formed as part of circuits composing a redundant system of the three-phase electric motor (the three-phase brushless motor) and the backup circuit can be also used. Hence, by adopting the circuit of the redundant system, it is possible to improve the reliability for performing the control by using the three-phase brushless motor.

Accordingly, when, for example, a control system of the electric motor includes two normal and backup systems, the circuits formed at the top surface-side and the back surface-side are sorted as the normal and backup circuits. When a failure of the normal circuit is detected, the backup circuit can be used for the control circuit which drives the backup circuit. In this case, the circuits can be also provided in a distributed arrangement to prevent the heat generation caused by driving the normal circuit from deteriorating the backup circuit.

Further, assume, for example, a case where the electric motor is composed of a dual system winding, and the respective systems perform parallel driving for processing half of currents to drive the motor. In this case, it is possible to form the circuits of the respective systems of the dual system at the top surface-side and the back surface-side of the substrate, and disperse a heat dissipation amount and a heat dissipation area.

Then, assume a case where the circuits are formed at the top surface-side and the back surface-side of the substrate. In this case, by taking driving timings of the heat-generating electronic part groups into account, it is also possible to take into account a distributed arrangement of spatial heat generation areas at the top surface-side and the back surface-side of the substrate and/or dispersion of a temporal heat generation.

That is, assume a case where, when the heat-generating electronic part groups are mounted or are mounted in the distributed arrangement, these heat-generating electronic part groups need to be disposed in relatively close areas. Even in this case, by taking into account activation timings of the heat-generating electronic part groups, the close heat-generating electronic part groups are disposed and driven by shifting the activation timings. Consequently, it is possible to prevent the heat from being simultaneously generated, disperse the temporal heat generation and thereby make a heat distribution of the substrate uniform and improve the heat dissipation.

Further, assume a case, too, where the heat-generating electronic part groups (UP', VP' and WP') are provided in the distributed arrangement on the back surface of the substrate 870 as described above. In this case, the heat-generating electronic part groups are provided in the distributed arrangement and, in addition, can be disposed such that the lengths of the current paths from the entries of a current to the heat-generating electronic part groups (UP', VP' and WP') to the exits of the current from the heat-generating electronic part groups (UP', VP' and WP') are substantially identical. Consequently, such an arrangement makes it possible to easily match the impedance characteristics of the current paths from the inverter circuit of the redundant system exemplified above to the three-phase brushless motor. Thus, it is possible to improve a ripple precision such as a torque and a rotational speed of the three-phase motor and improve the reliability.

Furthermore, assume a case, too, where the heat-generating electronic part groups (UP', VP' and WP') are provided in the distributed arrangement on the back surface of the substrate 870 as described above. In this case, output lines (lead lines) (UI', VI' and WI') from the heat-generating electronic part groups (UP', VP' and WP') can be extended in directions of lines connecting the centroid of the virtual equilateral triangle T and the respective vertices of the equilateral triangle T', or in parallel direction to rims (side surfaces) of the substrate. Consequently, in this case, it is possible to secure appropriate distances between the output lines (UI', VI' and WI') and output lines (UI, VI and WI) from the heat-generating electronic part groups output lines (UP, VP and WP) disposed at the top surface-side of the substrate 810. It is possible to prevent an interference between output lines of the respective phases and control the motor of the improved precision and stability.

As well, the example of the three-phase brushless motor composed of the U-phase, the V-phase and the W-phase has been described above as the example of the distributed arrangement at the back surface-side. The electronic part groups composing the inverter circuit of the respective phases of the three-phase motor likewise have been described as the heat-generating electronic part groups. However, the present invention is not limited to this configuration. The electronic part aggregation having a single functional unity and composed of plural electronic parts including the heat-generating electronic parts such as the FETs are provided in the distributed arrangement on the substrate of the electronic part mounting heat-dissipating substrate according to the present invention, it is possible to provide the same effect. Further, the form of the distributed-arrangement can be adopt various forms in accordance with the form (rectangular shape, polygonal shape and so on) of the electronic part mount heat-dissipating substrate and number of the heat-generating electronic part groups if the heat-generating electronic part groups be able to be mounted with the maximum distance space on the substrate by the distributed-arrangement.

Consequently, according to such a configuration according to the present invention, it is possible to dissipate the heat generated from the heat-generating electronic part groups disposed at the top surface-side of the electronic part mounting heat-dissipating substrate according to the present invention. It is possible to disperse the heat generated from the heat-generating electronic part groups disposed at the back surface-side of the electronic part mounting heat-dissipating substrate, too. Further, the heat generation areas are positioned differently between the top surface-side and the back surface-side of the plate surfaces of the substrate described above. Consequently, it is possible to three-dimensionally disperse the heat generation areas on the entire substrate including the top surface-side and the back surface-side of the substrate.

In this connection, the parts are disposed on the electronic part mounting heat-dissipating substrate according to the present invention as described above. Consequently, it is possible to prevent the concentration of heat on the substrate on which the electronic parts are mounted, and quickly transfer and dissipate the generated heat.

Figure 21A:
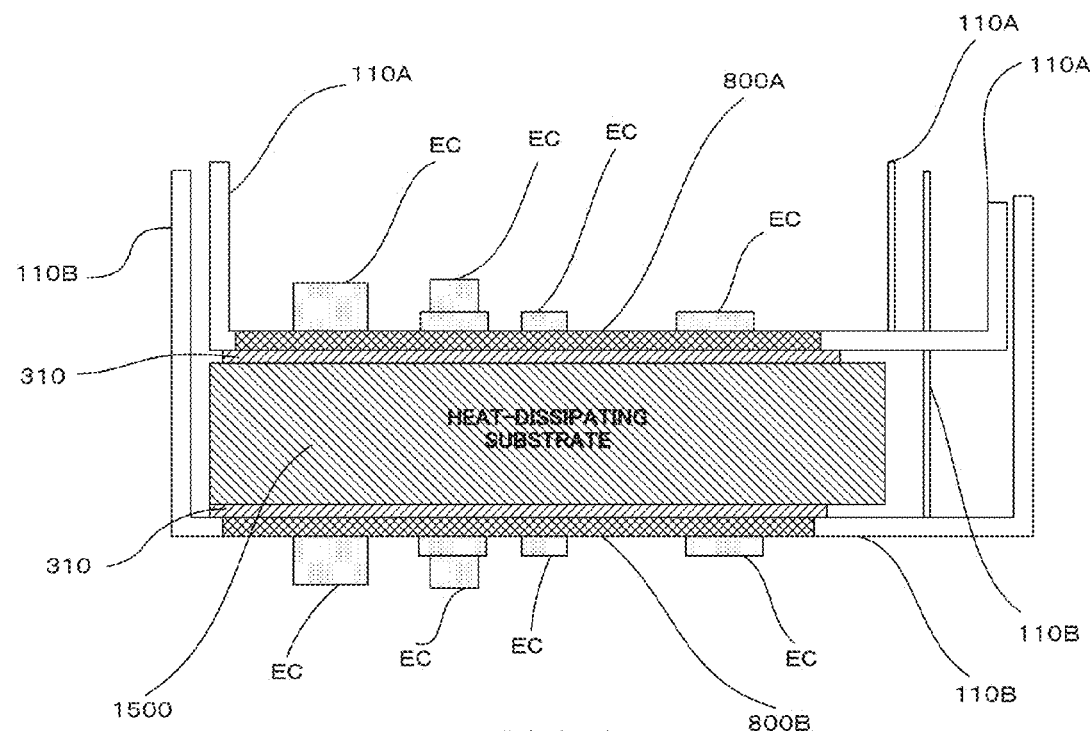
FIG. 21A is a side surface view and FIG. 21B is perspective view.
Figure 21B:
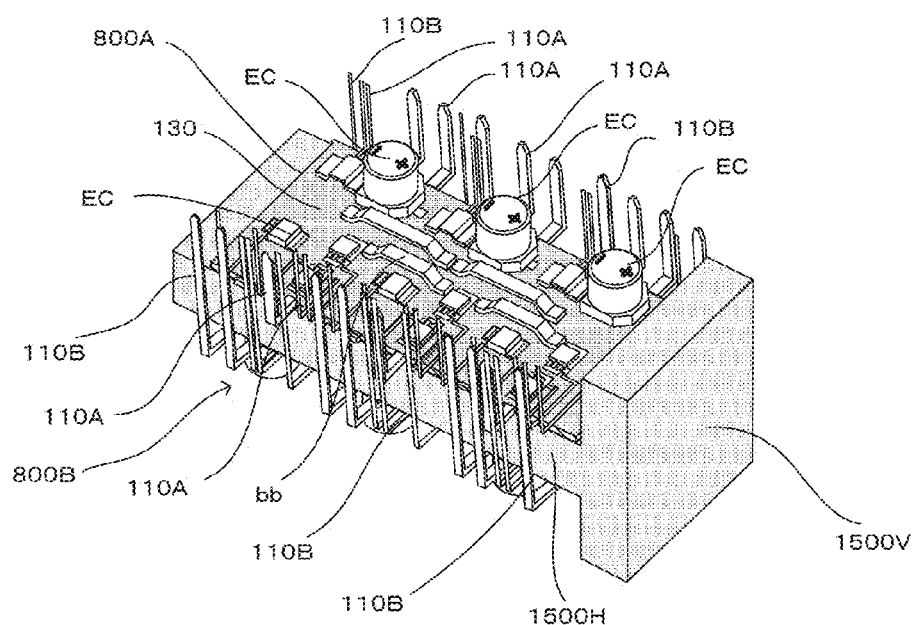

Next, as the heat-dissipating structure by using the electronic part mounting heat-dissipating substrate according to the present invention, it is possible to adopt a structure as shown in FIGS. 21A and 21B. FIGS. 21A and 21B show the heat-dissipating structure by mounting two electronic part mounting heat-dissipating substrates to the back surface of the part arrangement surface via the thermal conductor (the heat-dissipating plate) and by combining the two substrates with one body, and aims to improve the heat conductivity and the miniaturization. FIG. 21A is a side surface view and FIG. 21B is perspective view.

The heat-dissipating structure shown in FIGS. 21A and 21B performs the heat-dissipation from the electronic part mounting heat-dissipating substrates by mounting the back surfaces of the part arrangement surface for at least two or more the electronic part mounting heat-dissipating substrates via the thermal conductor.

Consequently, according to the above heat-dissipating structure, in a case that two electronic part mounting heat-dissipating substrates (for example, two of 800A and 800B), the TIM 310 or the like is arranged on the back-surface of the part arrangement surface of the above two substrates (800A and 800B) and the substrate 800 is mounted on the upper and lower surfaces of the thermal conductor (the heat-dissipating plate) 1500 via the above arrangement. In this case, when two or more plural substrates are arranged, plural substrates are may arranged on one surface of the thermal conductor 1500.

Then, in the case of the embodiment shown in FIGS. 21A and 21B, the lead frame 110A of the substrate 800A is bent to upward at outside of the circumference of the insulating member of the substrates and the lead frame 110B of the substrate 800B is also bent to upward similarly, and the structure is formed so that the lead frames 110A and 110B are connected to connectors and so on (not shown) provided over the two substrates. The thermal conductor 1500 is connected to the heat waster (heat think) or the like at portion without an interference with the lead frames 110.

Therefore, by adopting the above structure, it is possible to effectively perform the heat dissipation from the plate surface of the substrates (800A and 800B) via the thermal conductor 1500, and further it is also possible to miniaturizing the circuits.

That is, in a case that plural substrates are mounted on the control unit or the like for ECU under the redundant design, there is a problem to increase the size of ECU when these substrates are simply arranged in lateral direction.

However, by mounting the plural substrates on the both surfaces via the thermal conductor 1500 and by bending the lead frames 110 at outside of the circumference of the insulating member of the substrates as described above, it is possible to arrange by accumulating the substrates in a longitudinal direction. In comparison with the simple arrangement in the lateral direction, it is possible to realize the compact EUS as shown in FIG. 21. Further, in a case that the substrates are combined, although the heating value from the electronic parts mounted on the substrate becomes large, it is possible to heat-dissipate outward through the thermal conductor 1500. Furthermore, although the longitudinal size become large in a case that the substrates are accumulated and arranged in the longitudinal direction, it is possible to design corresponding to optionally selected the accumulated layer since the space being capable of mounting varies depending on the type of vehicle.

As well, the embodiment shown in FIG. 21B indicates a different embodiment shown in FIG. 21A with respect to the thermal conductor 1500.

The thermal conductor 1500 shown in FIG. 21B further comprises a horizontal portion 1500H inserted between the substrates 800A and 800B and a vertical portion 1500V vertically mounted at a side surface of the substrates (800A and 800B) being not divided the lead frames 110 such as an end of the horizontal portion 1500H.

Then, the horizontal portion 1500H of the thermal conductor 1500 is connected to the heat waster (heat think) or the like at portion without an interference with the lead frames 110, and it is possible to heat-dissipate by similarly fixing the he horizontal portion 1500H of the thermal conductor 1500 to a case of the control unit.

Next, it is possible to adopt a following connection structure of the shunt resistor by using the electronic part mounting heat-dissipating substrate according to the present invention.

In this regard, the shunt resistor generally refers to a resistor (shunt) which detects a current applied to a load. In case of, for example, the electric power steering apparatus, the shunt resistor is used to detect a motor current value (a motor current detection value) for controlling feedback of a motor current for a purpose of accurately generating a steering assist torque. This feedback control is performed by adjusting a motor applied voltage to decrease a difference between a steering assist command value (a current command value) and the electric motor current detection value.

Then, according to the conventional circuit used for the control unit 30 of the electric power steering apparatus, the shunt resistor is mounted on a transmission line connected to the motor to mount on the substrate. The shunt resistor is connected by a thin line such as a wire and by wire bonding or the like to a transmission line (a signal line) to a current detection circuit which detects a current via the shunt resistor.

Hence, the conventional substrate has a problem that it is additionally necessary to perform a bonding operation of electrically connecting the shunt resistor to the signal line to the current detection circuit. Further, the conventional circuit has a problem, too, that a thin line such as a bonding wire used for the connection causes a measurement error.

Figure 22A:
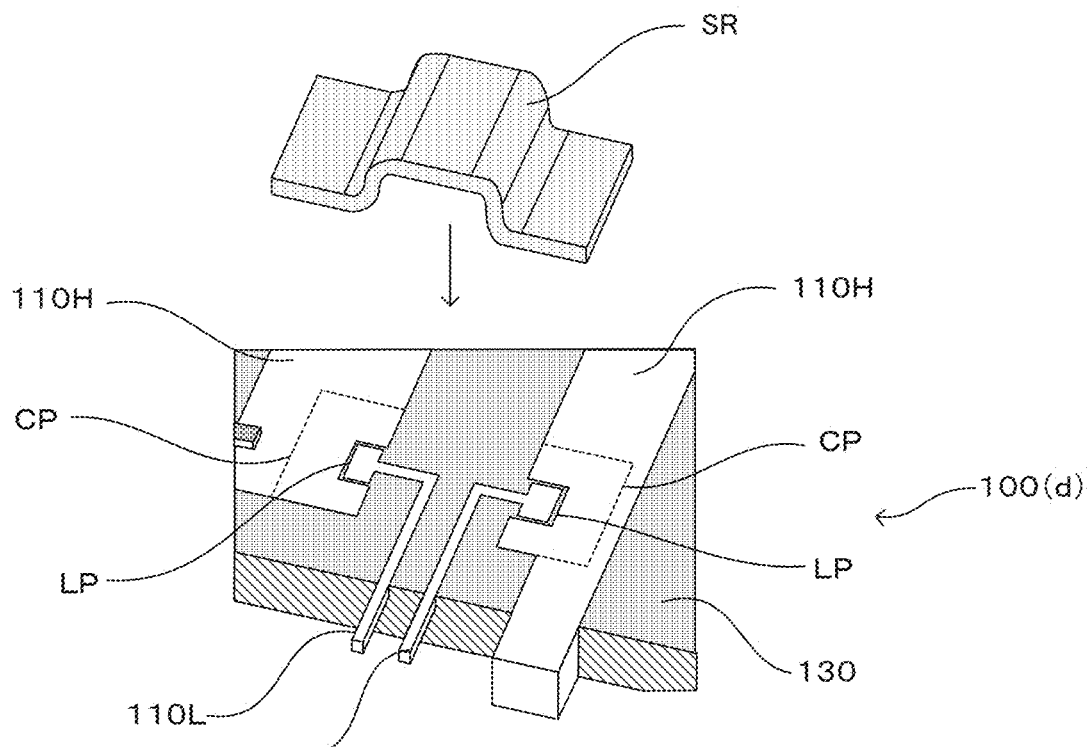
FIGS. 22A and 22B are perspective views illustrating a connection structure of a shunt resistor according to the present invention.
Figure 22B:
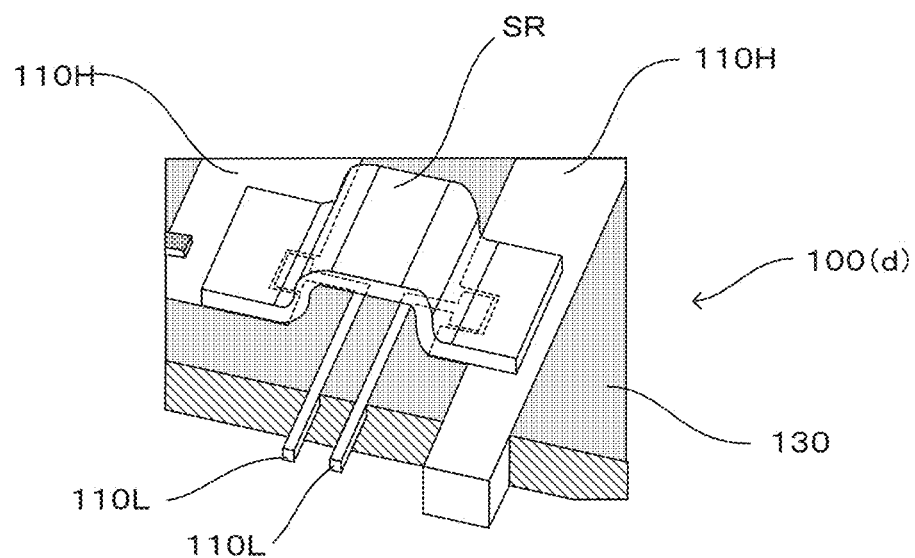

Therefore, by using the electronic part mounting heat-dissipating substrate according to the present invention, and by adopting the connection structure of the shunt resistor illustrated in configuration examples in FIGS. 22A, 22B and subsequent figures, it is possible to solve these problems. In this regard, FIGS. 22A and 19B are perspective views illustrating the connection structure of a shunt resistor SR according to the present invention. FIG. 22A is a perspective view illustrating a configuration where the shunt resistor SR is not yet connected to the electronic part mounting heat-dissipating substrate 100(*d*) according to the present invention. FIG. 22B is a perspective view illustrating a configuration where the shunt resistor SR has been connected to the substrate 100(*d*). Further, FIGS. 22A and 22B illustrate only part of the electronic part mounting heat-dissipating substrate 100(*d*).

According to the configuration example of the present invention, as illustrated in FIG. 22A, the above electronic part mounting heat-dissipating substrate 100(*d*) includes the lead frames 110 having the different thicknesses. Further, these lead frames 110 are composed of the thick lead frames 110H in which a relatively large current is assumed to be distributed, and the thin lead frames 110L in which a relatively small current is assumed to be distributed.

Then, two connection portions CP which are indicated by dotted lines in FIG. 22A and connect two terminals of the shunt resistor SR are provided on the thick lead frames 110H. In this regard, the connection portions CP are areas set as portions which connect the shunt resistor SR, and are appropriately positioned according to a circuit arrangement.

Further, cutout portions LP are provided at positions which are part of the connection portions CP set on the lead frames 110H and face each other, and one ends of the thin lead frames 110L are disposed at on the cutout portions LP. Furthermore, the thin lead frames 110L are connected as signal lines to the current detection circuit for which the shunt resistor SR is used.

Still further, assume a case where, as illustrated in FIG. 22B, the shunt resistor SR is disposed at the connection portions CP of the substrate 100(*d*) configured described above. In this case, the two terminals of the shunt resistor are set covering the cutout portions LP of the connection portions CP from above. Consequently, it is possible to mount the shunt resistor SR on the two types of the lead frames 110L and 110H of the substrate 100(*d*). Further, the upper surfaces of the thick lead frames 110H and the thin lead frames 110L at the part mounting surface side are on the identical plane. Consequently, it is possible to print solders on the connection portions CP and the cutout portions LP. It is possible to perform the connection by way of solder connection by performing reflow after the SMT (Surface Mount Technology).

Therefore, the connection structure of the shunt resistor for which the electronic part mounting heat-dissipating substrate according to the present invention configured as described above is used can directly extract a current detection signal from the shunt resistor SR. Consequently, it is necessary to perform only the reflow after the SMT without performing a wire bonding process, and it is possible to supply the electronic part mounting heat-dissipating substrate at the low cost. Further, a thin line such as a wire is not used to detect a current as described above, so that it is possible to further improve the current detection precision. Furthermore, according to the present invention, it is possible to form a strong structure by directly mounting parts on the substrate surface by soldering as described above. Therefore, the wire bonding or a method for performing wire bonding and filling a resin for fixation are unnecessary. Consequently, durability substantially improves compared to connection made by the wire bonding and the like. Consequently, it is possible to maintain a stable structure for a long period of time even in, for example, harsh environment in which irregular vibrations and temperature changes of a vehicle body and road surfaces transmitted from a vehicle equipped with the ECU of the electric power steering apparatus are great.

Figure 23A:
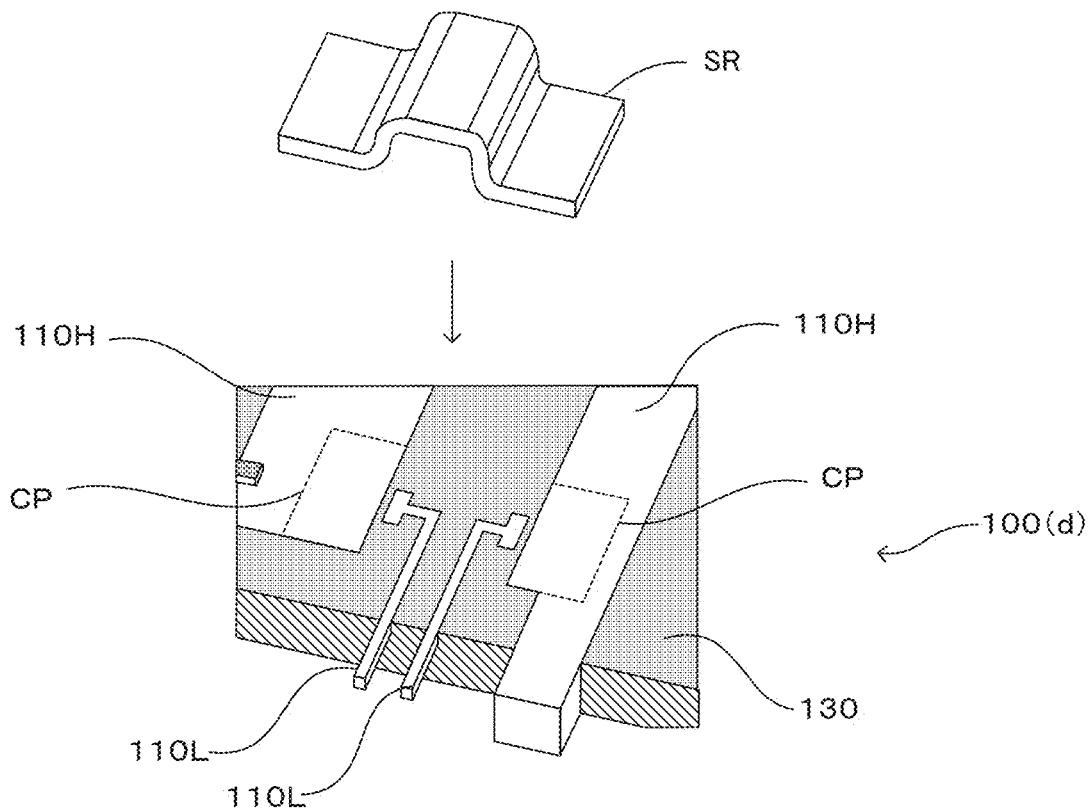
FIGS. 23A and 23B are perspective views illustrating another configuration example of a connection structure of a shunt resistor according to the present invention.
Figure 23B:
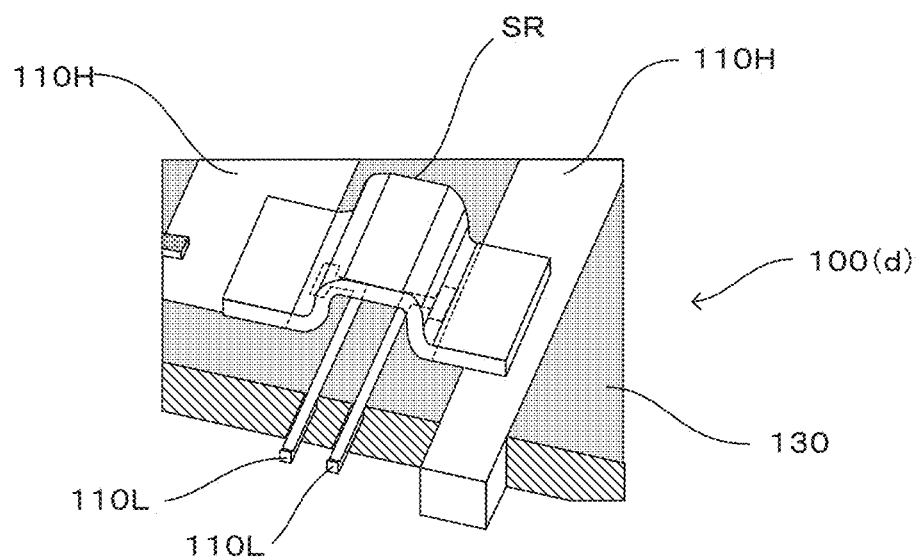

As well, the connection structure of the shunt resistor for which the electronic part mounting heat-dissipating substrate is used is an example of this configuration example. Other configuration examples can be also used without departing from the spirit of the present invention. Hence, the cutout portions LP may not be provided at the connection portions CP and, as illustrated in FIGS. 23A and 23B, one ends of the thin lead frames 110L may be disposed near the connection portions CP. In this regard, FIGS. 23A and 23B illustrate the other configuration examples similar to FIGS. 22A and 22B.

In this case, too, the two terminals of the shunt resistor SR are connected by setting the two terminals of the shunt resistor on the two connection portions set at the upper surface-side of the lead frames 110H. At this time, the one ends of the thin lead frames 110L are also desirably connected directly to lower portions of the two terminals of the shunt resistor SR. (It is possible to indirectly connect the shunt resistor SR to the current detection circuit by connecting the one ends of the thin lead frames 110L to the thick lead frames 110H. However, there is a concern that a wiring resistance increases and causes a measurement error).

Hence, the above "near" means an area which is configured to allow one ends of the lead frames 110L to be disposed below the two terminals of the shunt resistor when the two terminals of the shunt resistor are disposed at the connection portions and at connection portions of the lead frames 110H, and in which the shunt resistor and the lead frames 110L can be directly connected.

Consequently, as described above, according to the another configuration example of the connection structure of the shunt resistor for which the electronic part mounting heat-dissipating substrate according to the present invention is used, it is possible to reduce the cost and improve the current detection precision as described above.

Hence, the present invention employs the above configuration, so that the circuit for which a power semiconductor in which a large current flows is used can reduce a wiring resistance produced by a large power operation and improve the heat dissipation. By using the electronic part mounting heat-dissipating substrate according to the present invention for the electric power steering apparatus and so on, it is possible to effectively operate these devices.

As well, the substrate composed of the lead frames 110 and the insulating members 130 according to the present invention will be described with reference to FIGS. 25 to 28. For example, this substrate can be formed as follows for example.

Figure 25A:
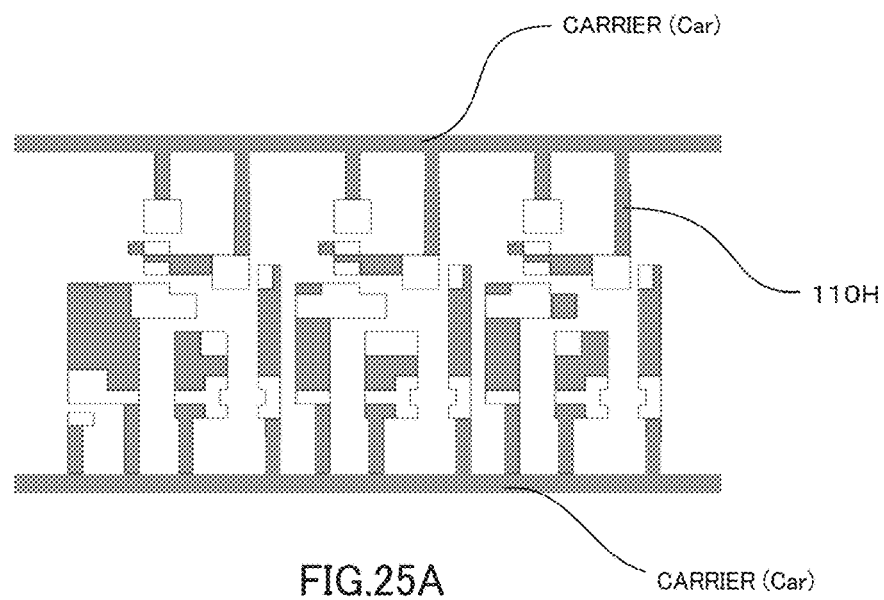
FIG. 25A is a top view illustrating that the thick lead frames are formed and carriers are left at both ends of the frames.

In this regard, FIGS. 25A to 28 are views for explaining a making example of the substrate in case where the lead frames 110 of the substrate have the different thicknesses. FIG. 25A is a top view illustrating that the thick lead frames 110H are formed and carriers (Car) are left at both ends of the frames. FIG. 25B is a top view illustrating that the thin lead frames 110L are formed and the carriers (Car) are left at both ends of the frames likewise. FIG. 25C is a top view illustrating that the lead frames of the two types illustrated in FIGS. 25B and 25C are combined with the carriers interposed therebetween. Further, FIG. 26A is a side sectional view illustrating an example where the lead frames of the two types combined as illustrated in FIG. 25C are assembled in a mold, and are mutually combined with the insulating members 130 such as resin members. FIG. 26B is a side sectional view illustrating where the lead frames are molded by the mold. FIG. 26C is a top view illustrating that the carriers are detached after the combination. In this regard, FIG. 26C does not illustrate the insulating members 130.

Figure 24A:
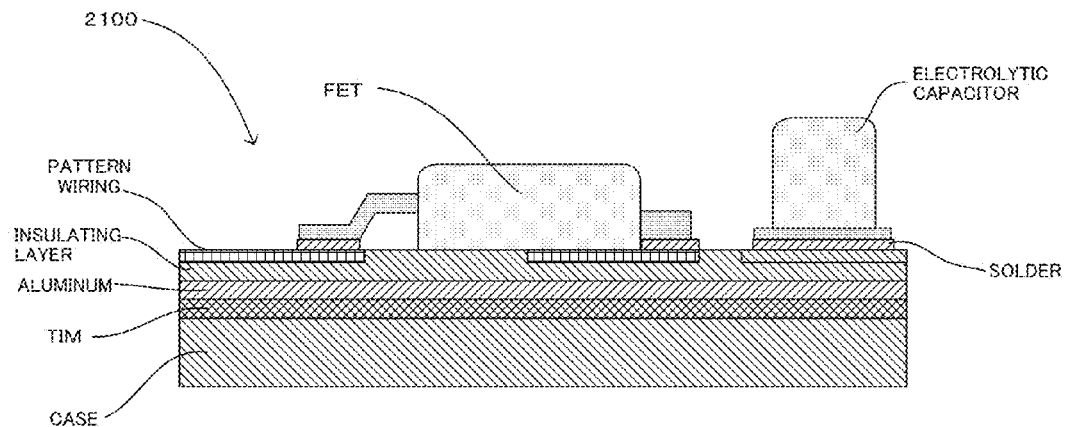
FIG. 24A is a sectional view illustrating an example of a conventional aluminum substrate.
Figure 24B:
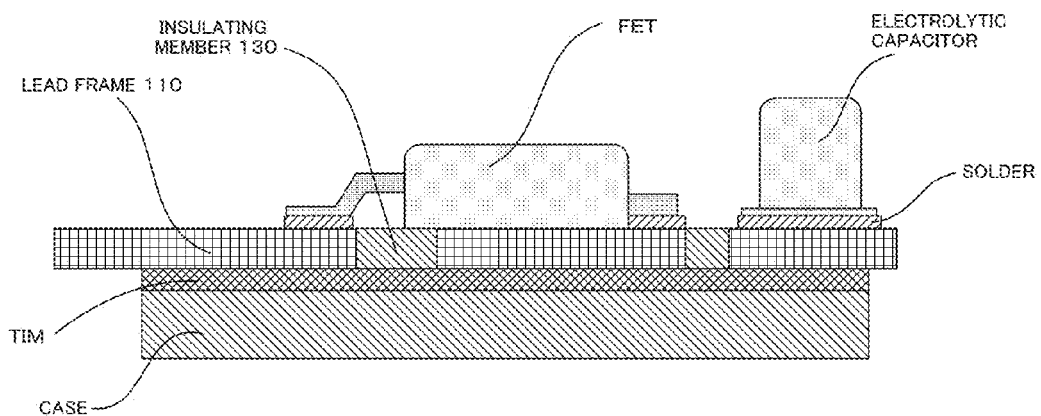
FIG. 24B is a sectional view illustrating an example of the substrate according to the present invention.
Figure 27:
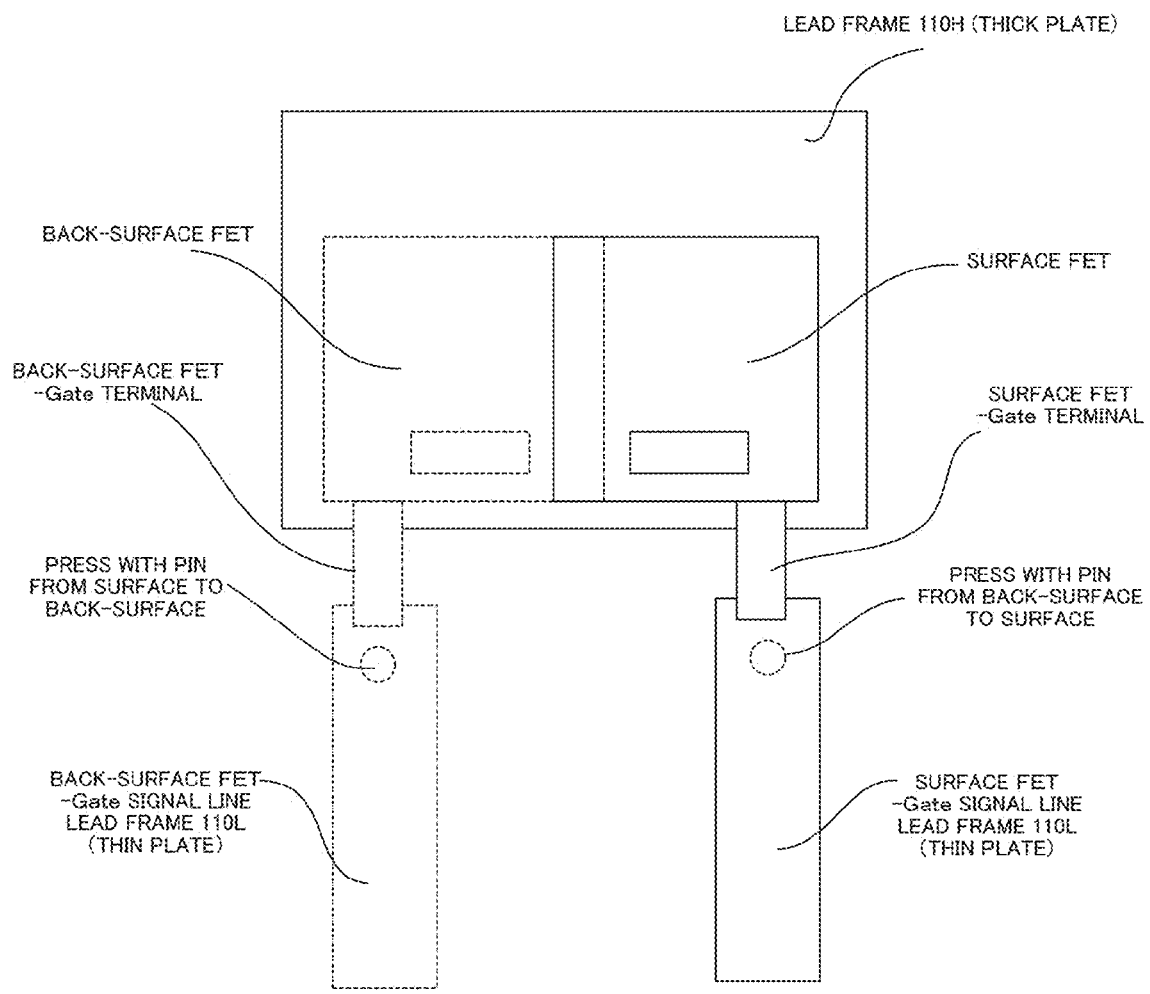
FIG. 27 is a top view illustrating that FETs are mounted on both surfaces of the thick lead frames seen from the upper surface side (top surface side) and is a top view illustrating examples where the thin lead frames are formed on upper and lower surfaces (top and back surfaces) of the substrate.
Figure 28:
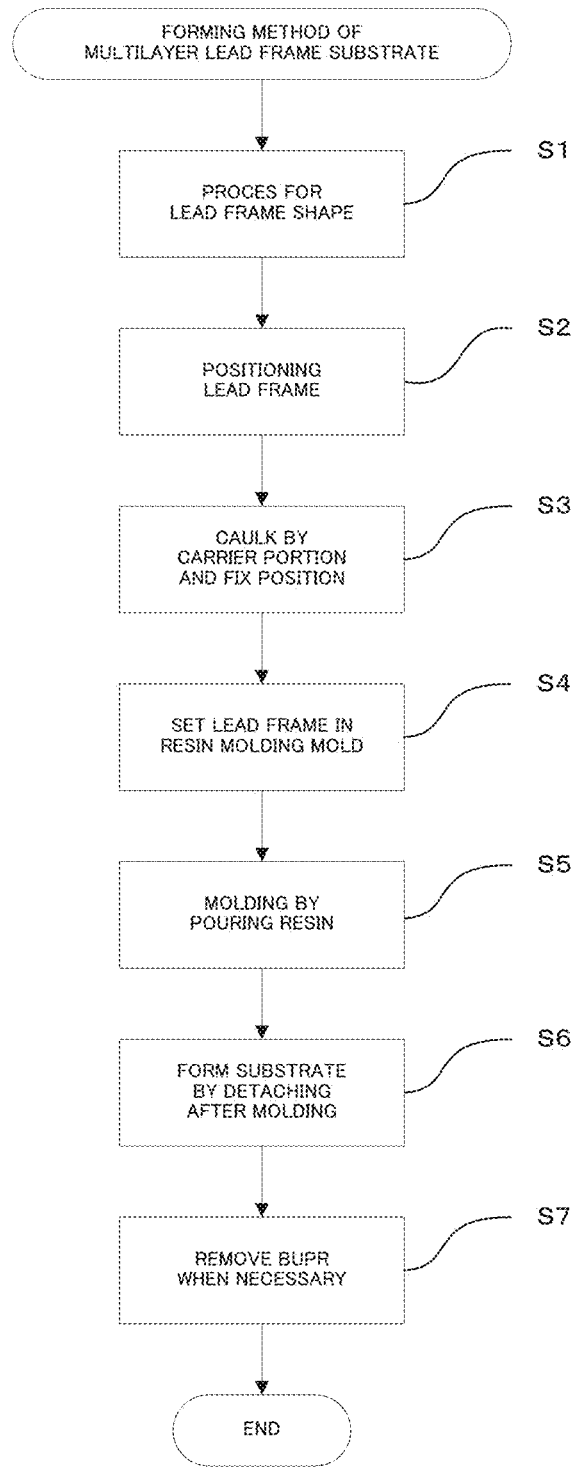
FIG. 28 is a flowchart of forming a substrate (multilayer lead frame substrate) according to the present invention by combining the thin lead frames and the thick lead frames.

Further, FIG. 27 illustrates means which fills the insulating members 130 to dispose the thick lead frames 110H and the thin lead frames 110L on the both surfaces of the substrate. FIG. 24 is a view illustrating a transparent state of a lower surface-side of the top view in case where the thick lead frames 110H and the thin lead frames 110L are disposed on the both surfaces of one substrate, and the electronic parts such as the FETs are mounted on the lead frames 110H and 110L. In this regard, FIG. 27 illustrates the lead frames and the FETs at the back surface-side of the one substrate as dotted lines, and illustrates only gate terminals as terminals from the FETs mounted on the both surfaces of the one substrate. Further, simultaneously, the FETs are mounted on the thick lead frames 110H, and the gate terminals of the FETs are connected to the thin lead frames 110L on the substrate. Furthermore, FIG. 28 is a flowchart of forming a substrate (multilayer lead frame substrate) by combining the thick lead frames and the thin lead frames.

Figure 25B:
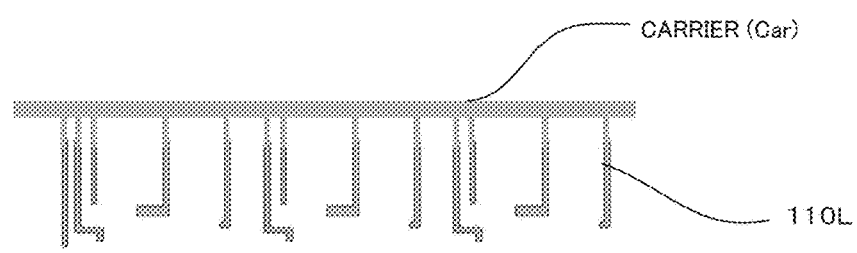
FIG. 25B is a top view illustrating that the thin lead frames are formed and carriers are left at both ends of the frames likewise.

According to the present invention, when the substrate is formed by combining the thick lead frames 110H and the thin lead frames 110L as described above, as illustrated in the flowchart in FIG. 28, shapes of the lead frames are processed first by the conductor plate (Step S1). Then, in this case, as illustrated in FIGS. 25A and 25B, the thick lead frames 110H and the thin lead frames 110L are individually made, and the carriers Car are formed at both side ends of the respective lead frames for subsequent processing. The carriers Car are belt-shaped portions formed at the both side ends of the lead frames as illustrated in FIGS. 25A and 25B, and are formed to maintain forms of the lead frames 110 which are not yet coupled to the insulating members 130 and position the lead frames as described below.

Figure 25C:
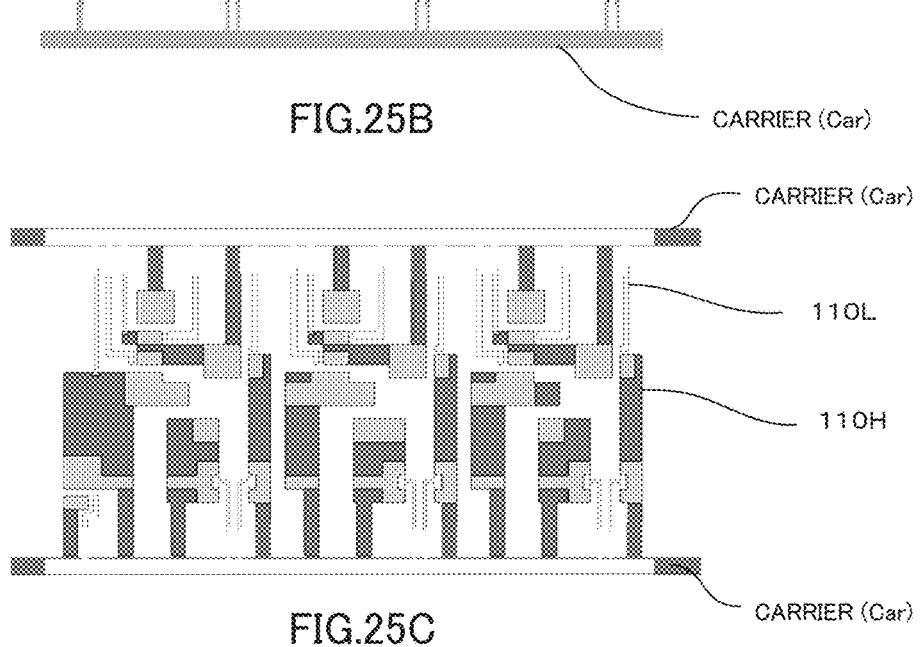
FIG. 25C is a top view illustrating that the lead frames of the two types illustrated in FIGS. 25B and 25C are combined with the carriers interposed therebetween.

Then, after the respective lead frames are formed, the lead frames having the different thicknesses are positioned as shown in FIGS. 25A and 25B (Step S2). Positioning the lead frames is overlaying the lead frames having the different thicknesses and fixing the positions of the lead frames as illustrated in FIG. 25C. For example, the carriers Car of the two lead frames illustrated in FIGS. 25A and 25B are processed in advance for positioning, and the carrier Car portions are caulked by using this processed portions and fixed to prevent the displacement (Step S3).

Figure 26A:
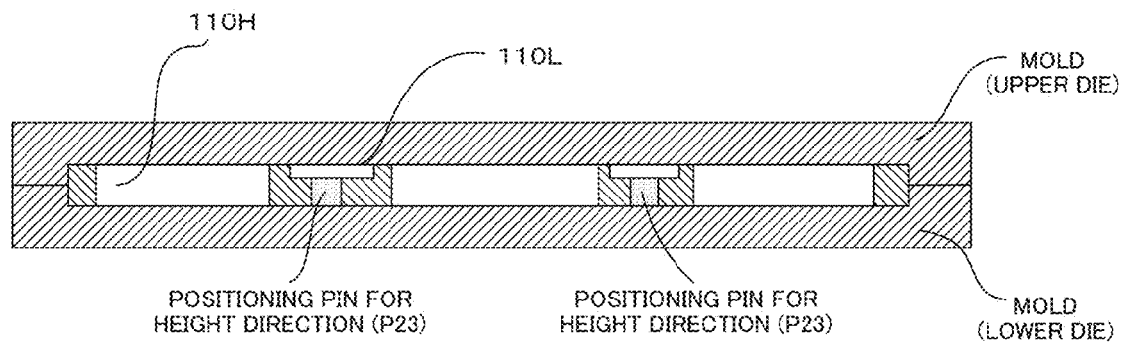
FIG. 26A is a side sectional view illustrating an example where the lead frames of the two types combined as illustrated in FIG. 25C are assembled in a mold, and are mutually combined with insulating members such as resin members.

Next, the lead frames whose positions have been fixed are set in a resin molding mold as illustrated in FIG. 26A (Step S4). The resin molding mold is composed of an upper side die and a lower-side die (an upper die and a lower die), and maintains the shapes of the lead frames to fill a resin composing the insulating members 130. Hence, upward pins (height direction positioning pins (P23)) are configured to be disposed at a lower side of the thin lead frames 110L of the lead frames to hold down the thin lead frames 110L from the lower side to the upper side.

Figure 26B:
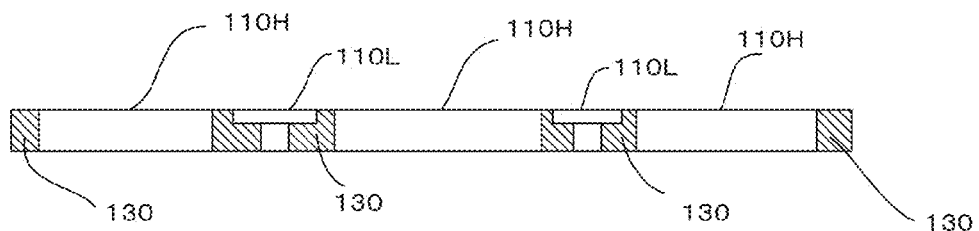
FIG. 26B is a side sectional view illustrating where the lead frames are molded by the mold.
Figure 26C:
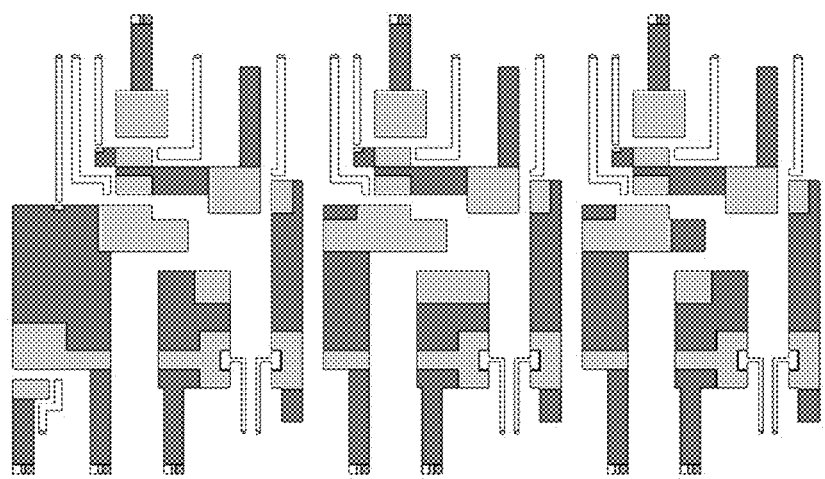
FIG. 26C is a top view illustrating that the carriers are detached after the combination.

Next, the resin composing the insulating members 130 is injected in the mold in which the lead frames have been set to mold (Step S5). After the molding, the mold is detached (Step S6). Consequently, it is possible to obtain the finished substrate according to the present invention as illustrated in FIGS. 26B and 26C. In this regard, the insulating members 130 are not formed at the portions at which the pins P23 are disposed. However, according to use of the substrate according to the present invention or a combination with other components, the insulating members 130 may be additionally filled at this portion or may not be selected. Further, when burrs are made on the substrate surface (the part mounting surface), it is also possible to remove the burrs when necessary and obtain the finished substrate, too (Step S7).

Furthermore, according to the present invention, it is possible to form the substrate according to the present invention as described above. Still further, when the thin lead frames are formed on the both surfaces of the substrate according to the present invention as illustrated in FIGS. 3C and 5C, the lead frames can be formed as follows, for example.

That is, when the thin lead frames 110L are set in the mold as in the Step S6, as illustrated in FIG. 27, the plate surfaces which are the part mounting surfaces of the FETs or the like on the upper-side substrate and the lower-side substrate are disposed without completely overlapping vertical positions passing the plate surfaces of the substrate. In other words, the lead frames 110L are more or less shifted without completely overlapping when the back surface is seen in a transparent state from the upper surface.

Further, according to this structure, this shifted portions, i.e., the portions which are shifted and therefore do not completely overlap when the back surface is seen in a transparent state from the top surface of the electronic part mounting heat-dissipating substrate are used. Thereby, as illustrated in FIG. 27, downward pins P23' provided at the upper mold retain the lead frames 110L at the lower side (back surface side). Similarly, as illustrated in FIG. 27B2, the shifted portions are used. Thereby, the upward pins P23 provided to the lower mold retain the lead frames 110L at the upper side (top surface side). Consequently, it is possible to fill the insulating members 130 made of the resin or the like.

Consequently, according to such a forming method, it is possible to retain the thin lead frames 110L at the top surface side and the back surface side of the substrate by using the downward pins P23' and the upward pins P23. Consequently, by filling the insulating members 130, it is possible to realize a configuration where the thin lead frames 110L are disposed on the both surfaces of the substrate according to the present invention.

EXPLANATION OF REFERENCE NUMERALS 1 handle
2 column shaft (steering shaft, handle shaft)
3 reduction mechanism
4a, 4b universal joint
5 pinion and rack mechanism
6a, 6b tie rod
7a, 7b hub unit
8L, 8R steered wheel
10 torque sensor
11 ignition key
12 vehicle speed sensor
13 battery
14 steering angle sensor
20 electric motor
30 control unit (ECU)
100(s), 200(s), 300
  lead frame having the same thickness electronic part mounting heat-dissipating substrate
100(d), 200(d), 350
  lead frame having different thickness electronic part mounting heat-dissipating substrate
100(s,d), 200(s,d)
  electronic part mounting heat-dissipating substrate (including the lead frames having the same thickness and different thickness)

110 lead frame
110C annular-shape lead frame
110H lead frame (for large current line)
110M lead frame (for middle current line)
110L lead frame (for small current line (for signal line))
t thickness of lead frame
113 recess portion
113(u) recess portion (surface side)
113(d) recess portion (back surface side)
115 engagement portion
130 insulating member
150 hem portion
400 electronic part mounting heat-dissipating substrate (forming example of recess portion)
800, 810 electronic part mounting heat-dissipating substrate (capable of bending of lead frame)
830, 850, 870 electronic part mounting heat-dissipating substrate (distributed arrangement)
900 electronic part mounting heat-dissipating substrate (including insertion sheet)
910 inverter circuit
911 electrolytic capacitor
913 SR shunt resistor
930 motor relay section
935 U-phase FET of motor relay section
937 V-phase FET of motor relay section
939 W-phase FET of motor relay section
950 electric motor
1000 control unit
1100 TIM-layer provided at control unit
1300 aluminum die cast forming case of control unit
1800, 1900 insertion sheet
1900E circumference portion of insertion sheet
5000 conventional substrate
8000 thermal conductive material
EC electronic part
bb bus bar
CP connection port
LP cutout
T, T' virtual equilateral triangle shape
bb bus bar
EC electronic part
UP, UO' U-phase area part group
VP, VP' V-phase area part group
WP, WP' W-phase area part group
Ui power supply-side U-phase line
Uo ground-side U-phase line
Wi power supply-side W-phase line
Wo ground-side W-phase line
UI, UI' lead line direction pf U-phase
VI, VI' lead line direction pf V-phase
WI, WI' lead line direction pf W-phase

The invention claimed is:

1. An electronic part mounting heat-dissipating substrate which comprises:
a conductor plate which is formed on lead frames of wiring pattern shapes to mount an electronic part; and an insulating member which is provided between said lead frames of said wiring pattern shapes on said conductor plate; in which a plate surface of a part arrangement surface of said conductor plate and a plate surface of a part arrangement surface-side of said insulating member are formed in an identical vertical plane, and a plate surface of a back surface of said part arrangement surface of said conductor plate and a plate surface of a back surface of said part arrangement surface-side of said insulating member are formed in an identical vertical plane,
wherein said lead frames of said wiring pattern shapes have different thicknesses of at least two types or more, a thickness of the lead frames being measured in a direction parallel to the mounting direction of the electronic part, and a thick lead frame is used for a large current signal and a thin lead frame is used for a small current signal,
wherein said plate surface of said back surface of said part arrangement surface of said lead frames of said wiring pattern shapes and said plate surface of said back surface of said part arrangement surface-side of said insulating member are formed in an identical vertical plane to meet said plate surface of said back surface of said part arrangement surface of a thickest lead frame among said lead frames,
wherein said lead frames having different thicknesses are configured so that different wiring patterns are formed for said respective different thicknesses so as not to mutually cross and overlap and said lead frames having different thicknesses form an electronic circuit by mounting said electronic part, wherein wiring widths of thin lead frames are smaller than wiring widths of thick lead frames, and said thin lead frames are arranged between said thick lead frames when said electronic part arrangement surface is seen from an upper side, and
wherein both side surfaces of said lead frames are formed with a plane vertical to said plate surface from a top surface of said electronic part arrangement surface to a back surface thereof,
wherein three heat-generating electronic part groups having a functional unity is provided in a distributed arrangement with a maximum distance each other on said electronic part mounting heat-dissipating substrate, so that lengths of current paths from entries of said heat-generating electronic part groups to exits of said heat-generating electronic part groups are substantially identical, and
wherein said three heat-generating electronic part groups is arranged at periphery of vertices of an equilateral triangle that a center portion of said electronic part mounting heat dissipating substrate is almost center.

2. The electronic part mounting heat-dissipating substrate according to claim 1, wherein said three heat-generating electronic part groups having a functional unity are power devices which control respective phases of an electric motor and lengths of current paths from said power devices to a connection portion of said electric motor are substantially identical between said respective phases.

3. The electronic part mounting heat-dissipating substrate according to claim 2, wherein lead-line directions of said three heat-generating electronic part groups having a functional unity provided at periphery of vertices of said equilateral triangle or output directions from said power devices are faced to extending directions of respective vertices of said equilateral triangle from centroid of said equilateral triangle.

4. The electronic part mounting heat-dissipating substrate according to claim 1, wherein said lead frames of said different thicknesses are provided in a mixed arrangement.

5. The electronic part mounting heat-dissipating substrate according to claim 2, wherein said lead frames of said different thicknesses are provided in a mixed arrangement.

6. The electronic part mounting heat-dissipating substrate according to claim 3, wherein said lead frames of said different thicknesses are provided in a mixed arrangement.

7. The electronic part mounting heat-dissipating substrate according to claim 1,
wherein a portion of said plate surface of said part arrangement surface at which said part is not disposed on said plate surface of said part arrangement surface of said lead frames is provided with a top surface side recess portion, and is covered by said insulating member, and
wherein said top surface of said insulating member which covers said top surface-side recess portion, and said plate surface of said part arrangement surface of said lead frames and said top surface at said part arrangement surface-side of said insulating member, are formed in an identical plane.

8. The electronic part mounting heat-dissipating substrate according to claim 2,
wherein a portion of said plate surface of said part arrangement surface at which said part is not disposed on said plate surface of said part arrangement surface of said lead frames is provided with a top surface side recess portion, and is covered by said insulating member, and
wherein said top surface of said insulating member which covers said top surface-side recess portion, and said plate surface of said part arrangement surface of said lead frames and said top surface at said part arrangement surface-side of said insulating member, are formed in an identical plane.

9. The electronic part mounting heat-dissipating substrate according to claim 1, wherein
a portion which is said plate surface of said back surface of said electronic part arrangement surface of said lead frame and corresponds to a back surface of said electronic part arrangement surface at which said part is not disposed, is provided with a back surface-side recess portion and is covered by said insulating member, and
said top surface of said insulating member which covers said back surface-side recess portion, and said plate surface of said back surface of said electronic part arrangement surface of said lead frames and said top surface of said insulating member at said the back surface-side at said electronic part arrangement surface-side form one continuous surface.

10. The electronic part mounting heat-dissipating substrate according to claim 2, wherein
a portion which is said plate surface of said back surface of said electronic part arrangement surface of said lead frame and corresponds to a back surface of said electronic part arrangement surface at which said part is not disposed, is provided with a back surface-side recess portion and is covered by said insulating member, and
said top surface of said insulating member which covers said back surface-side recess portion, and said plate surface of said back surface of said electronic part arrangement surface of said lead frames and said top surface of said insulating member at said the back surface-side at said electronic part arrangement surface-side form one continuous surface.

11. The electronic part mounting heat-dissipating substrate according to claim 1, wherein
engagement portions are provided from a side of a surface-side of said lead frames to a side of said insulating member and between said lead frames of said wiring pattern shapes and said insulating member, and said engagement portions are steps formed at sides of a top surface and a back surface of a surface-side of said lead frames and between said lead frames and said insulating member.

12. The electronic part mounting heat-dissipating substrate according to claim 1, wherein part of said lead frames of said wiring pattern shapes formed by said conductor plate have a shape which is bent upward or downward with respect to a plate surface of said conductor plate and at a side closer to an inner side or an outer side than a periphery of said insulating member is.

13. The electronic part mounting heat-dissipating substrate according to claim 1, Wherein all or part of said lead frames of said wiring pattern shapes formed by said conductor plate is capable of bending at an outer side than a periphery of said insulating member.

14. The electronic part mounting heat-dissipating substrate according to claim 1, Wherein all or part of said lead frames of said wiring pattern shapes formed by said conductor plate is contact with a thermal conductor at an outer side than a periphery of said insulating member.

15. The electronic part mounting heat-dissipating substrate according to claim 1, wherein
two of said electronic part mounting heat-dissipating substrates are composed as one electronic part mounting heat-dissipating substrate with an insertion sheet interposed therebetween, an upper surface of a first electronic part mounting heat-dissipating substrate composing one electronic part mounting heat-dissipating substrate and sandwiching said insertion sheet is used as a side of a top surface of said one electronic part mounting heat-dissipating substrate, and a lower surface of a second electronic part mounting heat-dissipating substrate composing one electronic part mounting heat-dissipating substrate and sandwiching said insertion sheet is used as a side of a back surface of said one electronic part mounting heat-dissipating substrate.

16. The electronic part mounting heat-dissipating substrate according to claim 15, wherein, when said power device controlling said electric motor or plural heat-generating electronic part groups having a functional unity is distributed-arranged at periphery of said vertices of said equilateral triangle of which centroid is almost a center portion of top surface-side of said electronic part mounting heat-dissipating substrate, said back surface-side of said electronic part mounting heat-dissipating substrate is similarly performed, and a position corresponding to vertices of said equilateral triangle is a different position rotated by about 60° as a reference of said centroid of said equilateral triangle on said top surface and said back surface when a distributed arrangement of said back surface-side is performed.

17. A heat-dissipating structure by using said electronic part mounting heat-dissipating substrate according to claim 1, wherein heat dissipation from said electronic part mounting heat-dissipating substrate is performed by mounting said back surface of said part arrangement surface of at least two of said electronic part mounting heat-dissipating substrate through a thermal conductor.

18. A power module of an electric power steering apparatus for which said electronic part mounting heat-dissipating substrate according to claim 1 is used.

19. A connection structure of a shunt resistor used for said electronic part mounting heat-dissipating substrate according to claim 1, wherein said electronic part mounting heat-dissipating substrate includes two connection portions which connect two terminals of said shunt resistor on said thick lead frames, one ends of said thin lead frame are disposed near said two connection portions, or one ends of said thin lead frames are disposed at cutout portions formed at part of said two connection portions, and said two terminals of said shunt resistor are connected by placing said two terminals of said shunt resistor on said two connection portions.

20. An electric power steering apparatus for which said electronic part mounting heat-dissipating substrate according to claim 1 is used.

21. The electric power steering apparatus which said heat-dissipating structure according to claim 17 is used.

22. The electric power steering apparatus comprising said connection structure of shunt resistor according to claim 19.

* * * * *